(12) United States Patent
Mohammed et al.

(10) Patent No.: US 9,105,612 B2
(45) Date of Patent: Aug. 11, 2015

(54) MICROELECTRONIC PACKAGES HAVING CAVITIES FOR RECEIVING MICROELECTRONIC ELEMENTS

(71) Applicant: Tessera, Inc., San Jose, CA (US)

(72) Inventors: Ilyas Mohammed, Santa Clara, CA (US); Belgacem Haba, Saratoga, CA (US); Wael Zohni, San Jose, CA (US); Philip R. Osborn, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 14/034,265

(22) Filed: Sep. 23, 2013

(65) Prior Publication Data

US 2014/0021641 A1    Jan. 23, 2014

Related U.S. Application Data

(62) Division of application No. 13/205,162, filed on Aug. 8, 2011, now Pat. No. 8,541,873, which is a division of application No. 12/148,144, filed on Apr. 16, 2008, now Pat. No. 7,994,622.

(60) Provisional application No. 60/923,953, filed on Apr. 16, 2007.

(51) Int. Cl.
| | |
|---|---|
| H01L 23/522 | (2006.01) |
| H01L 23/498 | (2006.01) |
| H01L 23/00 | (2006.01) |
| H01L 23/538 | (2006.01) |
| H01L 25/065 | (2006.01) |
| H01L 25/10 | (2006.01) |

(52) U.S. Cl.
CPC .......... *H01L 24/46* (2013.01); *H01L 23/49811* (2013.01); *H01L 23/5386* (2013.01); *H01L 24/16* (2013.01); *H01L 24/48* (2013.01); *H01L 24/49* (2013.01); *H01L 24/85* (2013.01); *H01L 25/0657* (2013.01); *H01L 25/105* (2013.01); *H01L 2224/13099* (2013.01); *H01L 2224/16* (2013.01); *H01L 2224/16225* (2013.01); *H01L 2224/32014* (2013.01); *H01L 2224/32225* (2013.01); *H01L 2224/484* (2013.01); *H01L 2224/4824* (2013.01); *H01L 2224/48091* (2013.01); *H01L 2224/48227* (2013.01); *H01L 2224/49175* (2013.01); *H01L 2224/73215* (2013.01); *H01L 2224/73265* (2013.01); *H01L 2224/85* (2013.01); *H01L 2225/0651* (2013.01); *H01L 2225/06517* (2013.01); *H01L 2225/06562* (2013.01); *H01L 2225/1023* (2013.01); *H01L 2225/1058* (2013.01); *H01L 2924/014* (2013.01); *H01L 2924/01005* (2013.01); *H01L 2924/01028* (2013.01); *H01L 2924/01029* (2013.01);

(Continued)

(58) Field of Classification Search
CPC ..... H01L 23/498; H01L 24/116; H01L 24/48; H01L 24/49; H01L 25/105; H01L 23/5386; H01L 24/46; H01L 24/85; H01L 2224/85; H01L 2224/13099; H01L 2224/16
USPC ......... 257/685, 686, 723, 784, 786, 773, 774, 257/680, E21.499, 697
See application file for complete search history.

(56) References Cited

U.S. PATENT DOCUMENTS

| | | | | |
|---|---|---|---|---|
| 5,811,879 | A * | 9/1998 | Akram | ........................ 257/723 |
| 7,180,071 | B2 * | 2/2007 | Laackmann | ............. 250/370.01 |

(Continued)

*Primary Examiner* — Alexander Oscar Williams
(74) *Attorney, Agent, or Firm* — Lerner, David, Littenberg, Krumholz & Mentlik, LLP

(57) ABSTRACT

Packaged microelectronic elements are provided which include a dielectric element, a cavity, a plurality of chip contacts and a plurality of package contacts, and microelectronic elements having a plurality of bond pads connected to the chip contacts.

19 Claims, 56 Drawing Sheets

(52) U.S. Cl.
CPC ............... *H01L2924/01033* (2013.01); *H01L 2924/01074* (2013.01); *H01L 2924/01078* (2013.01); *H01L 2924/01082* (2013.01); *H01L 2924/1517* (2013.01); *H01L 2924/15153* (2013.01); *H01L 2924/15156* (2013.01); *H01L 2924/15311* (2013.01); *H01L 2924/15331* (2013.01); *H01L 2924/18165* (2013.01)

(56) References Cited

U.S. PATENT DOCUMENTS

| | | | |
|---|---|---|---|
| 7,196,408 B2 | 3/2007 | Yang et al. | |
| 7,547,965 B2 | 6/2009 | Hsu | |
| 8,227,910 B2 * | 7/2012 | Pagaila et al. | 257/698 |
| 8,835,228 B2 * | 9/2014 | Mohammed | 438/127 |
| 2004/0007771 A1 * | 1/2004 | Shin et al. | 257/686 |
| 2006/0006534 A1 | 1/2006 | Yean et al. | |
| 2007/0152310 A1 | 7/2007 | Osborn et al. | |
| 2007/0257350 A1 * | 11/2007 | Lee et al. | 257/686 |
| 2008/0157358 A1 | 7/2008 | Yang | |
| 2008/0217761 A1 | 9/2008 | Yang et al. | |
| 2008/0230892 A1 | 9/2008 | Chang et al. | |
| 2008/0248614 A1 | 10/2008 | Yang et al. | |
| 2008/0274593 A1 * | 11/2008 | Yang et al. | 438/113 |
| 2009/0057873 A1 | 3/2009 | Hsu | |
| 2009/0283889 A1 * | 11/2009 | Jang et al. | 257/686 |
| 2010/0219523 A1 * | 9/2010 | Chow et al. | 257/686 |

* cited by examiner

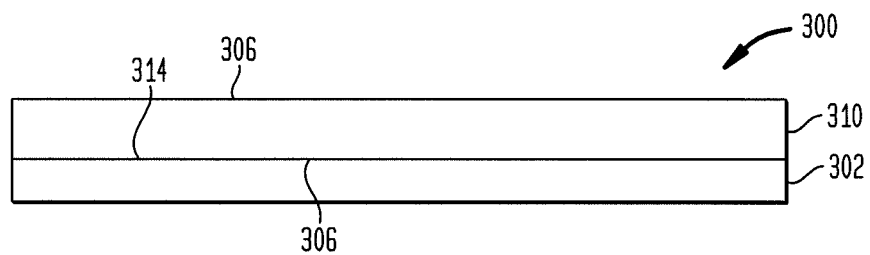
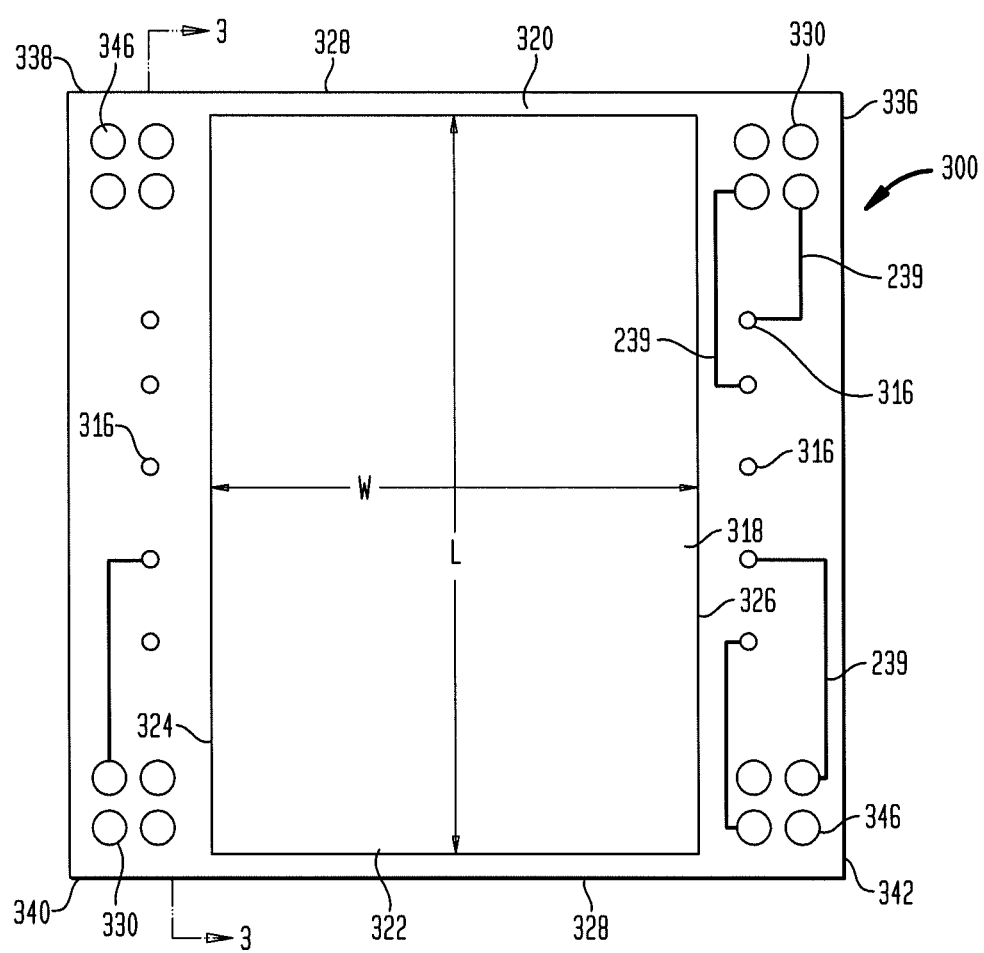

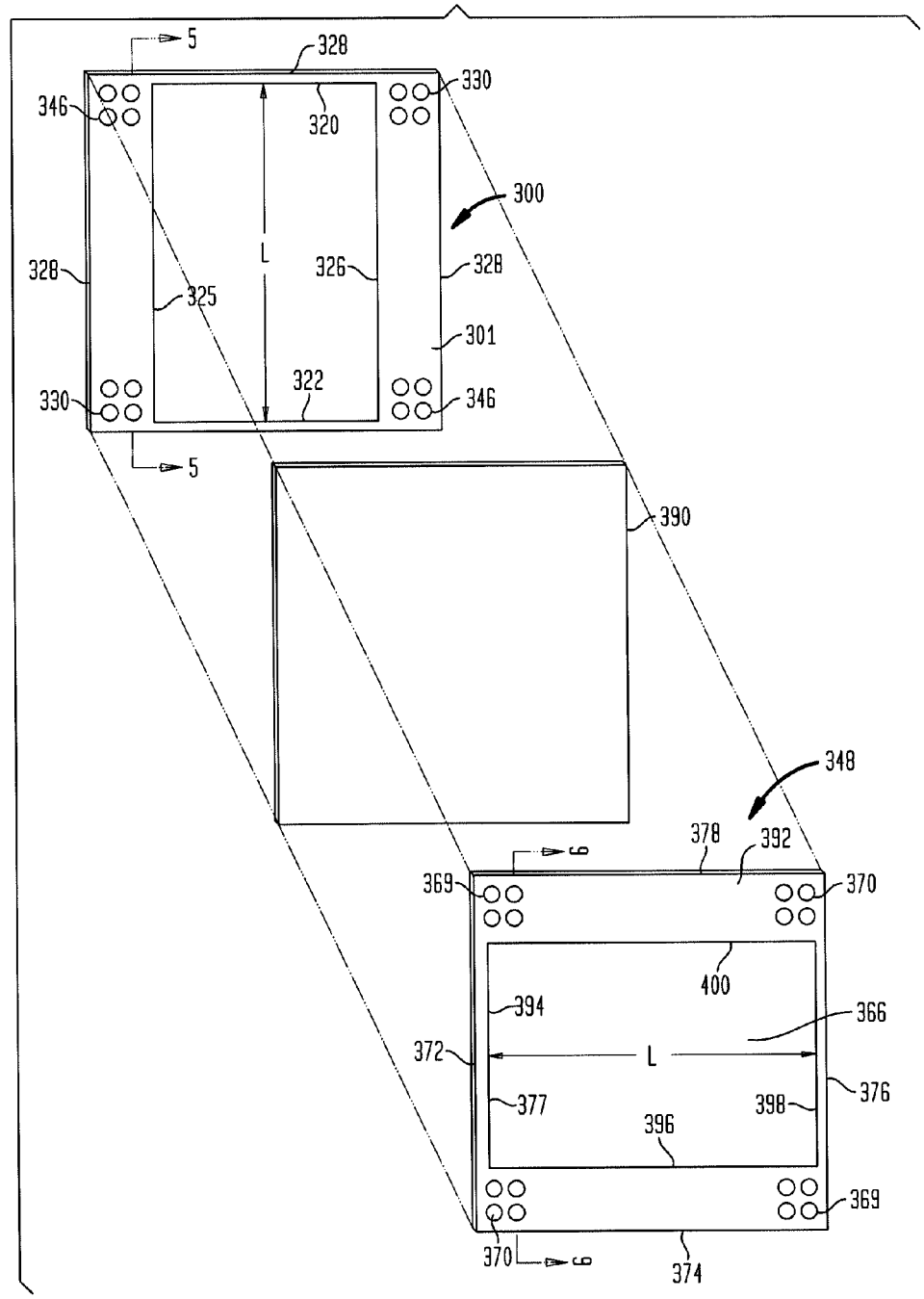

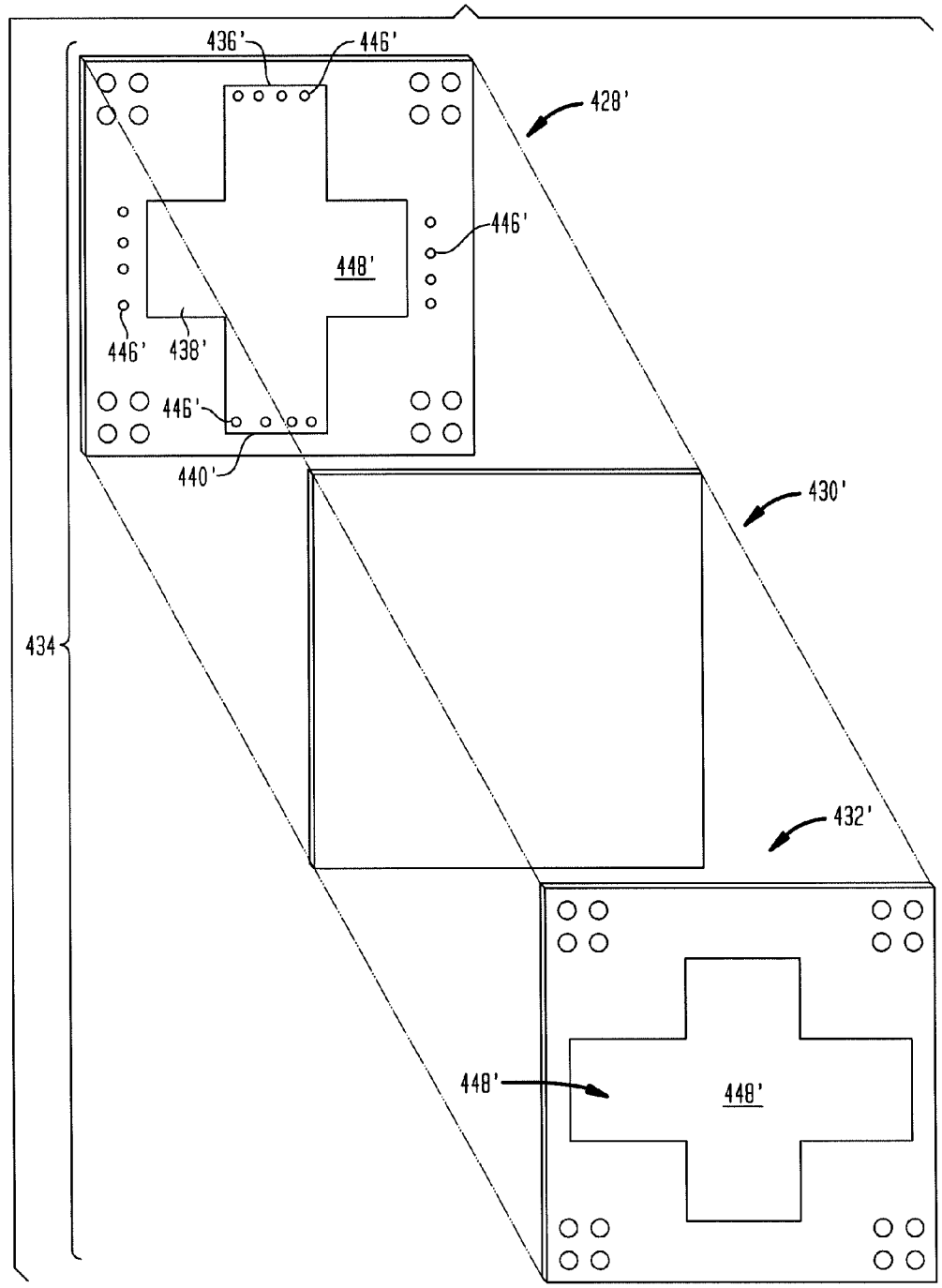

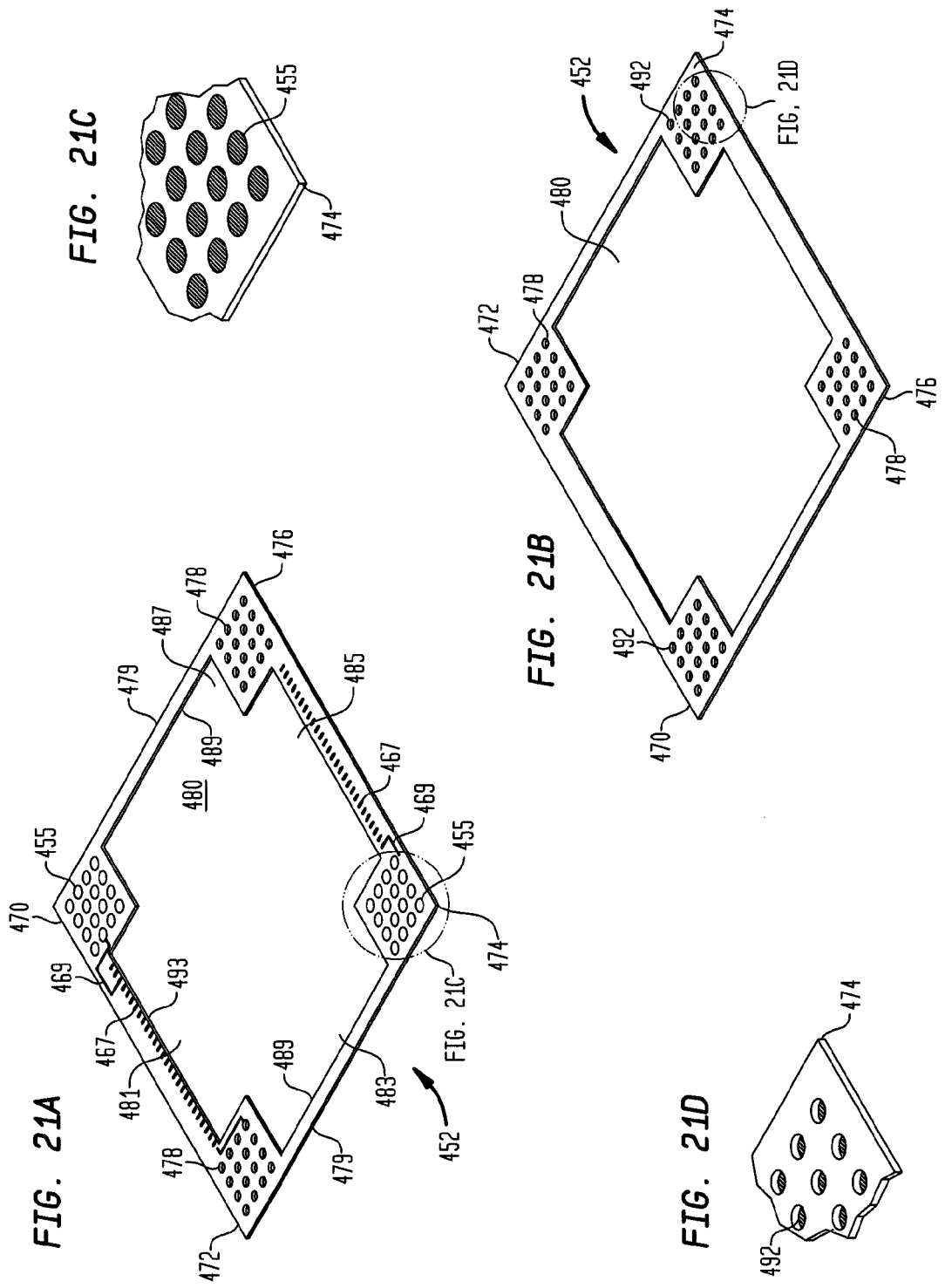

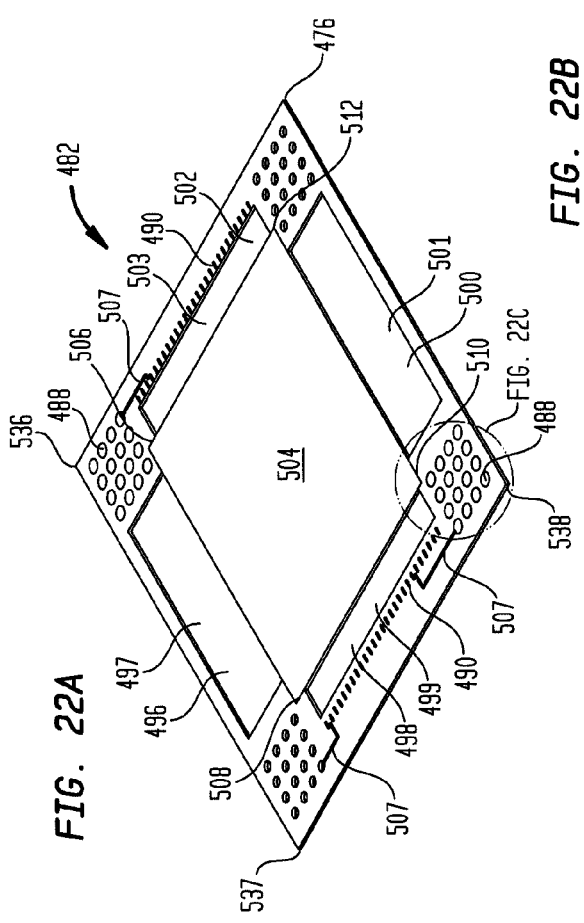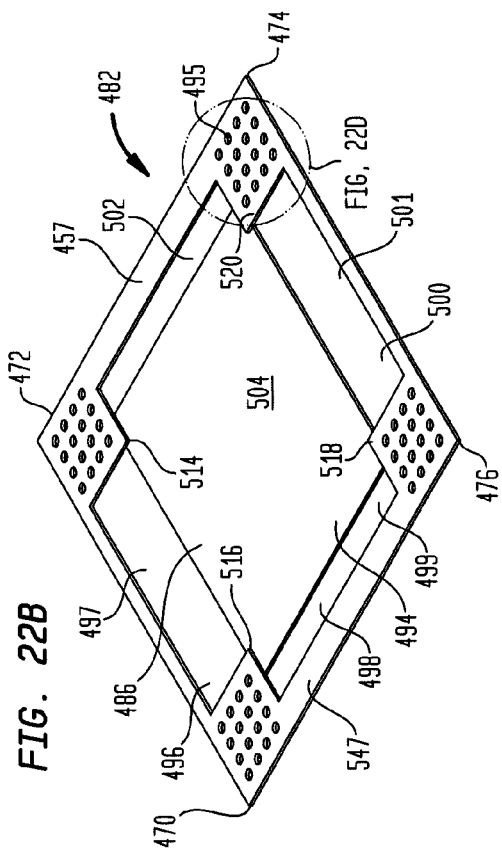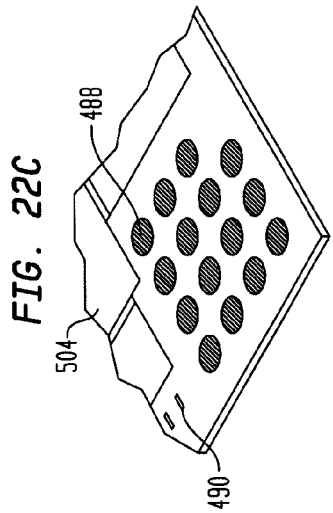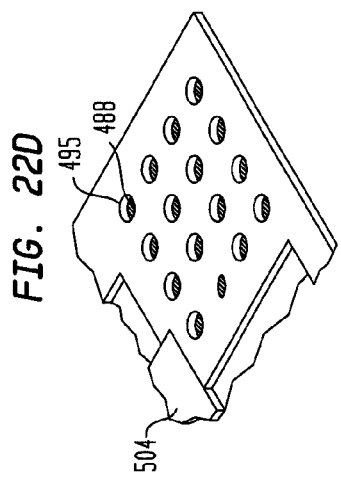

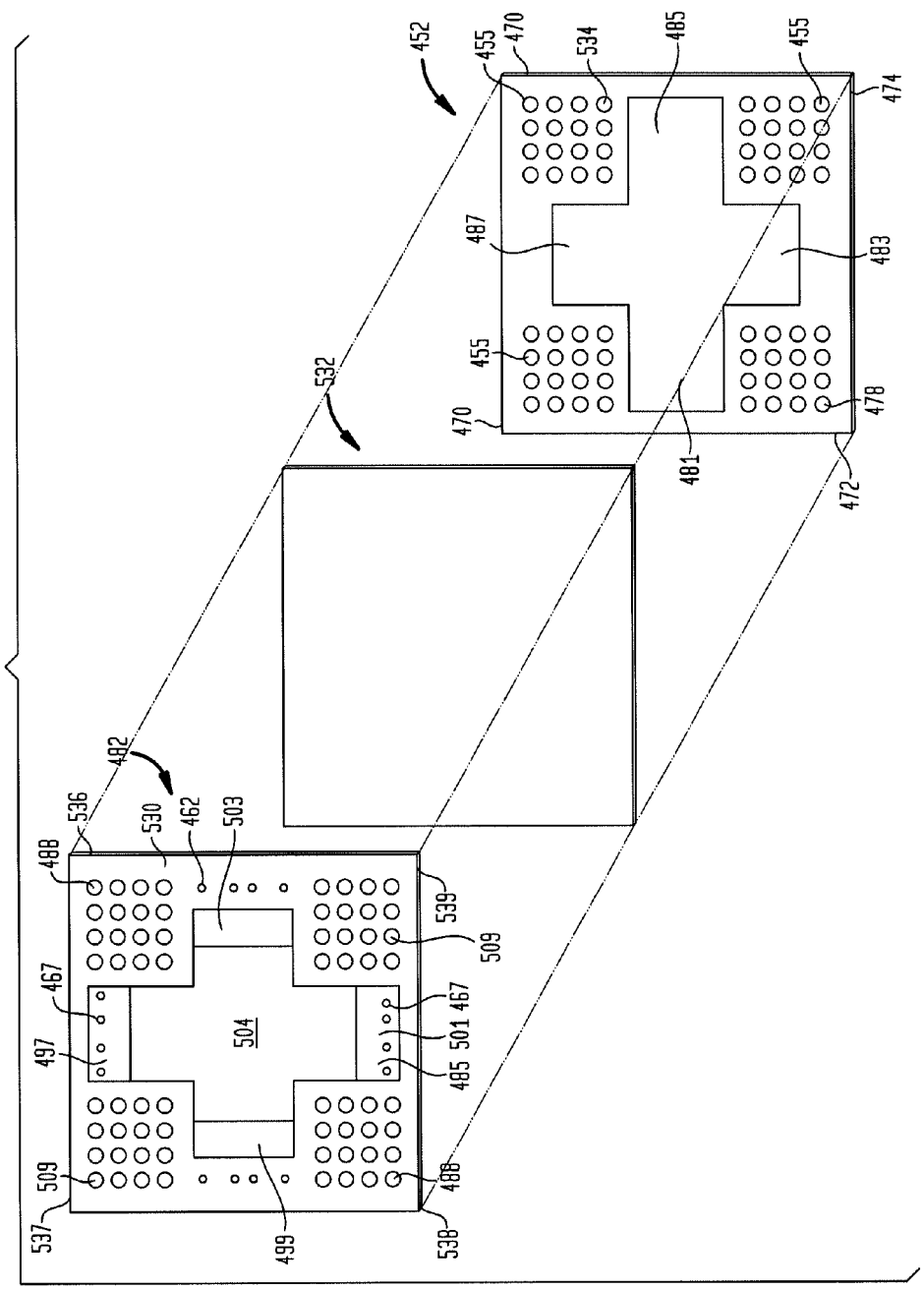

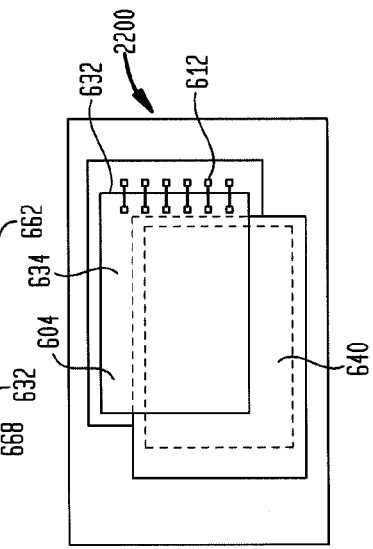
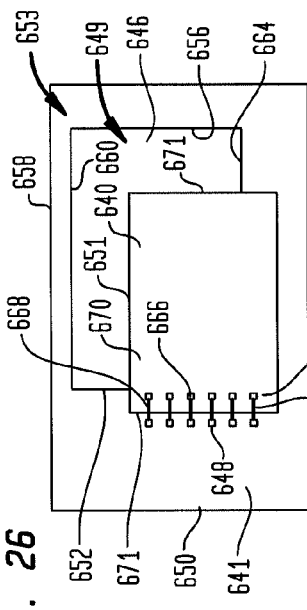
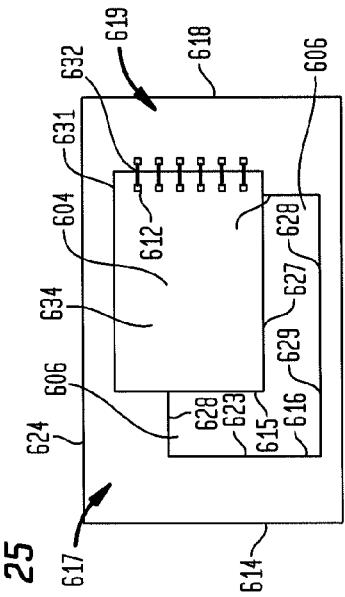
FIG. 25    FIG. 26    FIG. 27
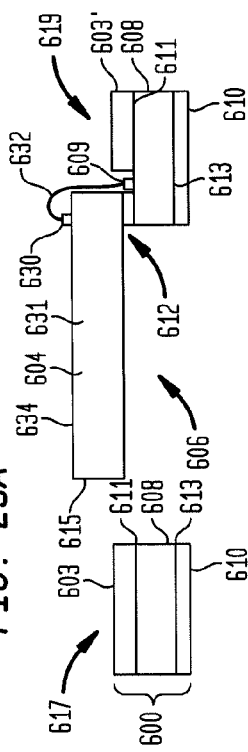
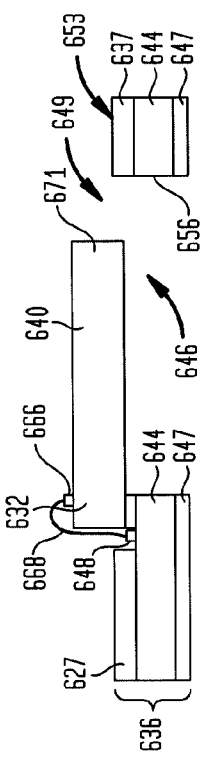
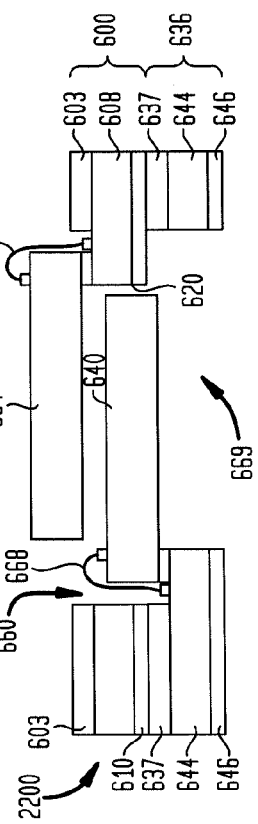
FIG. 25A    FIG. 26A    FIG. 27A

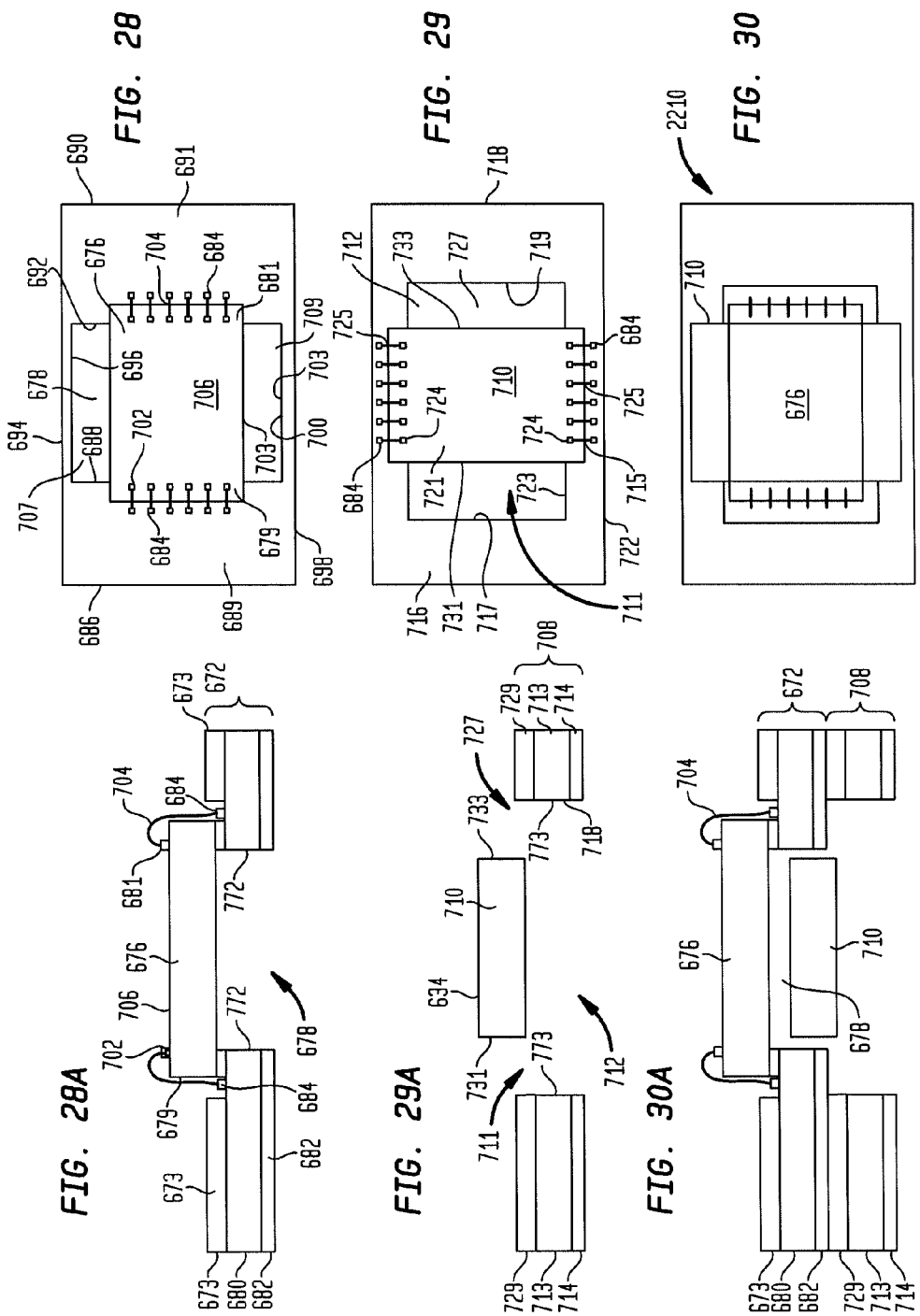

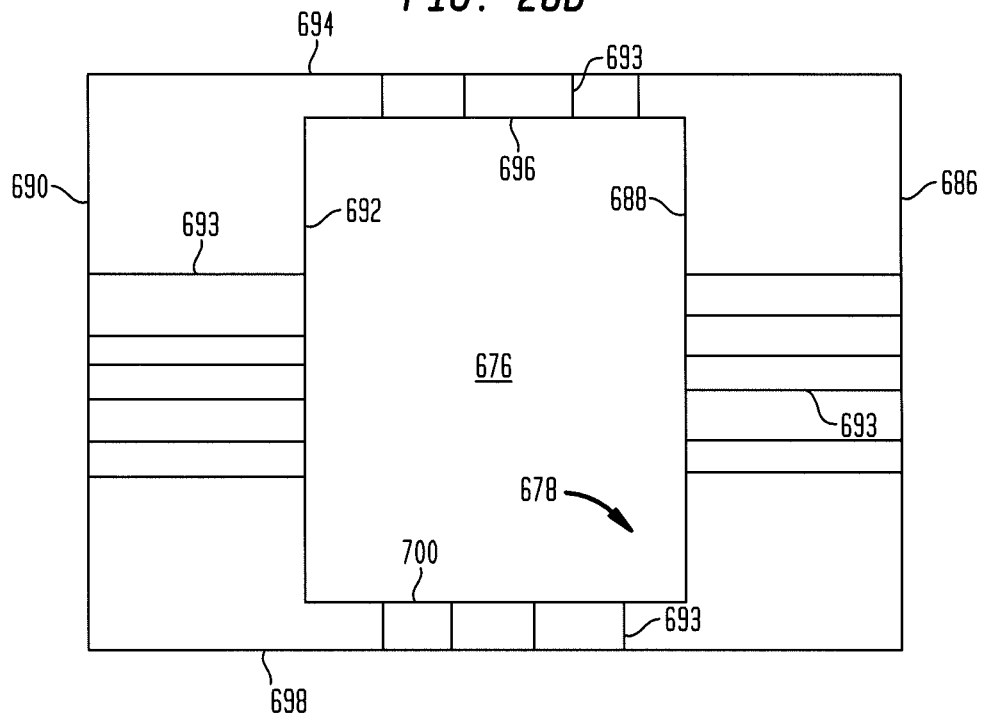
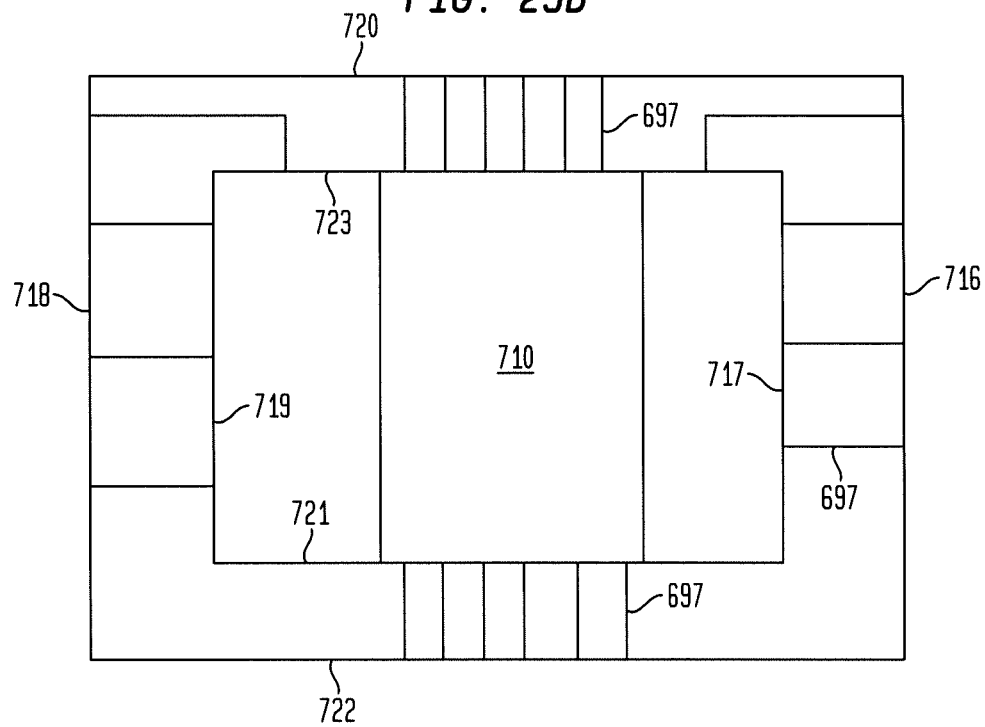

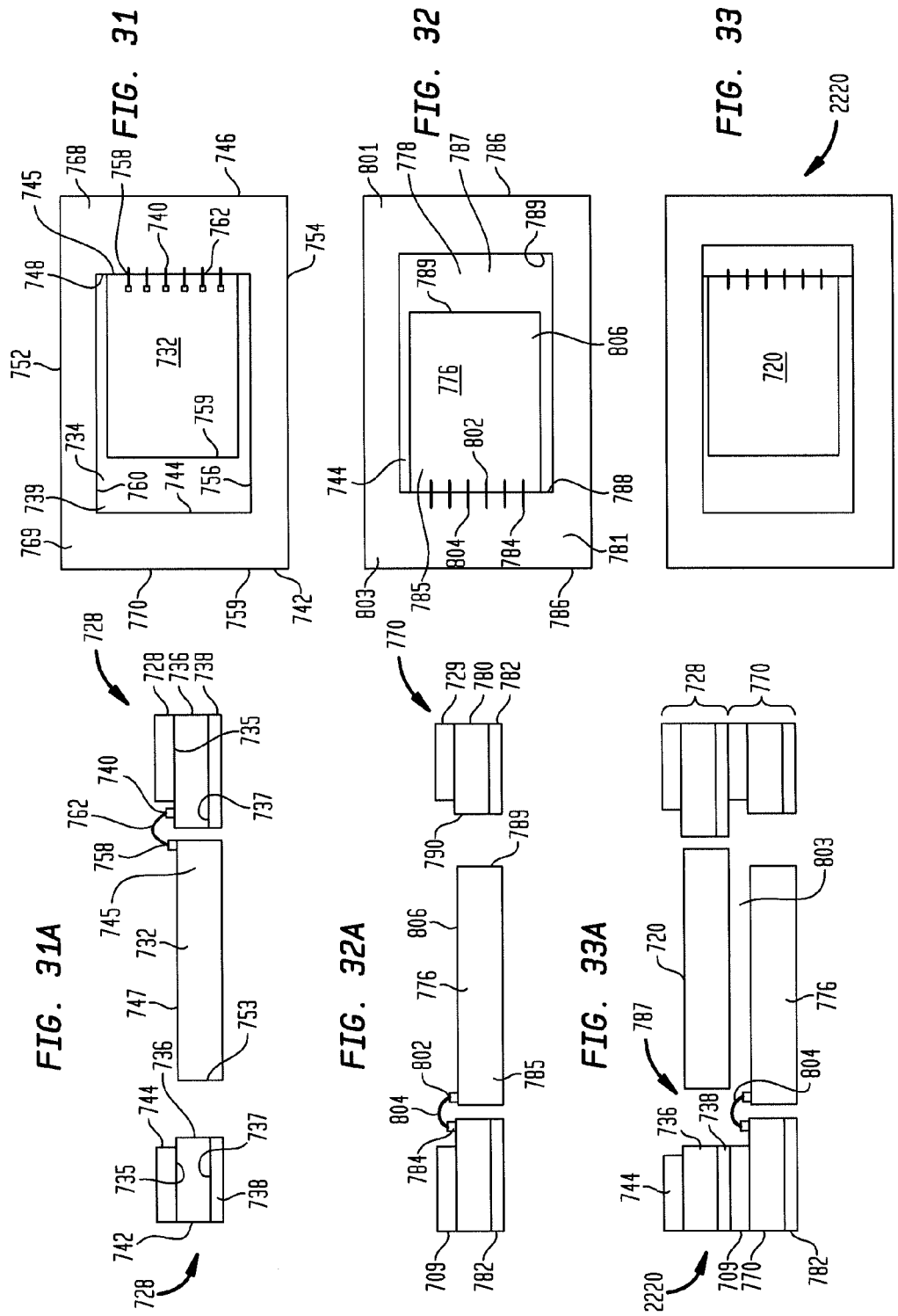

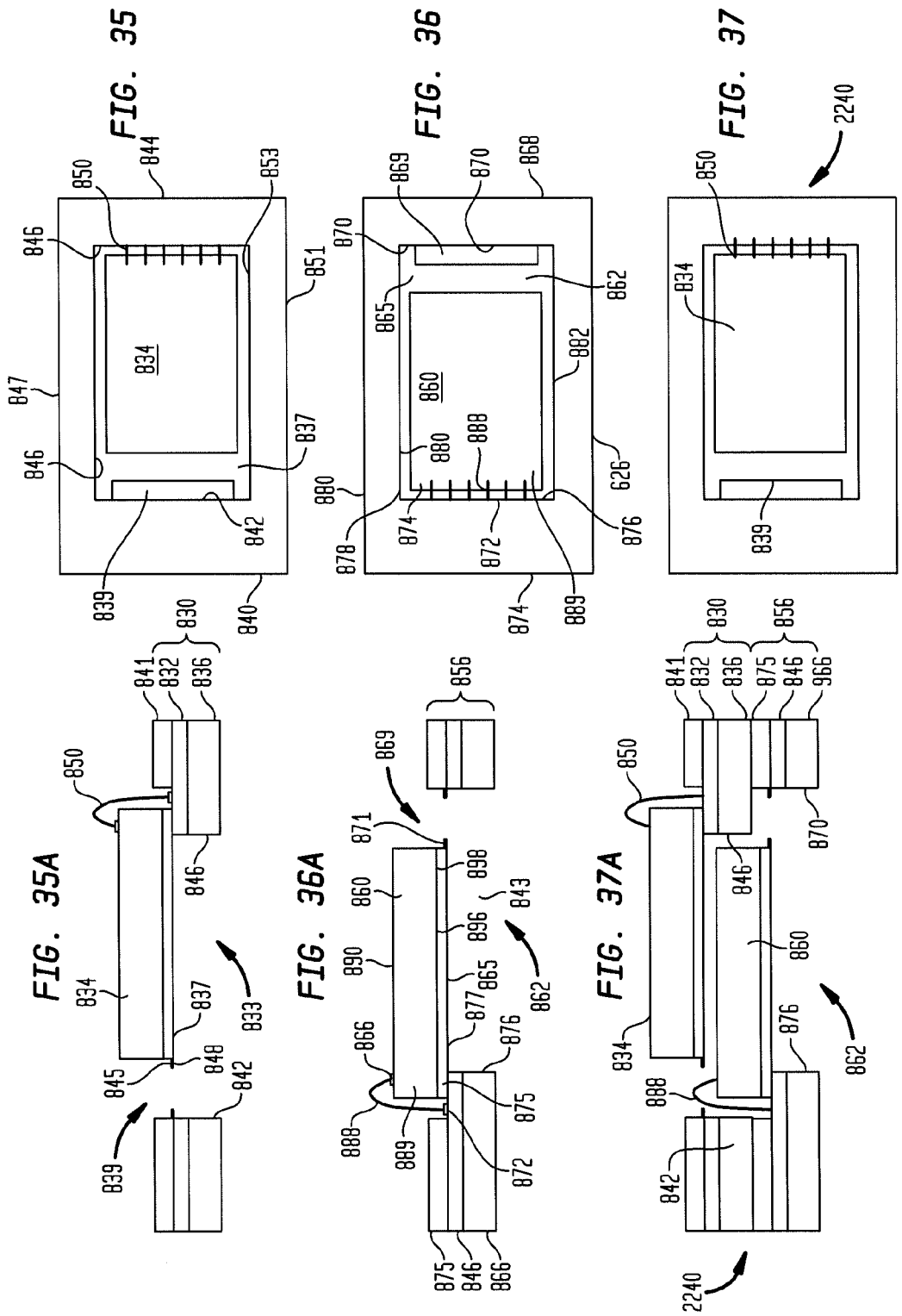

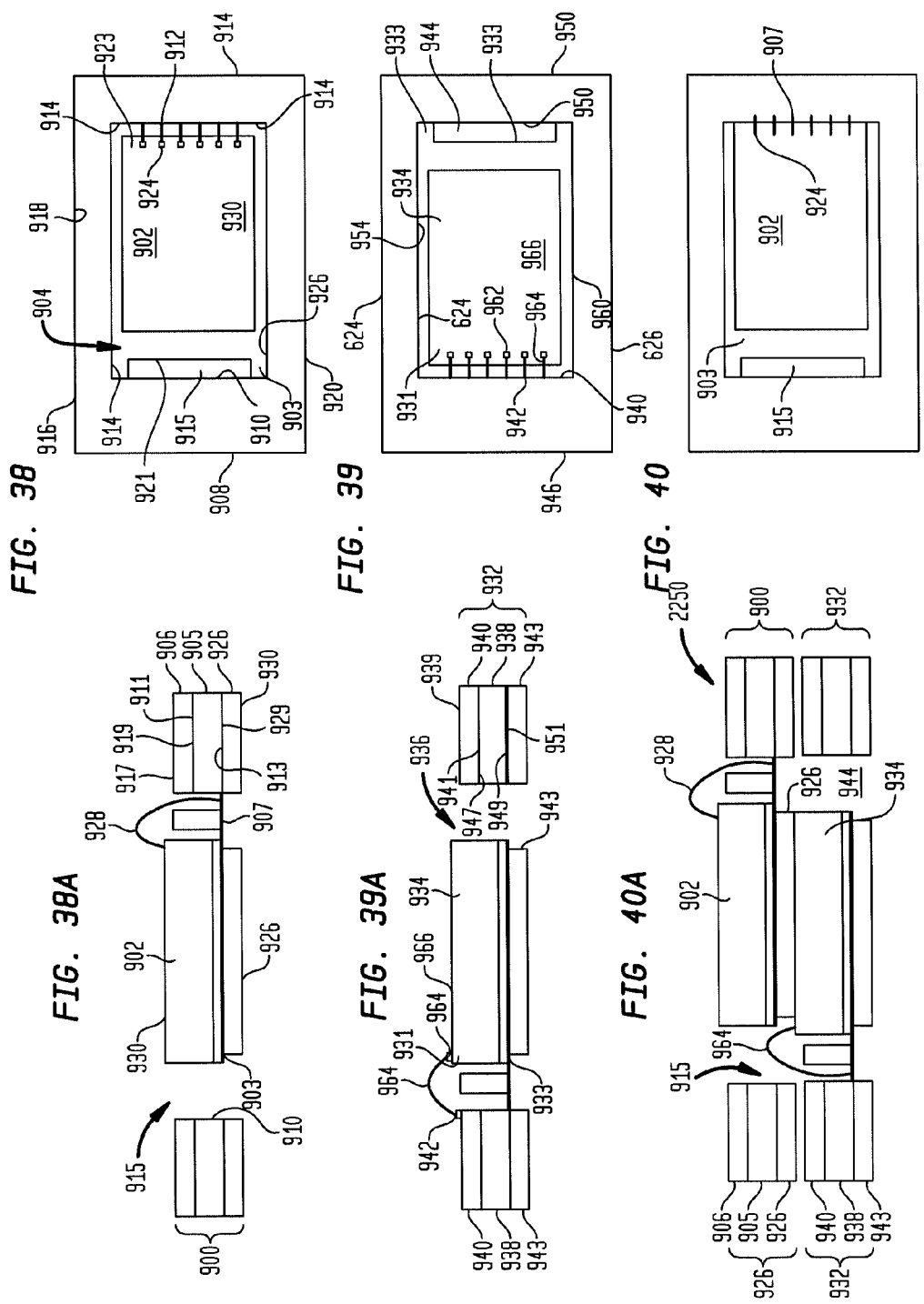

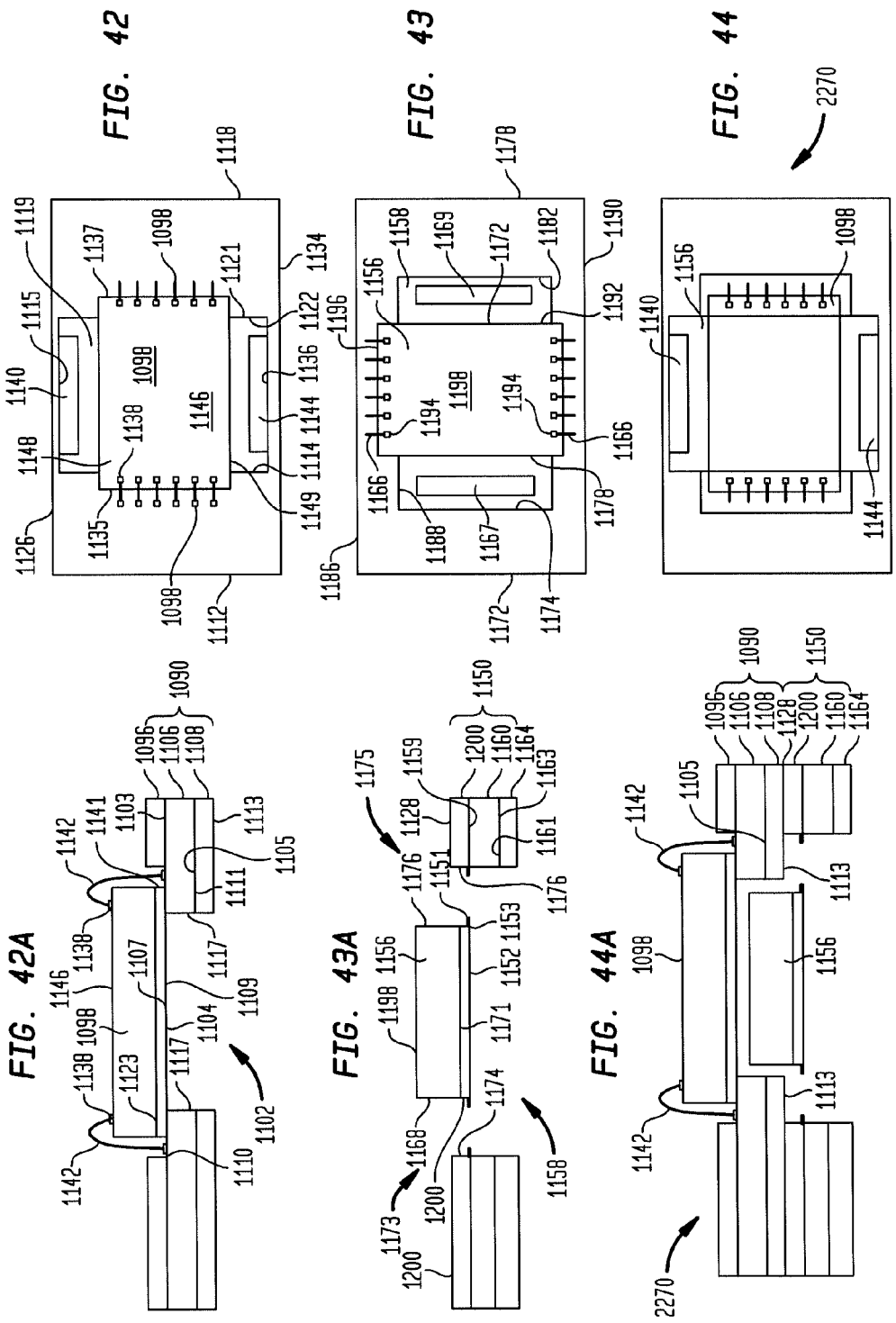

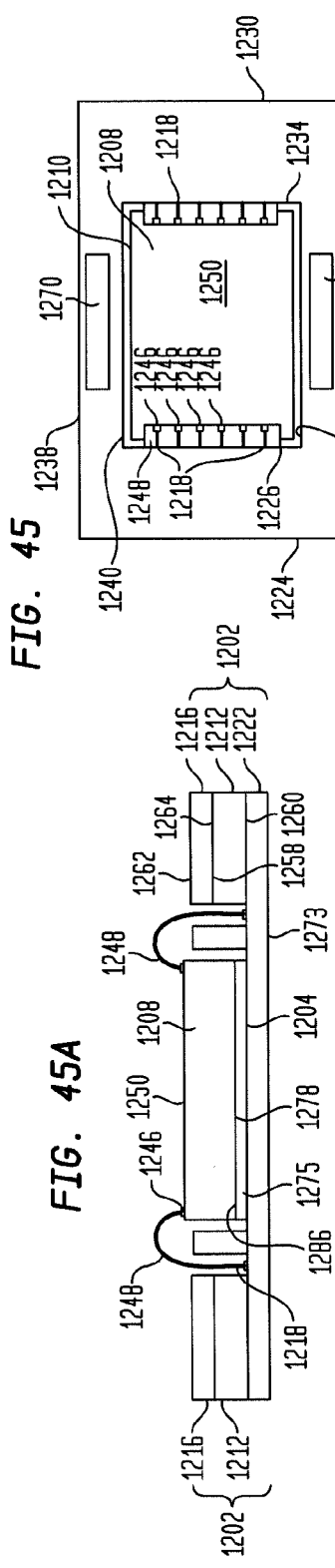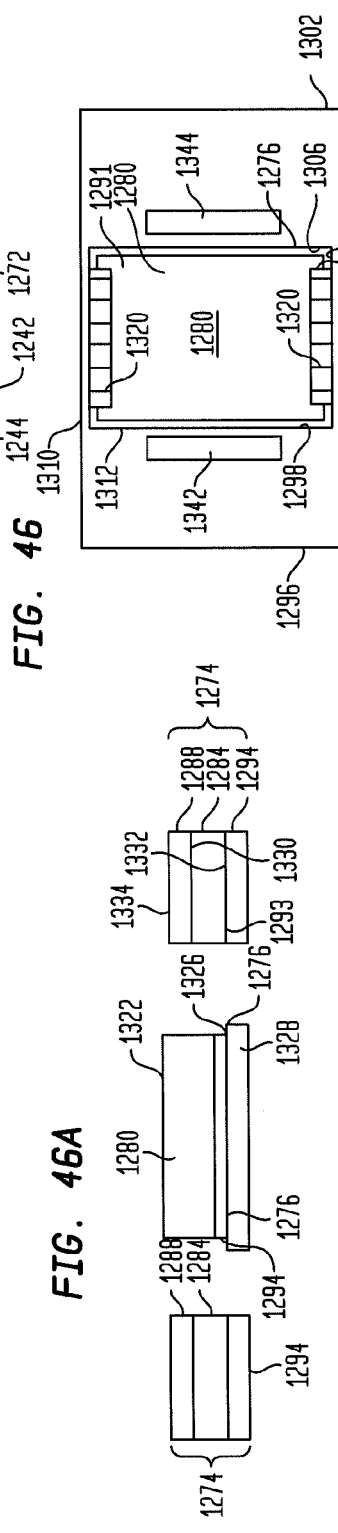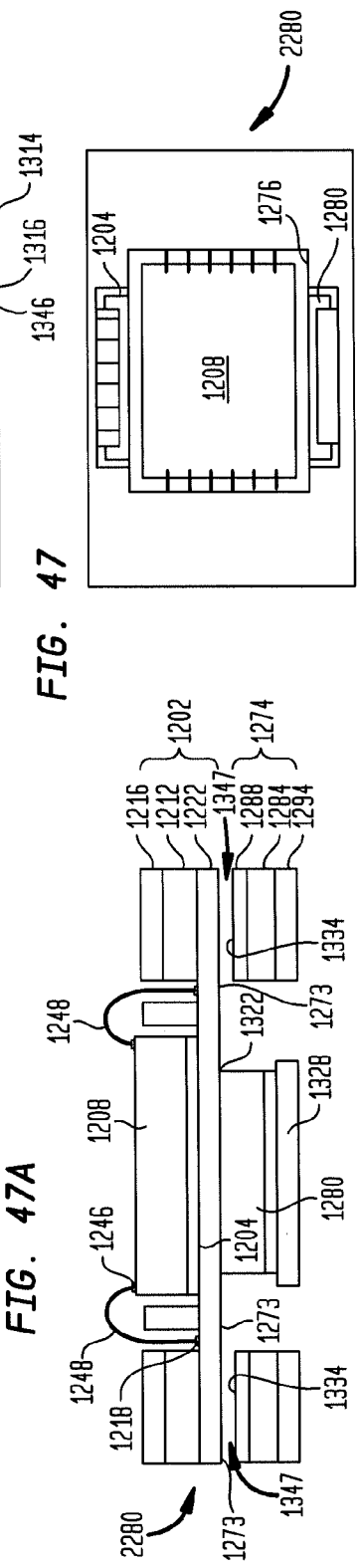

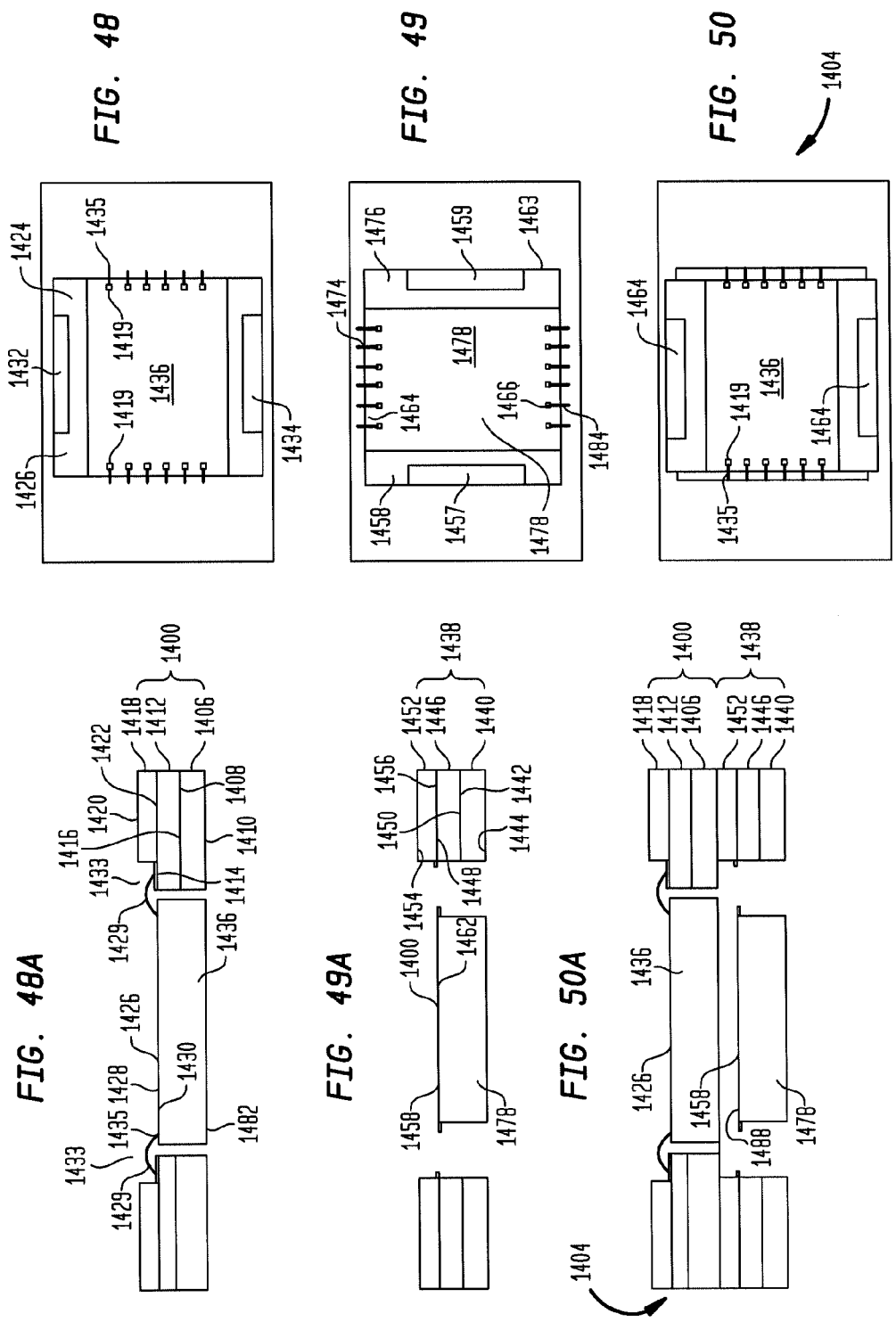

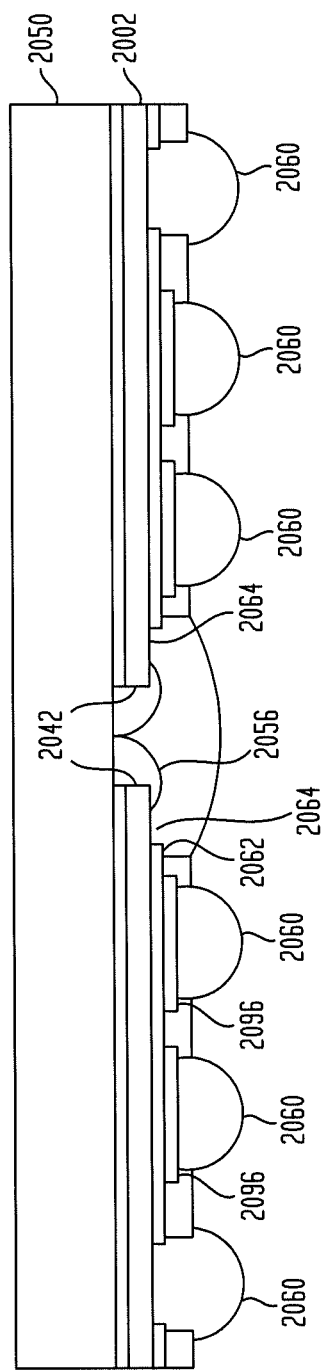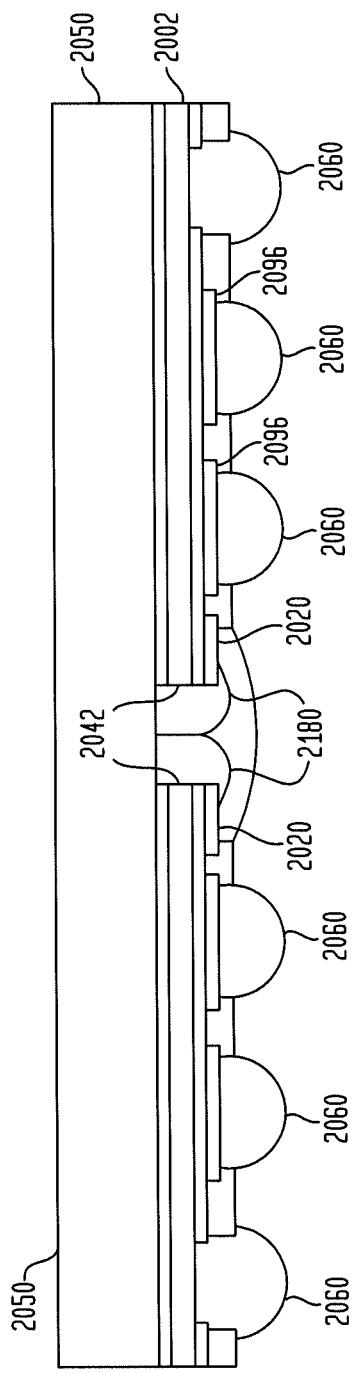

MICROELECTRONIC PACKAGES HAVING CAVITIES FOR RECEIVING MICROELECTRONIC ELEMENTS

CROSS-REFERENCE TO RELATED APPLICATIONS

The present application is a divisional of U.S. Pat. No. 8,541,873, issued on Sep. 24, 2013, which is a divisional of U.S. Pat. No. 7,994,622, issued on Aug. 9, 2011, which claims the benefit of the filing date of U.S. Provisional Patent Application No. 60/923,953, filed Apr. 16, 2007, the disclosures of all of which are incorporated herein by reference.

BACKGROUND OF THE INVENTION

The present invention relates to packaged microelectronic elements, packages therefor, and methods of packaging microelectronic elements.

Semiconductor chips are typically packaged with substrates to form microelectronic packages having terminals that are electrically connected to the chip contacts. Most commonly, such packages include a dielectric element, commonly referred to as a "chip carrier" with package contacts formed as plated or etched metallic structures on the dielectric element. These package contacts typically are connected to the contacts, e.g. bond pads, of the chip itself by features such as thin traces extending along the chip carrier itself and by fine leads or wires extending between the contacts of the chip and the terminals or traces. In a surface mounting operation, the package is placed onto a circuit board so that each contact on the package is aligned with a corresponding terminal on a circuit panel, e.g., a circuit board. Solder or other bonding material is provided between the terminals and the contact pads. The package can be permanently bonded in place by heating the assembly so as to melt or "reflow" the solder or otherwise activate the bonding material.

Considerable effort has been devoted in the art to making such packages smaller, so that the packaged chip occupies a smaller area on the circuit board. For example, packages referred to as chip-scale packages occupy an area of the circuit board equal to the area of the chip itself, or only slightly larger than the area of the chip itself. However, even with chip-scale packages, the aggregate area occupied by several packaged chips is greater than or equal to the aggregate area of the individual chips.

It has been proposed to provide "stacked" packages, in which a plurality of individual packaged chips or units are mounted one above the other in a common package assembly. This common package assembly can be mounted on an area of the circuit panel which may be equal to or just slightly larger than the area typically required to mount a single package or unit containing a single chip. The stacked package approach conserves space on the circuit panel. Chips or other elements which are functionally related to one another can be provided in a common stacked package assembly. The assembly may incorporate interconnections between these elements.

One form of stacked package assembly which has been proposed heretofore is sometimes referred to as a "ball stack." A ball stack assembly includes two or more individual units. Each unit incorporates a unit substrate similar to the package substrate of an individual unit, and one or more microelectronic elements mounted to the unit substrate and connected to the terminals on the unit substrate. The individual units are stacked one above the other, with the terminals on each individual unit substrate being connected to terminals on another unit substrate by electrically conductive elements such as solder balls or pins. The terminals of the bottom unit substrate may constitute the terminals of the entire assembly or, alternatively, an additional substrate may be mounted at the bottom of the assembly which may have terminals connected to the terminals of the various unit substrates. Ball stack packages are depicted, for example, in certain preferred embodiments of U.S. Published Patent Applications 2003/0107118 and 2004/0031972, the disclosures of which are hereby incorporated by reference herein.

The substrate used to mount the chips also affects the size and thickness of the packaged chip. The substrate materials used for packaging semiconductor chips are selected for their compatibility with the processes used to form the packages. For example, during solder or other bonding operations, intense heat may be applied to the substrate. Accordingly, metal lead frames have been used as substrates. Laminate substrates have also been used to package microelectronic devices. Such substrates may include two to four alternating layers of fiberglass and epoxy, wherein successive fiberglass layers may be laid in traversing, e.g., orthogonal, directions. Optionally, neat resistive compounds such as bismaleimide triazine (BT) may be added to such laminate substrates.

Tapes have also been used as substrates to provide thinner microelectronic packages. Such tapes are typically provided in the form of sheets or rolls of sheets. For example, single and double sided sheets of copper-on-polyimide are commonly used. Polyimide based films offer good thermal and chemical stability and a low dielectric constant, while copper having high tensile strength, ductility, and flexure has been advantageously used in both flexible circuit and chip scale packaging applications. However, such tapes are relatively expensive, particularly as compared to lead frames and laminate substrates.

Despite all of the innovations discussed above, there remains room for improvement.

SUMMARY OF THE INVENTION

According to a first aspect of the invention, a packaged microelectronic element is provided which includes a package element and a microelectronic element. The package includes a first dielectric element having a bottom face and a top face remote from said bottom face. A plurality of pins protrudes beyond the bottom face of the dielectric element, whereas a plurality of chip contacts and a plurality of package contacts are exposed at the top face of the dielectric element. The chip contacts are connected to the package contacts, and the package contacts are connected to the pins. A second dielectric element overlies the top face of the dielectric element and has openings aligned with said package contacts. The attached microelectronic element has a plurality of bond pads that are connected to the chip contacts.

In accordance with a particular aspect of the invention, the bond pads of the packaged microelectronic element are disposed on a front face of the microelectronic element. The front face of the microelectronic element is adjacent to the top face, and wire bonds connect the bond pads to the chip contacts.

In accordance with a particular aspect of the invention, the second dielectric element has a bottom face adjacent to the package contacts and a top face on the opposite side of the bottom face. A plurality of second chip contacts are also exposed at the bottom face of the second dielectric element and a second microelectronic element with bond pads is connected to the second chip contacts. The packaged microelectronic element may also have package contacts aligned with the pins and the second dielectric element may have openings aligned with the package contacts.

In accordance with another particular aspect of the invention, the first dielectric element has an inner edge extending between the top and bottom faces which defines an opening. The second dielectric element has an inner edge extending between the top and bottom faces, wherein the inner edge of the second dielectric element defines a second opening aligned with the opening of the first dielectric element. The first and second openings and the first and second microelectronic elements define an interior cavity of the packaged microelectronic element. The dimensions of the interior cavity in directions aligned with said faces of said first and second dielectric elements may define a rectangle or a cross. The inner edge of the first packaged microelectronic element opening extends beyond the inner edge of the second opening. The portion of the inner edge of the first opening extends beyond the inner edges of the second opening such that there is a ledge. A plurality of chip contacts may be exposed on the ledge.

In accordance with another particular aspect of the invention, when the microelectronic element is connected to the packaged element, the microelectronic element may be spaced laterally from an inner edge of the interior cavity. This allows the microelectronic element to be in the same plane as the packaged element. Wire bonds can then extend from bond pads on the microelectronic element to the chip contacts which are preferably on the ledge. Instead of wire bonds, conductive masses may also be used to connect the plurality of bonds pads on said microelectronic element directly to the chip contacts.

In accordance with a second aspect of the invention, a packaged microelectronic element includes a packaged element and a microelectronic element. The microelectronic element has a first dielectric element having a bottom face and a top face remote from the bottom face. The packaged element further includes a plurality of package contacts and a plurality of chip contacts exposed at the top face of the dielectric layer, wherein the chip contacts are connected to the package contacts. A second dielectric element overlies the top face of the dielectric layer and the second dielectric element has openings aligned with the package contacts. A microelectronic element has a plurality of bond pads that are connected to the chip contacts.

In accordance with a particular aspect of the present invention, the microelectronic element further includes a front face, a rear face, and bond pads on the front face of the microelectronic element. Preferably, wire bonds connect the bond pads to the chip contacts. Alternatively, conductive masses, such as solder balls, may be used to connect the bond pads on the microelectronic element directly to the chip contacts.

In accordance with this aspect of the invention, the package element has edges extending between said top and bottom faces. The edges are joined at corners and corner regions at the corners having a first width in a first direction interconnected by strip regions having a second width in the first direction smaller than the first width, wherein the package contacts are exposed at the corner regions. The package contacts are therefore preferably exposed on only two of the four corners of either of the top or bottom surfaces.

In accordance with this aspect of the invention, the second dielectric element has a bottom face adjacent to the package contacts and a top face remote from the bottom face. A plurality of second chip contacts are exposed at the bottom face of the second dielectric element and a second microelectronic element has bond pads connected to the second chip contacts. The microelectronic element is laterally adjacent the packaged element.

In accordance with this aspect of the invention, the first dielectric element has an inner edge extending between the top and bottom faces and the inner edge defines an opening. The second dielectric element may also have an inner edge extending between the top and bottom faces, so that the inner edge of the second dielectric element defines another opening which is aligned with the first opening in the first dielectric layer. The first and second openings define an interior cavity of the packaged microelectronic element, which may be take on a variety of shapes and sizes, such as a square or cross.

A ledge is formed in the portion of the package element wherein the inner edge of the first opening extends beyond the inner edge of the second opening. At least one of the plurality of chip contacts may be exposed on the ledge.

In accordance with a particular aspect of the invention, openings may extend through the second dielectric layer. The package contacts on the top face of the first dielectric element are aligned with the openings.

In accordance with another particular aspect of the invention, the interior cavity has interior projections and a metal shelf disposed over the interior projections. A top or bottom surface of the microelectronic element may be attached to the top surface or bottom surface of the metal shelf.

In accordance with a third aspect of the present invention, a packaged microelectronic element has a packaged element and a microelectronic element. The packaged microelectronic element includes a ground plane having an opening, a dielectric layer, and a metal layer. The dielectric layer has a top face contacting the ground plane, a bottom face remote from the top face, and a window aligned with the opening in the ground plane. The metal layer includes a plurality of package signal contacts and a plurality of chip signal contacts disposed on the bottom face. A microelectronic element has a front face adjacent to the ground plane and a plurality of bond pads exposed within the opening and the window. Bond wires extend from the bond pads through the opening and the window to the ground plane.

In accordance with a particular aspect of the present invention, the ground plane has a top face and a bottom face. The bond pads on the microelectronic element are connected to the bottom surface of the ground plane. Ground openings may also be exposed at a bottom surface of the ground plane which can receive electrical components. The bond pads on the microelectronic element may then be connected to the exposed portion of the ground plane via bond wires extending from the bond pads on the microelectronic element and through the opening.

In another particular aspect of the present invention, the dielectric layer has an inner edge extending between the top and bottom faces, such that the inner edge defines a first opening. The ground plane also has top and bottom faces and an inner edge extending between the top and bottom faces, such that the inner edge of the ground plane defines a second opening that is aligned with the first opening. The first and second openings in the dielectric layer and ground plane define an interior cavity of the packaged microelectronic element. This allows the bottom face of the microelectronic element to be exposed through the interior cavity of the package microelectronic element. Additionally, bond pads on the microelectronic element can be connected to the ground plane through the interior cavity.

In accordance with a fourth aspect of the present invention, a stacked microelectronic package assembly includes a first package element and a second package element overlying the first package element. Each of the first and second package elements has a top face extending in a lateral direction, a bottom face remote from the bottom face, a window, and a plurality of contacts exposed at either or both of the top or bottom faces. First and second microelectronic elements are attached to the first and second package elements. Additionally, a first plurality of bond wires electrically connects bond pads on the first microelectronic element to the plurality of contacts on the first package element, and a second plurality of bond wires electrically connects bond pads on the second microelectronic element to the plurality of contacts on the second package element. At least one of the first or second package elements extends partially over the window of another one of the first or second package elements.

In accordance with a particular aspect of the present invention, the window in at least one of the package elements has a first edge that extends beyond a second edge of the window in the other package. Bond wires on the first package element may extend within the window of the second package element.

An area between the edge of the window in the first package element that is offset from the edge of the window in the second package element defines an offset area. A portion of the bond wires of the second package extends through the offset area.

In another particular aspect of the invention, the microelectronic element of the first or second package may be positioned in various ways on the package. For example, the first microelectronic element may be located above or within the window. The microelectronic element may be mounted in a face down position or a face up position. Additionally, bond pads on the microelectronic element may be wire bonded at one or both ends to the package element.

In another particular aspect of the invention, the second microelectronic element of the second package element is disposed within the window of the first package element.

In another particular aspect of the present invention, an interior shelf is adjacent the dielectric layer. The interior shelf extends throughout the interior cavity, and a microelectronic element may be attached thereto.

In accordance with a fourth aspect of the present invention, a stacked microelectronic package assembly includes a first package element and a second package element overlying the first package element. Each of the first and second package elements has a top face extending in a lateral direction, a bottom face remote from the bottom face, a window, and a plurality of contacts exposed at either or both of the top or bottom faces. First and second microelectronic elements are attached to the first and second package elements. Additionally, a first plurality of bond wires electrically connecting bond pads on the first microelectronic element to the plurality of contacts on the first package element, and a second plurality of bond wires electrically connecting bond pads on the second microelectronic element to the plurality of contacts on the second package element. The second plurality of bond wires on the second microelectronic element extends partially within the window of said first package element.

According to an aspect of the invention, a packaged microelectronic element includes a package element having a top face, a bottom face, and an edge extending between the top and bottom faces. There is preferably a plurality of chip contacts and package contacts exposed at the top face, as well as a microelectronic element having a front face, a rear face, an edge extending between the top and bottom faces, and a plurality of bond pads exposed at the top face. The bond wires extend across the edge of the microelectronic element and the package element, and electrically connect the bond pads to the chip contacts.

In accordance with a particular aspect of the present invention, the bond wires extend across a gap disposed between the edges of the microelectronic element and the package element.

In accordance with yet another particular aspect of the present invention, the package contacts are disposed adjacent to the chip contacts. The package contacts may also be connected to an adjacent one of the chip contacts. Additionally, the package contacts may be disposed in one or more rows remote from the edges of the package element In accordance with still another particular aspect of the present invention, the package element is elongated in a first direction, and the chip contacts and the package contacts extend in the first direction.

In accordance with another particular aspect of the present invention, chip contacts are disposed in at least one row adjacent to and extending parallel to the edge of the package element.

In accordance with still another particular aspect of the present invention, the edge of the package element is a first edge, the package element includes a second edge opposite the first edge, and the chip contacts are disposed in respective single row adjacent to the first and second edges.

In accordance with yet a further particular aspect of the present invention, the microelectronic element is a first microelectronic element and the bond wires are first bond wires. The package further comprises a second microelectronic element having a front face, a rear face, an edge extending between the top and bottom faces, and a plurality of bond pads exposed at the top face. Bond wires also extend across the edges of the second microelectronic element and the package element, and electrically connect the bond pads to the chip contacts.

In accordance with a further particular aspect of the present invention, the package element includes a window having interior walls, and the edge includes one of the interior walls. The microelectronic element may be disposed within the window.

In accordance with yet another particular aspect of the present invention, an assembly further includes a second package element having a top face, a bottom face, and an edge extending between the top and bottom faces. There is preferably a plurality of chip contacts and package contacts exposed at the top face. There is preferably a second microelectronic element which overlies the first microelectronic element. The second microelectronic element has a front face, a rear face, an edge extending between the top and bottom faces, and a plurality of bond pads exposed at the top face. There are bond wires electrically connecting the bond pads of the second microelectronic element to the chip contacts of the second package element, and the bond wires extend across the edge of the second microelectronic element and the second package element. The edge of the first package element and the edge of the second package element may also be remote from each other.

BRIEF DESCRIPTION OF THE DRAWINGS

FIG. 11 is a sectional view of a portion of a package element of a stacked package in accordance with an alternative embodiment of the present invention.

FIG. 12 is a top plan view of a first portion of the package element included in the packaged chip in accordance with this alternative embodiment of the invention.

FIG. 15 is an exploded view of the components of the package element included in the packaged chip in accordance with this alternative embodiment of the invention.

FIG. 20 is an exploded view of the components of a packaged chip in accordance with another alternative embodiment of the present invention.

FIGS. 21, 21A, 21B, 21C, and 21D are perspective and perspective-sectional views of a first portion of a stacked package in accordance with this alternative embodiment of the present invention.

FIGS. 22, 22A, 22B, 22C, and 22D are perspective and perspective-sectional views of a second portion of a stacked package in accordance with this alternative embodiment of the present invention.

FIG. 23 is an exploded plan view of the first and second portions shown in FIGS. 21-22D just prior to their assembly as a completed stacked package in accordance with this alternative embodiment of the present invention.

FIGS. 25, 25A, 25B, 26, 26A, 26B, 27 and 27A are top plan views and respective sectional views of the components of a stacked package and a completed stacked package in accordance with another alternative embodiment of the present invention.

FIGS. 28, 28A, 28B, 29, 29A, 29B, 30 and 30A are top plan views and respective sectional views of the components of a stacked package and a completed stacked package in accordance with yet another alternative embodiment of the present invention.

FIGS. 31, 31A, 31B, 32, 32A, 32B, 33, and 33A are top plan views and respective sectional views of the components of a stacked package and an assembled stacked package in accordance with yet another alternative embodiment of the present invention.

FIGS. 35, 35A, 36, 36A, 37, and 37A are top plan and sectional views of the components of a stacked package and an assembled stacked package in accordance with still another alternative embodiment of the present invention.

FIGS. 38, 38A, 39, 39A, 40, and 40A are top plan and sectional views of the components of a stacked package and an assembled stacked package in accordance with still another alternative embodiment of the present invention.

FIGS. 42, 42A, 43, 43A, 44, and 44A are top plan and respective sectional views of the components of a stacked package and an assembled stacked package in accordance with another alternative embodiment of the present invention.

FIGS. 45, 45A, 46, 46A, 47, and 47A are top plan and respective sectional views of the components of a stacked package and an assembled stacked package in accordance with still another alternative embodiment of the present invention.

FIGS. 48, 48A, 49, 49A, 50, and 50A are top plan view and respective sectional views of the components of a stacked package, as well as a stacked package in accordance with another alternative embodiment of the present invention.

FIG. 60 is a sectional view of a packaged chip in accordance with another alternative embodiment of the packaged chip shown in FIG. 58.

FIG. 61 is a sectional view of a packaged chip in accordance with yet another alternative embodiment of the packaged chip shown in FIG. 58.

DETAILED DESCRIPTION

Figure 1:
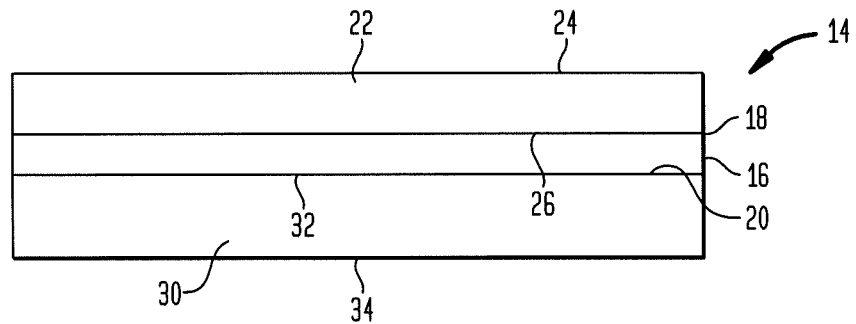
FIG. 1 is a cross-sectional view of a tri-metal substrate used for a packaged chip in accordance with a preferred embodiment of the present invention.

Referring to FIG. 1, a subassembly or composite tri-metal substrate 14 (prior to etching circuitry and the like) includes an etch-resistant layer 16 having an upper surface 18 and a lower surface 20. Tri-metal substrate 14 also includes a first metal layer 22 having an upper surface 24 and a lower surface 26 and a second metal layer 30 having an upper surface 32 and a lower surface 34. The etch-resistant layer 16 is disposed on the first metal layer 22, such that the upper surface 18 of the etch-resistant layer confronts the lower surface 26 of the first metal layer. The upper surface 32 of the second metal layer 30 abuts the lower surface 20 of the etch-resistant layer 16. Throughout this reference, terms such as "upper," "lower," "top," and "bottom" do not refer to any gravitational positioning but are simply used for discussion purposes with regard to the figures.

The etch-resistant layer 16 is preferably constructed from a metal such as nickel or other metal having etching properties different than those of the first and second metal layers 22, 30. This will allow the etch-resistant layer to resist attack by etching agents used to etch the first and second metal layers 22, 30. The etch-resistant layer 16 is relatively thin and in certain embodiments may be 2-5 microns.

The first and second metal layers 22, 30 are preferably constructed from conductive, readily etchable materials, such as copper or copper alloys. In comparison to the etch-resistant layer 16, the first metal layer 22 is relatively thick and in certain embodiments has a thickness of approximately between 50 microns to 100 microns. The second metal layer 30 may be 10-30 microns. By way of example, the tri-metal substrate 14 may be formed by plating the first metal layer 22 onto the top surface of the etch-resistant layer 16.

Figure 2:
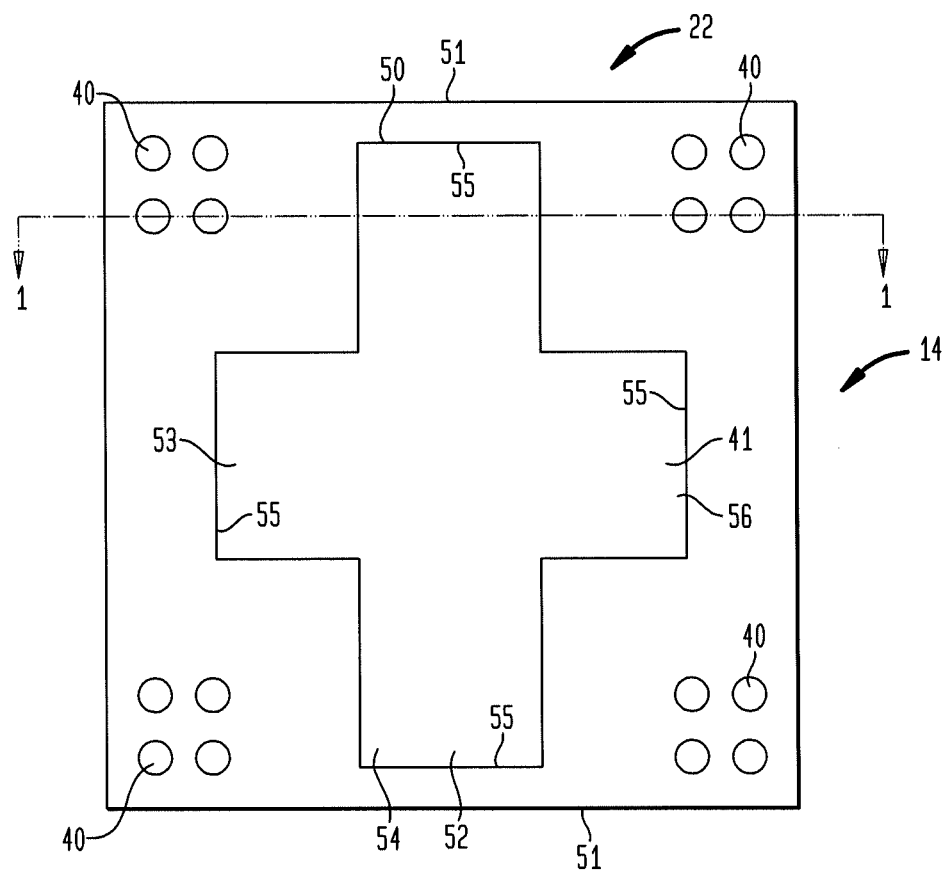
FIG. 2 is a top plan view of a portion of the package element included in the packaged chip in accordance with the preferred embodiment of the invention.

Once the desired tri-metal substrate has been obtained, the first and second metal layers 22, 30 may be etched. With reference to FIG. 2, the first metal layer 22 may be selectively patterned so as to form a plurality of pins 40. In the preferred embodiment, pins 40 are etched at each of the four corners of the first metal layer 22 of the tri-metal substrate 14. During the etching of the first metal layer 22 an island 41 may also be formed.

Figure 2A:
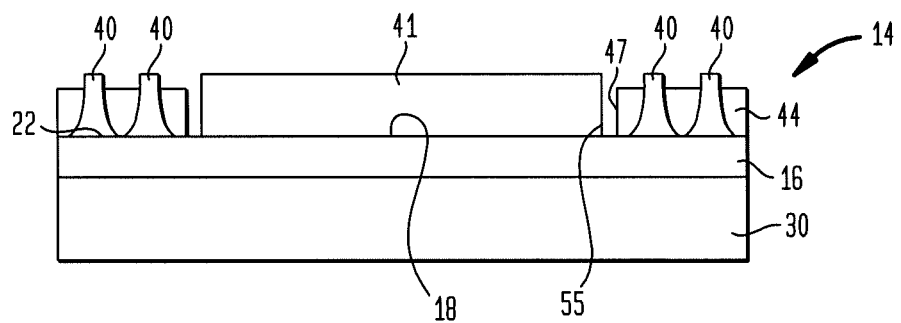
FIG. 2A is a sectional view taken along line 1-1 of FIG. 2.

Referring to FIG. 2A, a cross-sectional view of the tri-metal substrate 14 with an additional polyimide layer is shown. Once the first metal layer 22 has been correctly etched so as to form the various pins 40, dielectric layer 44, such as a polyimide substrate, for example, may be disposed over a remaining portion of the tri-metal substrate. The dielectric layer 44 may include various cutouts such as holes (not shown) that are aligned with the pins 40, a recess 47 (not shown) and island 41 of the first metal layer 22. The dielectric layer 44 may be laminated onto the exposed portions of the upper surface 18 of the etch-resistant layer 16. The dielectric layer 44 may be a single layer, or may be a laminate including several sublayers. The dielectric layer 44 desirably is formed primarily from a polymeric material such as polyimide, BT resin, epoxy or other dielectric polymers, and may include reinforcing fibers as for example, glass fibers.

Referring back to FIG. 2, the island 41, preferably has a cross-shaped configuration, which includes a first appendage 50, a second appendage 53, a third appendage 54 and a fourth appendage 56. The island 41 has an outer edge 55 which extends around the perimeter of the island. The first appendage 50 and second appendage 53 are longer such that they approach an edge 51 of the tri-metal substrate 14 and are closest to the edge 51 as compared to the third and fourth appendages 54, 56. The edge 51 extends about the entire perimeter of the tri-metal substrate 14. The dielectric layer has an opening 47 (see FIG. 2A) of sufficient dimensions to accommodate the island 41.

Figure 3:
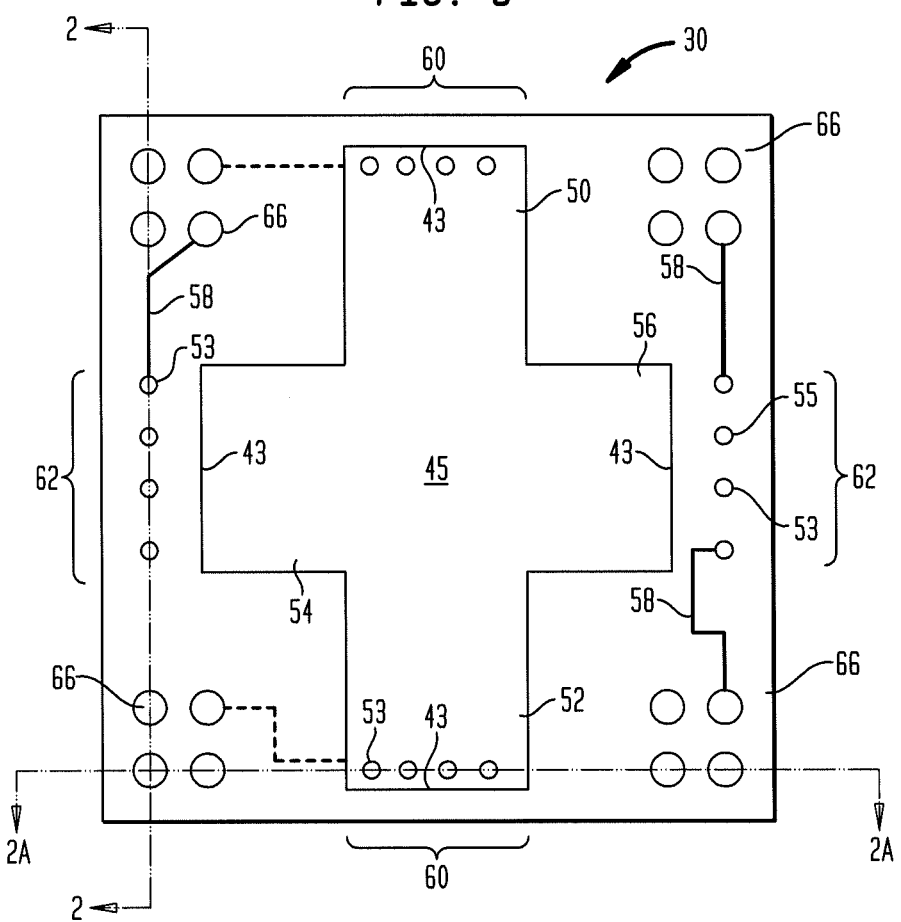
FIG. 3 is a rear plan view of a portion of the package element included in the packaged chip in accordance with an embodiment of the invention.
Figure 3A:
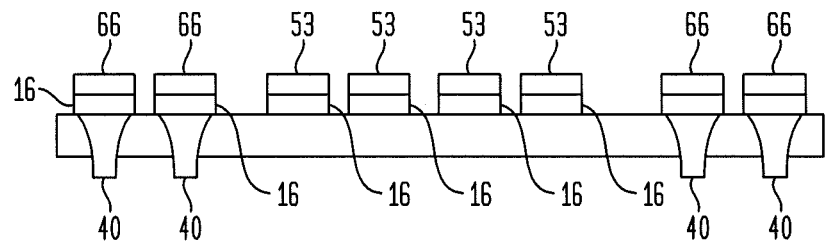
FIG. 3A is a sectional view taken along line 2-2 of FIG. 3.

Next with reference to FIGS. 3 and 3A, the second metal layer 30 of the tri-metal substrate 14 is etched. The second metal layer 30 is etched to form conductive elements such as a first set of chip contacts 60, a second set of chip contacts 62, traces 58, and solder ball pads 66. Contacts 60 are formed by selectively etching a metal layer 30 (FIG. 2A) relative to the etch-resistant layer 16, then removing that layer 16, leaving the underlying island 41 intact. Island 45 remains, the location of its outer edge 43 is shown extending around the perimeter of the island 45. For clarity of illustration, a relatively limited amount of conductive elements are illustrated in the figures. The contacts are preferably formed adjacent the edges of the four appendages 50, 52, 54, and 56 of the island.

The circuitry created using the metal of the second metal layer 30, includes a plurality of contacts 53 created within or adjacent to the first, second, third, and fourth appendages 54, 56 of the cross-shaped island 45, as well as traces 58 that connect the contacts 52 to solder ball pads 66. Traces 58 which connect the pins 40 to contacts 48 (illustrated in hidden view in FIG. 3) may also be constructed. Only a few traces 58 are illustrated in FIG. 4 for ease of illustration, but alternative trace patterns may also be used.

Figure 3B:
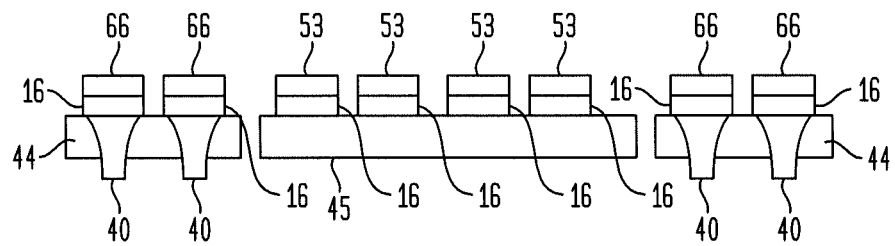
FIG. 3B is a sectional view taken along line 2A-2A of FIG. 3.

Referring to FIGS. 3A and 3B, after the second metal layer 30 has been etched with the desired electrical components, the portion of the etch-resistant layer 16 which is exposed through the second metal layer 30 may be removed, thereby isolating individual electrical pathways as desired.

Figure 4:
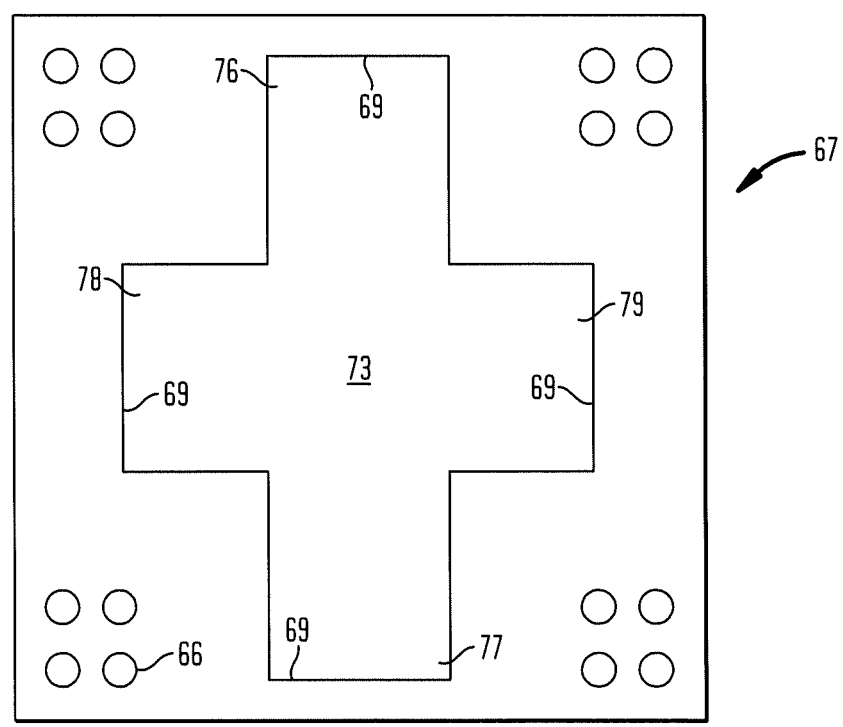
FIG. 4 is a top plan view of a polyimide substrate used in accordance with a preferred embodiment of the invention.

Next, referring to FIG. 4, a second polyimide substrate, such as dielectric element 67, is formed to laminate the remaining portions of the second metal layer 30. The dielectric element 67 is punched in the shape of a cross so that it has a cross-shaped cavity 73 and an inner edge 69 that extends around the perimeter of the cross-shaped cavity 73. Similar to the etched shape of the etched tri-metal substrate 14, the first and second appendages 76, 77 of the cross-shaped cavity 73 are longer than the third and fourth appendages 78, 79. The dielectric element 67 also preferably has cutouts for receiving the solder ball pads 66. Prior to laminating the dielectric element 67 on top of the remaining portions of the second metal layer 30, the dielectric element 67 is preferably rotated 90 degrees with respect to the orientation of the metal layer 30.

Figure 5:
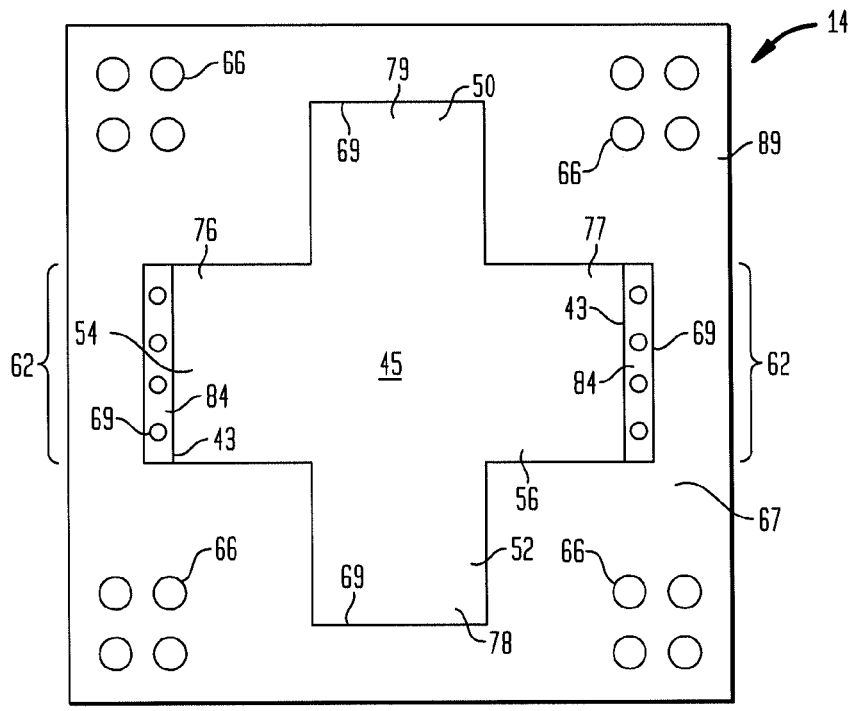
FIG. 5 is a rear plan view of a package element in accordance with the preferred embodiment of the invention.

Referring to FIG. 5, which is a bottom portion 89 of the etched tri-metal substrate 14, the rotated dielectric element 67 should be positioned so that the third and fourth appendages 78, 79 of the dielectric element 67 overlap the contacts (not shown) located on the first and second appendages 50, 52 of the island 45. In this position, the first set of contacts 60 on the first and second appendages 50, 52 are no longer visible from the bottom portion 89 of the tri-metal substrate 14. The first and second appendages 76, 77 of the dielectric element 67 are then positioned adjacent the second set of contacts 62 located on the third and fourth appendages 54, 56 of the island 45. This creates ledges 84 on the third and fourth appendages 54, 56 of the second metal layer. The ledges 84 are formed in the area between the outer edges 43 of the island 45 on the second and fourth appendages 54, 56 of the second metal layer and the inner edges of the first and third appendages 76, 77 of the dielectric element 67.

Figure 5A:
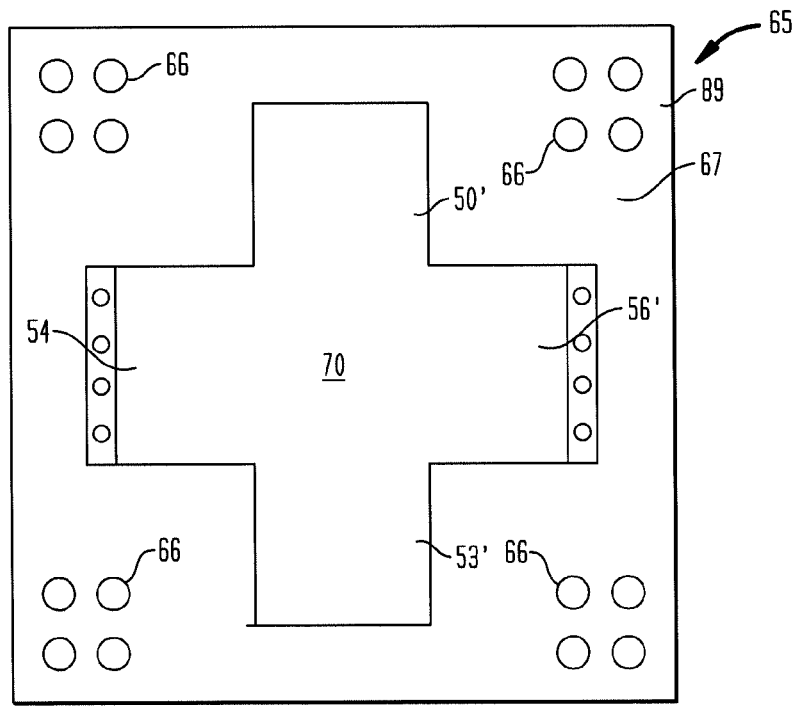
FIG. 5A is a rear plan view of the assembled package element included in the packaged chip in accordance with the embodiment of the present invention.

Referring to FIG. 5A, once the dielectric layer 67 has been laminated onto the etched tri-metal substrate 14, any remaining portions of the cross-shaped island (not shown) including all of the various metal layers may be etched away so as to form a cross-shaped cavity 70 therein. Like the cross-shaped islands 41, 45 of the first and second metal layers, the cross-shaped cavity 70 includes first, second, third, and fourth appendages 50', 53', 54', 56'. Once the island has been etched out of the tri-metal substrate 14, a subassembly 65 is formed, which can be used as part of a microelectronic package.

Figure 6:
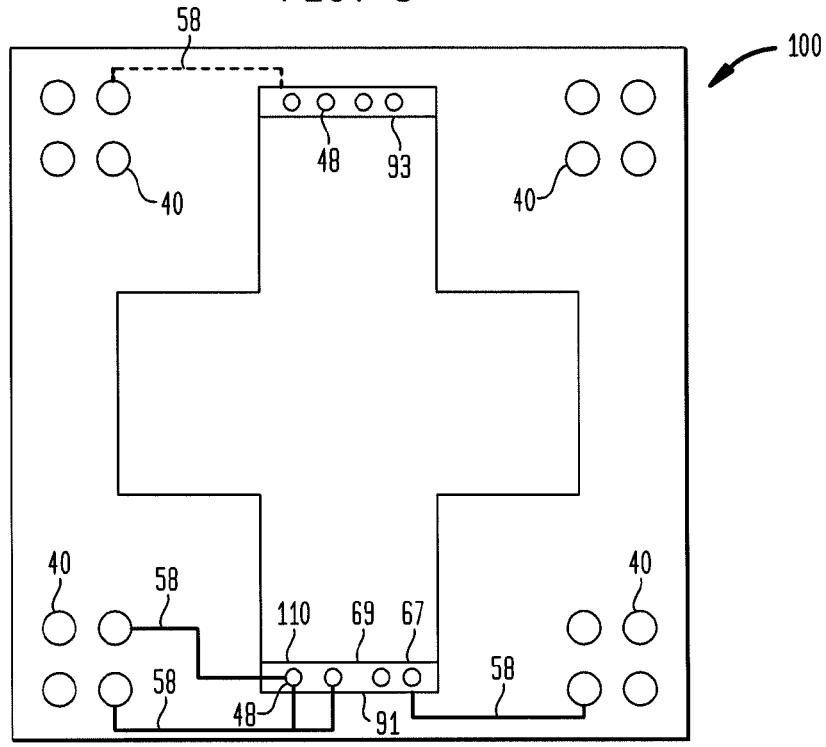
FIG. 6 is a top plan view of the assembled package element included in the packaged chip in accordance with this embodiment of the present invention.

Referring to FIG. 6, there is shown the top portion 88 of the subassembly (the bottom portion 89 being the view shown in FIG. 5A). Here, due to the rotation and placement of the dielectric layer 67 over the second metal layer (not shown), a portion of the dielectric layer 67 extends beyond portions of the inner edge 43 of the first metal layer. A ledge 110 is therefore formed in the area between the inner edge 69 of the dielectric layer 67 overlying the second metal layer (not shown) and the respective inner edge 43 of the first metal layer 22 and overlying dielectric layer 44. The exposed contacts 53 can then be connected to the pins 40 by traces 58 shown in hidden view.

Figure 7:
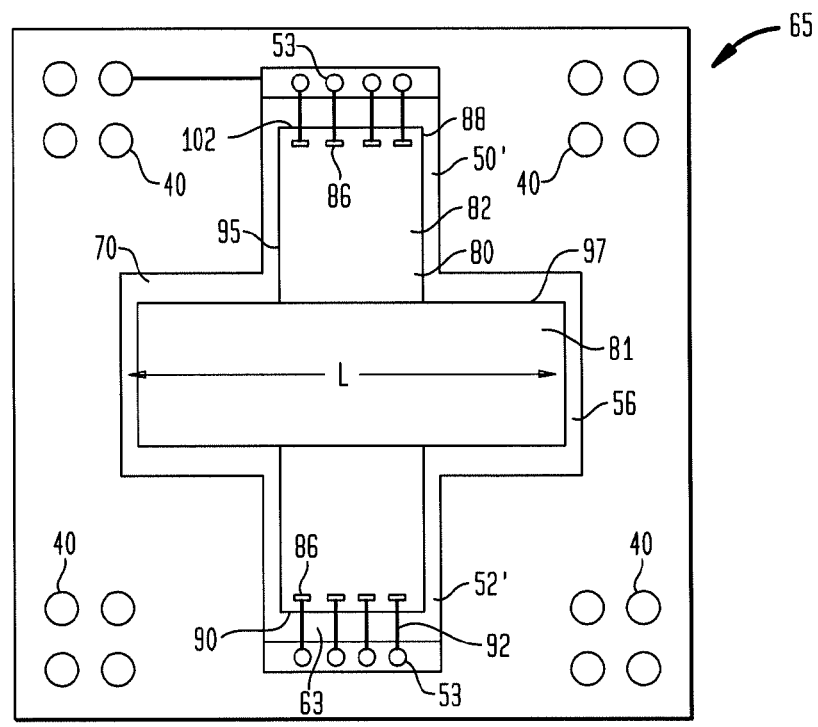
FIG. 7 is a top plan view of the packaged chip in accordance with this embodiment of the present invention.
Figure 8:
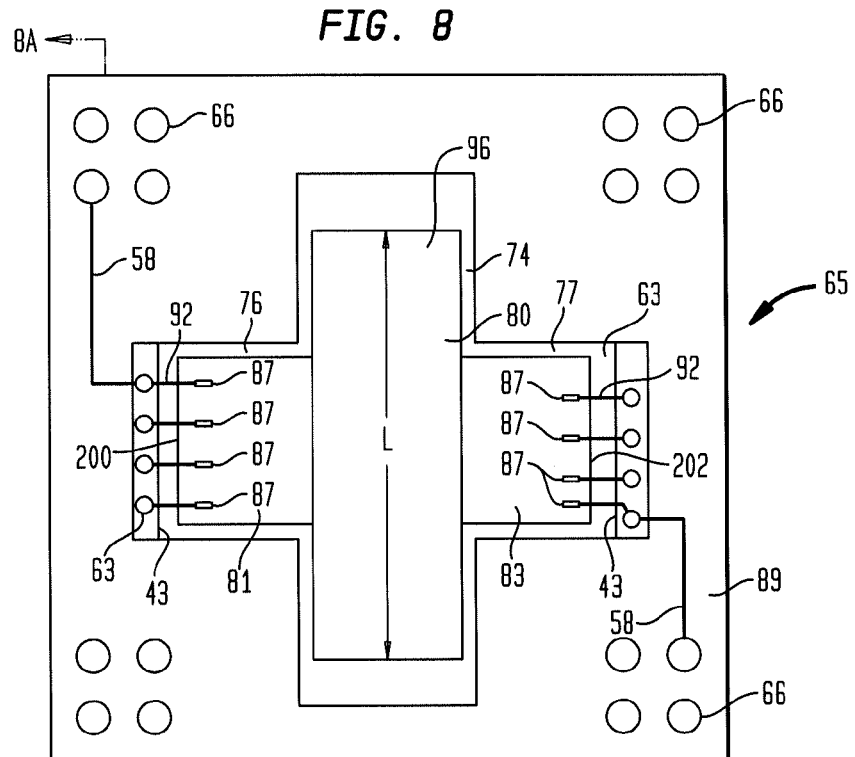
FIG. 8 is a rear plan view of the packaged chip in accordance with this embodiment of the present invention.

As illustrated in FIGS. 7-7A, the subassembly 65 may be coupled to a first microelectronic element 80 and a second microelectronic element 81. The first and second microelectronic elements 80, 81 are bare die as illustrated in FIG. 5, but may also be microelectronic packages and the like. The first microelectronic element 80 includes an active surface or front face 82 and a rear surface 84 remote from the front face 82 as shown in FIG. 8. A plurality of bond pads 86 are exposed on the active surface 82 of the first microelectronic element 80. Similarly, with reference to FIG. 8, the second microelectronic element 81 includes an active surface or front face 83 with a plurality of bond pads 87 exposed thereat as well as a rear surface 85 remote therefrom, as shown in FIG. 7.

The first microelectronic element 80 and the second microelectronic element 81 can be adhered to one another using an adhesive material (not shown). The microelectronic elements 80, 81 are positioned such that their respective active surfaces 82, 83 (see FIG. 8) are facing one another. As shown in FIGS. 7 and 8, the two microelectronic elements 80, 81 are attached in a criss-cross pattern such that the lengths L of both elements 80, 81 are greater than the width of the other element. In addition, when the two microelectronic elements 80, 81 are attached to each other, the bond pads 86, 87 of the respective microelectronic elements remain unencumbered and exposed.

The two microelectronic elements 80, 81 are positioned within cross-shaped cavity 70 such that respective bond pads 86, 87 of the individual microelectronic elements 80, 81 are respectively aligned with either contacts 48 of the top portion 88 or contacts 53 of the bottom portion 89 of the subassembly 65. For instance, a first edge 102 of first microelectronic element 80 of which bond pads 86 are adjacent thereto is positioned within a first appendage 50' of cross-shaped cavity 70. A second edge 90 of the first microelectronic element 80 on which a second set of bond pads are disposed is positioned within second appendage 52', thereby positioning a second set of bond pads 86 on the first microelectronic element 80 adjacent to a second set of contacts 53 of subassembly 65. Similarly, first and second edges 200, 202 of the second microelectronic element 81 are positioned within the first and second appendages 76, 77 of the cross-shaped cavity 70 as shown in FIG. 8.

Referring to FIGS. 7 and 8, each of the respective bond pads 86, 87 may be electrically connected to adjacent contacts 48, 53 using bond wires 92. With aid from the bond wires 92, the respective microelectronic elements 80, 81 are now electrically connected to pins 40 via contacts 48 or 52 and traces 58. The first and second microelectronic elements 80, 81 are spaced laterally from the respective edges of the subassembly 65, such that there may be a gap 63 between the edges 43 of the subassembly 65 and the edges 200, 202 of the microelectronic element 87.

Figure 8A:
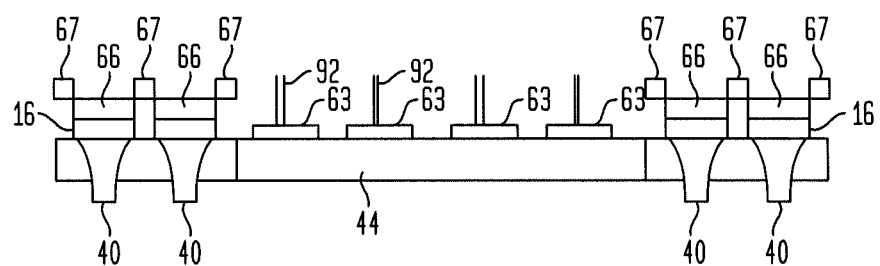
FIG. 8A is a sectional view taken along line 8A-8A of FIG. 8.

Referring to FIG. 8A, a cross-sectional view of FIG. 8 is shown. The dielectric layer 67 is shown with openings to provide access to the solder pads 66. Bond wires 92, which connect the contacts 53 to the bond pads 86 of the first microelectronic element 80, are also shown.

The entire assembly may now be encapsulated in an encapsulant material 94 surrounding the bond wires and unit and further securing the bond wires in place. The encapsulant material 94 should preferably not cover the surfaces of the contacts 67, so that these surfaces remain exposed for mounting. Of course, the pins 40 remain exposed such that the pins 40 may be electrically connected to a circuit panel or the like in methods known to those in the art. This overall arrangement helps to provide for a thin microelectronic element package, as the microelectronic element is capable of being in the same plane as the subassembly, as opposed to one of its surface being in contact with the top surface of the subassembly.

Figure 8B:
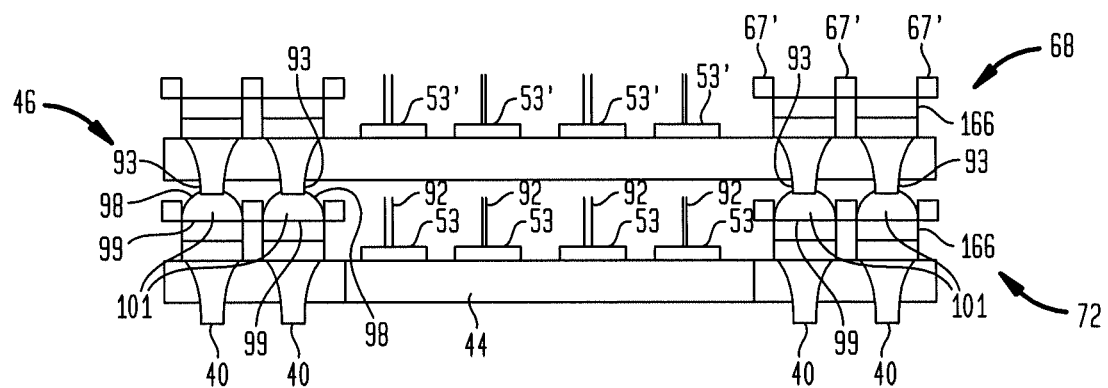
FIG. 8B is a sectional view of a stacked assembly in accordance with the present invention.

The packaged subassembly is capable of being stacked with other subassemblies. Referring to FIG. 8B, a stacked assembly 46 includes first and second microelectronic packages 68, 72, such as those shown in FIGS. 1-8. The first microelectronic package 68 is identical to the second microelectronic package 72, and includes pins 93, contacts 53', chip carrier 66', and a dielectric layer 67'. The first microelectronic package 68 is electrically connected to the second microelectronic package 72 via pins 93 on the first microelectronic package 68 which pass through the openings 98 on the second microelectronic package 72. Masses of solder 101 or other conductive material connect pins 93 to the solder ball pads 99 on the second microelectronic package 72. Additional microelectronic packages may also be added to the opening on the second stacked package.

Figure 9:
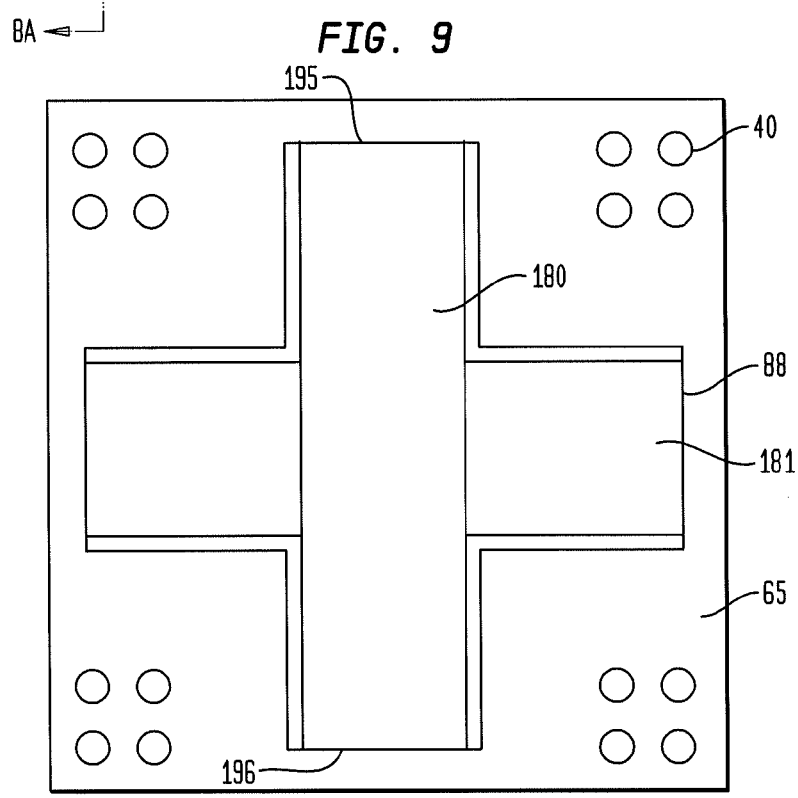
FIG. 9 is a rear plan view of the packaged chip in accordance with a variation of the embodiment shown in FIG. 7.
Figure 10:
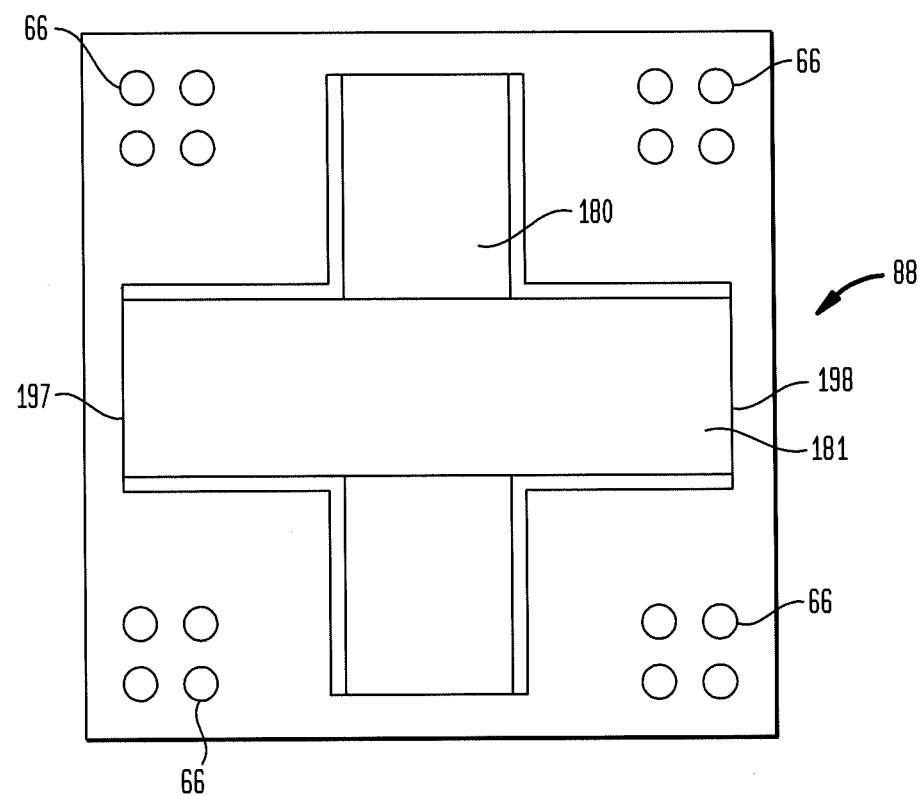
FIG. 10 is a top plan view of the packaged chip in accordance with a variation of the embodiment shown in FIG. 8.

In a variation of the above-described embodiment, the microelectronic elements may be positioned in a "flip-chip" orientation such that bond wires are not required. For instance, with reference to FIGS. 9 and 10, first and second microelectronic elements 180, 181 are positioned within the cross-shaped cavity 170 of subassembly 65. Like the previous embodiments, the first and second microelectronic elements have outer edges (not shown). In contrast to the previous embodiment, rather than the respective outer edges 195, 196, 197, 198 of the first and second microelectronic elements being positioned adjacent to contacts (not shown in the figure) of subassembly 65, the respective edges 195, 196, 197, 198 of the first and second microelectronic elements 180, 181 directly overlie the contacts 48, 53 (see FIGS. 7, 8). This enables the microelectronic elements to be directly connected to a respective contact using a mass (not shown) of conductive materials such as solder or the like. As before, in order to complete the microelectronic package, the entire assembly may be coated with an encapsulant material (not shown) to thereby protect all of the electrical connections.

It should be understood that the cross-shaped cavity (see FIG. 1-7) or 170 (see FIGS. 8-9) is not limited to the shape of a cross, and that any size and shape of cavity can be created to accommodate a specific configuration. For example, instead of a cross-shaped cavity, the cavity may be in the shape of a rectangle.

In another aspect of the present invention, as an alternative to the use of a tri-metal substrate for microelectronic packaging, two single-metal substrates can be adhered together to create a subassembly with a cavity for receiving a microelectronic element or the like.

Referring to FIG. 11, the first single metal substrate 300 is shown having a dielectric layer 302 and metal layer 310. The metal layer 310 is preferably comprised of a readily etchable material, such as copper or copper alloys. The metal layer 310 has an upper surface 306 and a lower surface 314. The lower surface 314 of the metal layer 310 overlies the upper surface 306 of the dielectric layer 302.

Figure 12A:
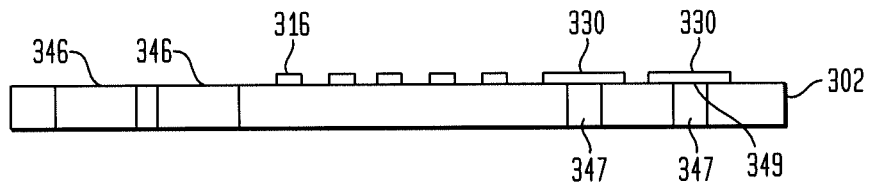
FIG. 12A is a sectional view taken along line 3-3 of FIG. 12.

As shown in FIGS. 12 and 12A, the metal layer 310 of the first single metal substrate 300 is then etched to form a cavity, such as the rectangular-shaped cavity 318 whose length L is greater than its width W. The first and second edges 320, 322 of the rectangular-shaped cavity 318 extend closer to the outer edge 328 of the first single metal substrate 300 than the third and fourth edges 324, 326. The outer edge 328 extends around the perimeter of the first single metal substrate 300, such that an area is created between the third and fourth edges 324, 326 of the rectangular-shaped cavity 318 and outer edge 328 wherein electronic circuitry may also be etched.

Figure 12B:
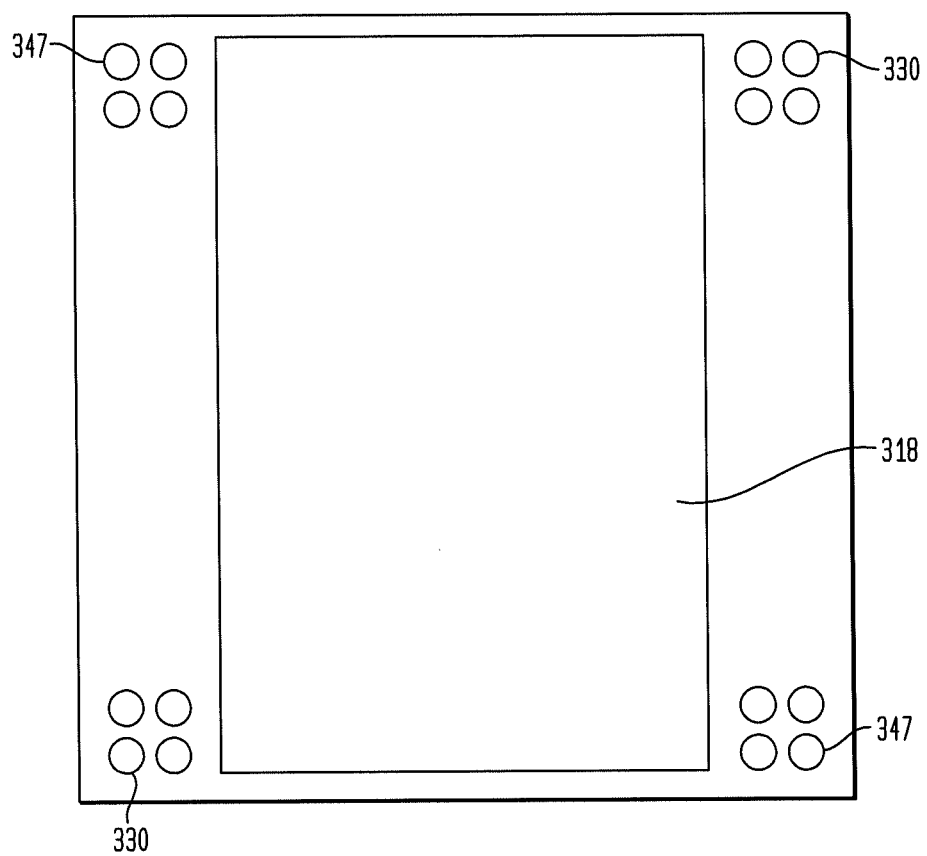
FIG. 12B is a rear plan view of a first portion of the package element included in the packaged chip in accordance with this alternative embodiment of the invention.

The metal layer 310 is etched and patterned such that contacts 316, solder ball pads 330 and traces 239 extending between the contacts 316 and traces 239 are formed. In the embodiment shown, not all four corners of the metal layer 310 of the first single metal substrate 300 are etched with solder ball pads 330. Solder ball pads 330 are only etched on the first and third corners 336 and 340, whereas recesses or holes 346 are located at the second and fourth corners 338, 342. As best shown in FIGS. 12A and 12B, holes or openings 347 are punched through the dielectric layer 302 and contact the underside 349 of the solder ball pad 330. This arrangement makes the design and process of attaching stacked packaging much easier.

Figure 13:
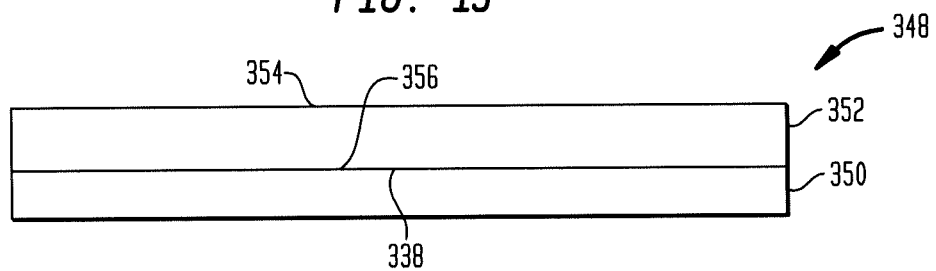
FIG. 13 is a sectional view of a first portion of a package element included in the packaged chip in accordance with an alternative embodiment of the invention.

Turning next to FIG. 13, the second single metal substrate 348 of the alternate package is shown, which, like the first single metal substrate 300, has a dielectric layer 350 and metal layer 352. The metal layer 352 is also preferably comprised of a readily etchable material, such as copper or copper alloys. The metal layer 352 has an upper surface 354 and a lower surface 356. The lower surface 356 of the metal layer 352 overlies the upper surface 358 of the dielectric layer 350.

Figure 14:
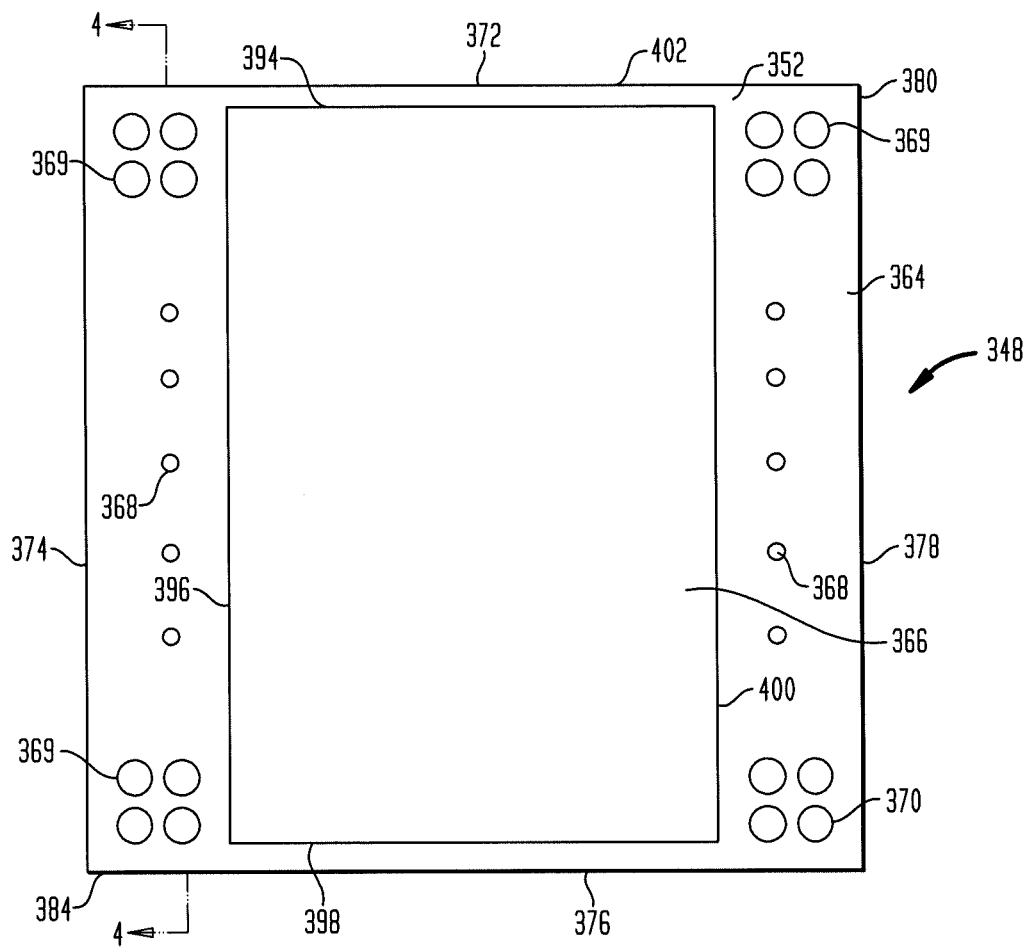
FIG. 14 is a top plan view of the first portion of the package element included in the packaged chip in accordance with this alternative embodiment of the invention.
Figure 14A:
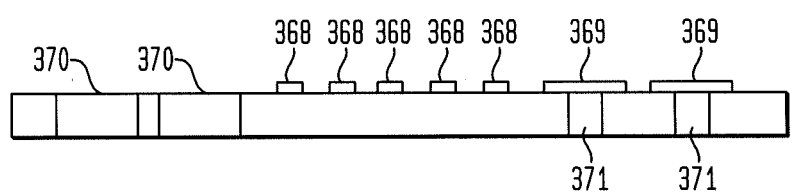
FIG. 14A is a sectional view taken along line 4-4 of FIG. 14.

Referring to FIGS. 14 and 14A, the top surface 364 of the second single metal substrate 348 is shown having first, second, third, and fourth sides 372, 374, 376, 378. The metal layer 352 is etched so that there is a rectangular-shaped cavity 366 and contacts 368 located along the third and fourth sides 324, 378 of the second single metal substrate 348 and adjacent the rectangular-shaped cavity 366. Like the first single metal substrate 300, there are solder ball pads 369 located at the first and third corners 380, 384 and recesses 370 located at the second and fourth corners 382, 386 of the second single metal substrate 348. Additionally, the first and third edges 394, 398 of the rectangular-shaped cavity 366 extend closer to the outer edge 402 of the second single metal substrate 348 than the second and fourth edges 396, 400. This provides an area between the third and fourth edges 398, 400 and outer edge 402 of the second single metal substrate 348 wherein electronic circuitry may also be etched.

Figure 14B:
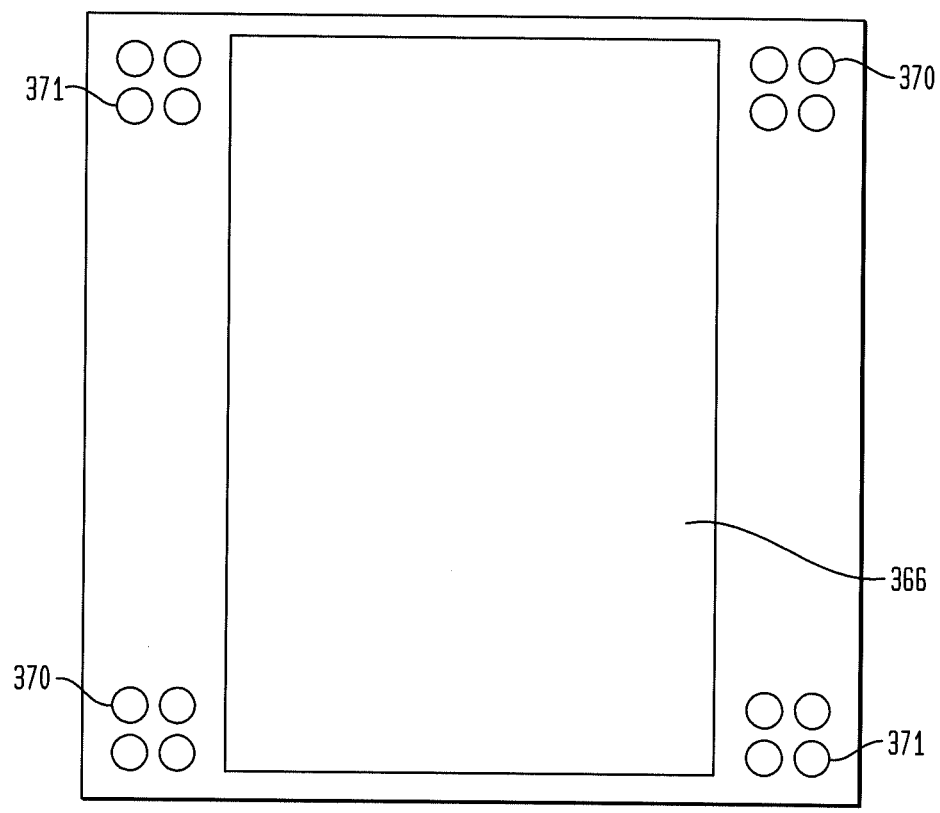
FIG. 14B is a rear plan view of a second portion of the package element included in the packaged chip in accordance with this alternative embodiment of the invention.

Referring to FIGS. 14A and 14B, a sectional and rear plan view of the second single metal substrate is shown. In this view, the holes or recesses 370 are shown, as well as holes or openings 371 which provide a passageway for electrical connection to the solder ball pads 369.

Once the first and second single metal substrates 300, 348 have been etched, they can be adhered together to create a subassembly with a cavity for receiving a microelectronic element. Referring to FIG. 15, the components of the subassembly prior to stacking are shown: the top face 301 of the first single metal substrate 300, an adhesive layer 390, and the bottom face 392 of the second single metal substrate 348. To create the subassembly, an adhesive layer 390 overlies the top face 301 of the first single metal substrate 300 and is positioned below the top face of the second single metal substrate 348. The adhesive layer 390 is preferably punched to include various cutouts, such as holes or recesses (not shown) that are aligned with the solder ball pads 330 and contacts 368. If the adhesive is not pre-punched, such as shown in FIG. 15, the adhesive must be removed from the solder ball pads 330. The adhesive layer preferably extends across the entire rectangular-shaped cavity 366 so as to also provide a means for adhering microelectronic elements together. As shown in FIG. 15, prior to adhering the second single metal substrate 348 to the first single metal substrate 300, the second single metal substrate 348 is rotated 90 degrees, so that the length L of the rectangular-shaped cavity 366 is in a horizontal position, as opposed to the length L of the first single metal substrate, which is in a vertical position.

Figure 15A:
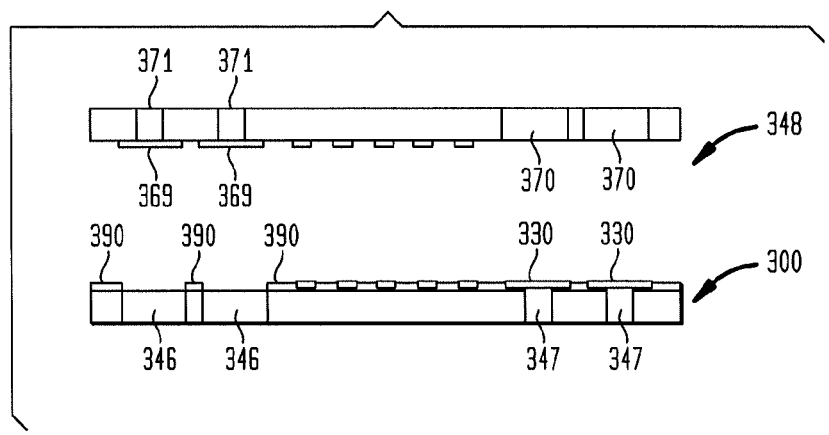
FIG. 15A is a sectional view of the components of the package element included in the packaged chip taken in along lines 5-5 and 6-6 of FIG. 15 in accordance with this alternative embodiment of the invention just prior to their assembly.

Referring to FIG. 15A, an exploded cross-sectional view is shown of the first single metal substrate 300 with the adhesive layer 390, and the bottom face 392 of the second single metal substrate 348 prior to adhering the two substrates together. As shown, the solder ball pads 330 of the first single metal substrate 300 are aligned with the holes or recesses 370 on the second single metal substrate 348. Similarly, the solder ball pads 369 on the second single metal substrate 348 are aligned with the holes or recesses 346 of the first single metal substrate 300.

Figure 16:
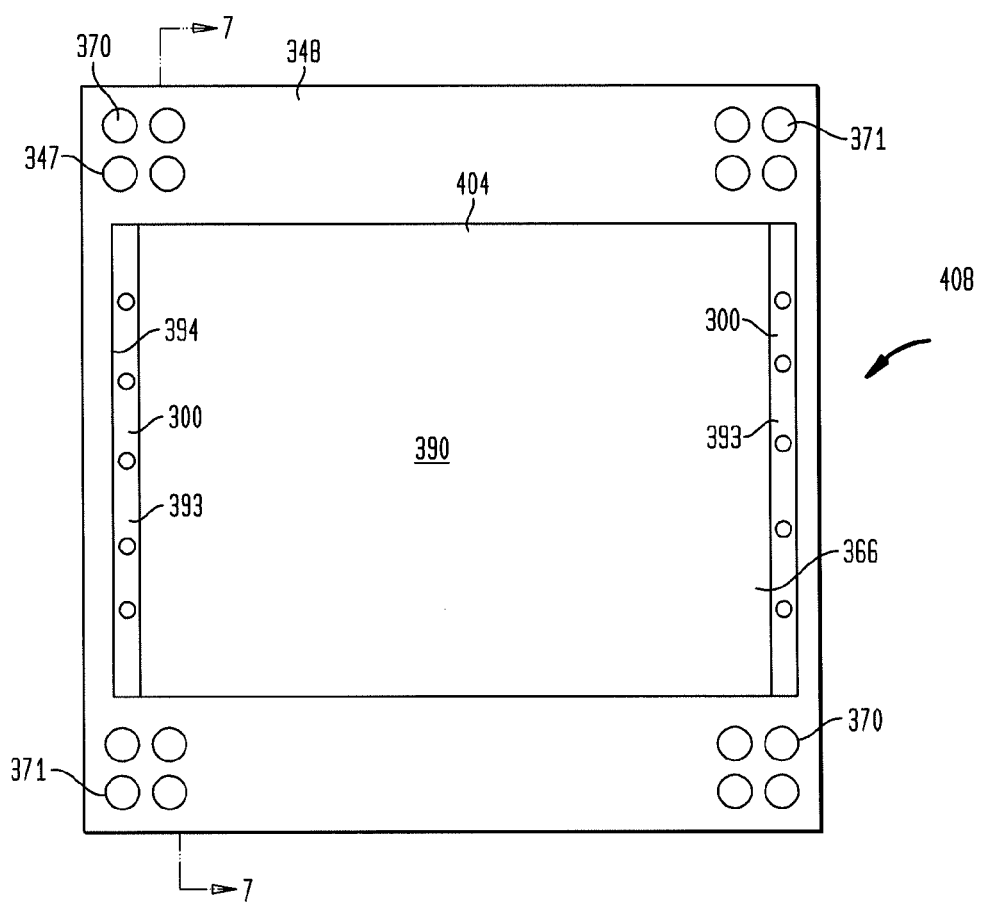
FIG. 16 is a top view of the assembled package element included in the packaged chip in accordance with the alternative embodiment of the invention just prior to their assembly.

The top surface 404 of the completed subassembly 408 is shown in FIG. 16. In this embodiment, the second single metal substrate 348 overlaps the first single metal substrate 300 so that the recesses 370 in the second single metal substrate 348 overlie the solder ball pads 330 on the first single metal substrate 300 and vice versa. Additionally, ledges 393 are also formed in the area between the inner edge 325 of the rectangular-shaped cavity of the first single metal substrate 300 and the inner edges 394, 398 of the second single metal substrate 348. The adhesive layer 390 is also preferably visible through the rectangular-shaped cavity 366.

Figure 16A:
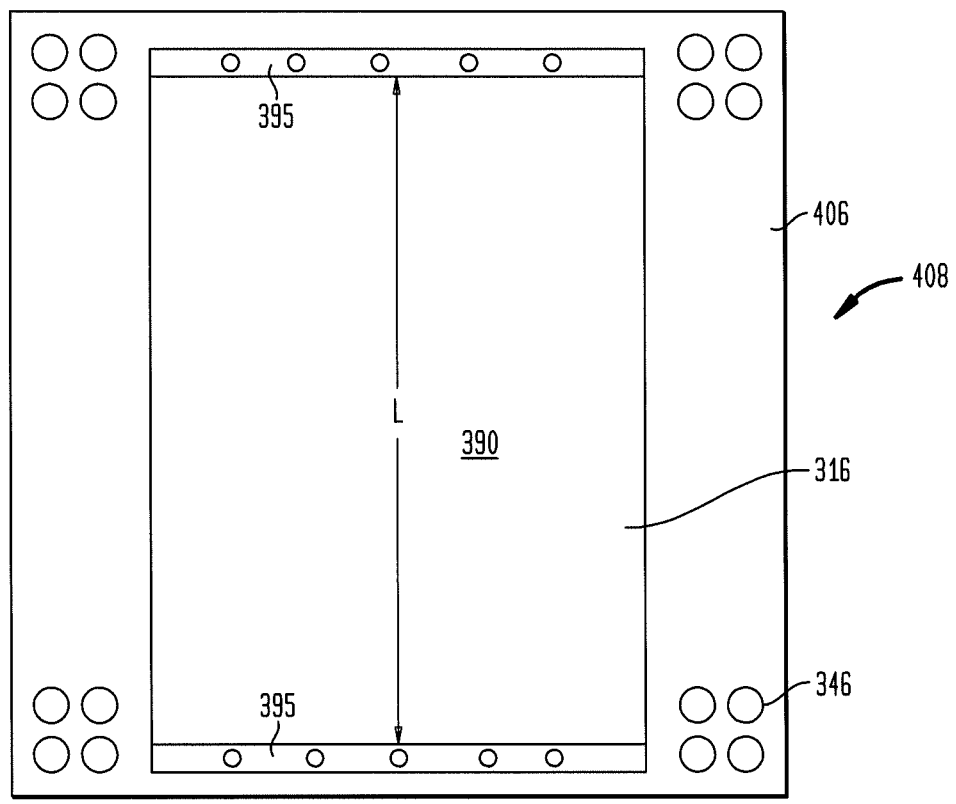
FIG. 16A is a rear view of the assembled package element included in the packaged chip in accordance with the alternative embodiment of the invention just prior to their assembly.

Referring to FIG. 16A, the bottom surface 406 of the subassembly 408 is shown. The bottom surface 406 is virtually identical to the top surface 408, the only difference being that the rectangular-shaped cavity 366 has a length L that is located in the vertical direction, as opposed to the rectangular-shaped cavity 318 of the first single metal substrate 300, whose length L (see FIG. 16) lies in the horizontal direction. Thus, the holes or recesses 346 in the first substrate overlap the solder ball pads 373 of the second substrate.

Figure 17:
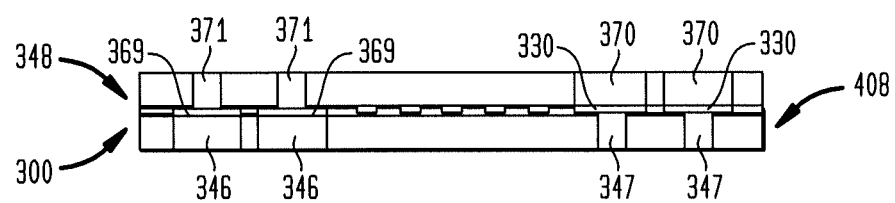
FIG. 17 is a sectional view taken along lines 7-7 of FIG. 16.

Referring to FIG. 17, a cross-sectional view of the subassembly 408 is shown. When the first and second single metal substrates 300, 348 are attached together, the solder ball pads 330 of the first single metal substrate 300 are directly below the holes or recesses 370 on the second single metal substrate 348. Similarly, the solder ball pads 369 on the second single metal substrate 348 are directly above the holes or recesses 346 of the first single metal substrate 300. Holes or openings 371, 347 are also shown directly above or below the solder ball pads 369, 373 of the first and second single metal substrates 300, 348. This arrangement provides for electrical connection on both sides of the substrate and at all four corners of the subassembly 408. Additionally, it only requires that circuits be etched onto two corners of the respective single metal substrate, as opposed to all four corners of the substrate.

Figure 18:
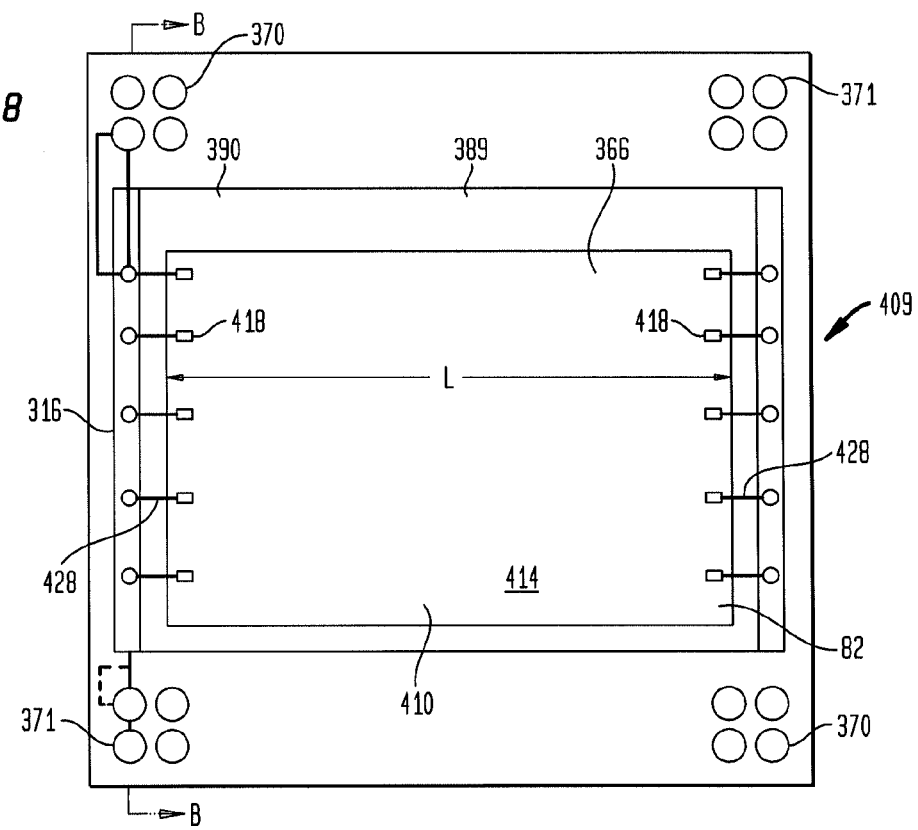
FIG. 18 is a top plan view of a packaged chip in accordance with this alternative embodiment of the present invention.
Figure 18A:
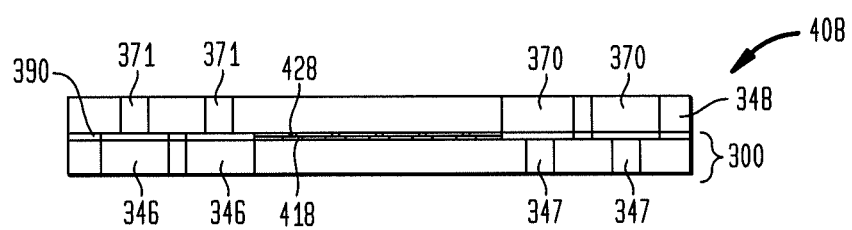
FIG. 18A is a sectional view taken along line B-B of FIG. 18.

As illustrated in FIGS. 18 and 18A, the subassembly 408 may be coupled to a first microelectronic element 410 and a second microelectronic element 412. The first and second microelectronic elements 410, 412 are bare die, but may also be microelectronic packages and the like. As in the prior embodiments, the first microelectronic element 410 includes an active surface 414 and a rear surface (not shown). A plurality of bond pads 418 are exposed on the active surface 414 of the first microelectronic element 410. Similarly, with reference to FIG. 19, the second microelectronic element 412 includes an active surface 420 with a plurality of bond pads 422 exposed thereat, as well as a rear surface (not shown).

Figure 19:
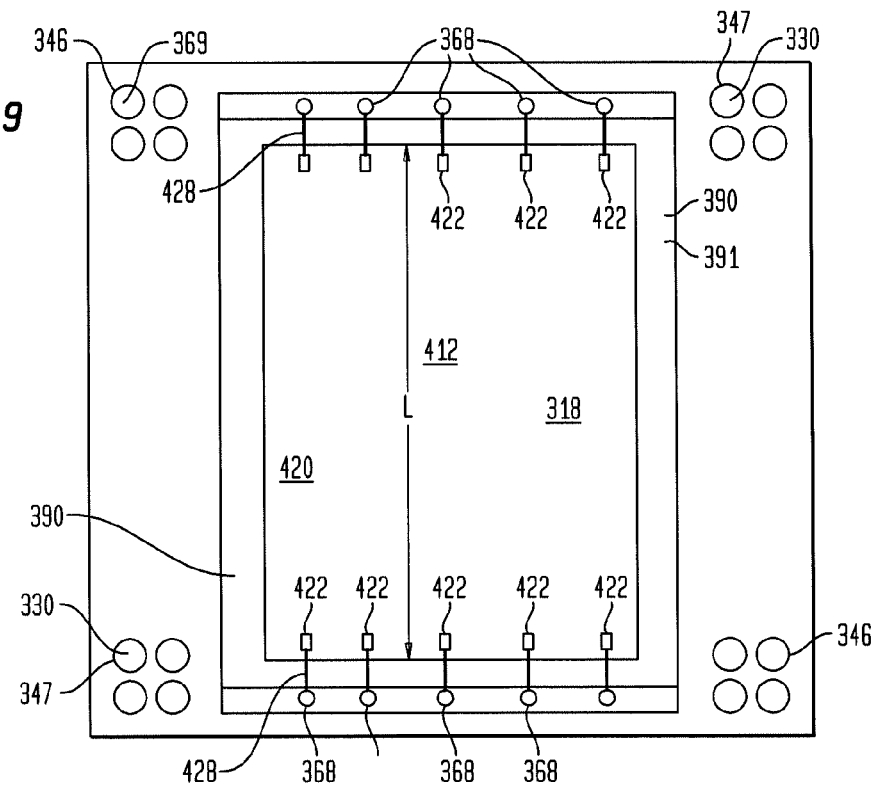
FIG. 19 is a rear plan view of a packaged chip in accordance with this alternative embodiment of the present invention.

The first microelectronic element 410 is placed onto the top side 389 of the adhesive layer 390 and the second microelectronic element 412 is adhered to the opposing or bottom surface 391 of the adhesive layer 390. The microelectronic elements 410, 412 are positioned such that their respective active surfaces 414, 420 are brought proximate to one another. As shown in FIGS. 18 and 19, the two microelectronic elements 410, 412 are attached in a criss-cross pattern such that the length L of both microelectronic elements 410, 412 are greater than the width of the other element. In addition, as the two microelectronic elements 410, 412 are attached to each other, the bond pads 418, 422 of the respective microelectronic elements remain unencumbered and exposed.

As in previous embodiments, the two microelectronic elements 410, 412 are positioned within the rectangular-shaped cavities 318, 366 such that respective bond pads 418, 422 of the individual microelectronic elements 410, 412 are aligned with contact 316 of the top surface 404 or contacts 368 of the bottom surface 406 of the subassembly 408.

Each of the bond pads 418, 422 may also be electrically connected to respective adjacent contacts 316, 368 using bond wires 424. With aid from the bond wires 424, the respective microelectronic elements 80, 81 are now electrically connected to solder ball pads 330, 369 via contacts 316, 368 and traces 427. The entire subassembly may now be encapsulated in an encapsulant material 426 to thereby protect the various active surfaces and electrical components.

The cavities of first and second single metal substrates 300, 348 are not limited in shape or size to those examples shown in the drawings. The cavity may be in the shape of a cross, or any desired shape which is suitable for a desired package. For example, as shown in FIG. 20, first and second single metal substrates 428', 432' and an adhesive layer 430' are the components of a subassembly 434. Subassembly 434 is identical to the previous example (FIGS. 13 to 19), except for the shape of the cavity 448, which is cross-shaped. As in the previous example, the second single metal substrate 432' is rotated 90 degrees so that when the top surface 308' of the first metal layer 428' and top face (not shown) of the second metal layer are adhered together by the adhesive layer 430', the contacts 446' located on the first and third portions 436', 440' of the cross-shaped cavity 448 are overlapped by the second single metal substrate 432' so that only the contacts 446' adjacent the second and fourth portions 438', 442' of the cross-shaped cavity 448' are visible.

In yet another aspect of the present invention, a subassembly is provided with a metal shelf located within a substrate cavity so as to provide an additional means for supporting the microelectronic element or the like within the subassembly.

Figure 21:
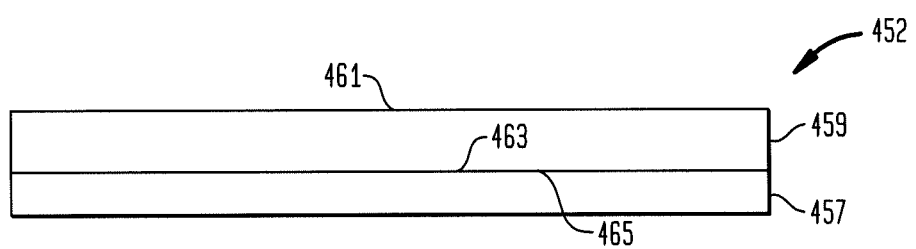

Referring to FIGS. 21-21D, a subassembly includes first and second single metal substrates 452, 482. Turning to FIG. 21, a first single metal substrate 452 is shown according to this embodiment of the invention. The first single metal substrate 452 is virtually identical in construction to the single metal substrates in FIGS. 13-19, the only difference being that, instead of a rectangular-shaped cavity, the primary shape of the cavity in the first metal substrate 452 is a cross.

The first single metal substrate 452 has a dielectric layer 457 and metal layer 459. The metal layer 459 is preferably comprised of a readily etchable material, such as copper or copper alloys. The metal layer 459 has an upper surface 461 and a lower surface 463. The lower surface 463 of the metal layer 459 overlies the upper surface 465 of the dielectric layer 457, which is preferably comprised of materials previously discussed herein.

The metal layer 459 of the first single metal substrate 452 is etched and patterned such that, as shown in FIGS. 21A, 21B, contacts 467, solder ball pads 455 and traces 469, which extend between the contacts 467 and solder ball pads 455 are formed. In the embodiment shown, and as in the previous example, not all four corners of the metal layer 459 of the first metal substrate 452 are etched with solder ball pads 455.

Solder ball pads 455 are only etched on the first and third corners 470, 474, whereas recesses or holes 478 are located at the second and fourth corners 472, 476. Holes or openings 492 (see FIGS. 21B and 21D) are formed through the dielectric layer 457 directly below the solder ball pads 455.

A cross-shaped cavity 480 is etched and then punched out from the metal layer 459 and dielectric layer of the first metal substrate 452. The cross-shaped cavity 480 has first, second, third, and fourth appendages 481, 483, 485, 487. The inner edge 489 of the second and fourth appendages 483, 487 of the cross-shaped cavity 480 extend closer to the outer edge 479 of the first metal substrate 452 than the edges 493 of the first and third appendages 481, 485. This arrangement provides for an area between the edges 493 of the first and third appendages 481, 485 of the cross-shaped cavity 480 and outer edge 479 of the first metal substrate wherein electronic circuitry may also be etched.

Figure 22:
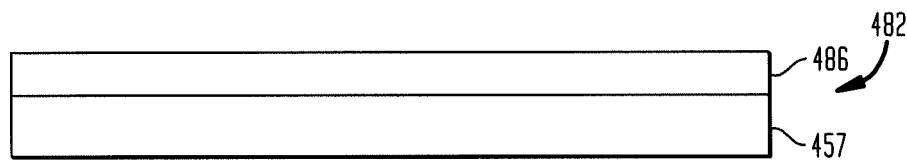

Referring to FIGS. 22-22D, a second metal substrate 482 is shown. Like the first metal substrate 452, the second metal substrate 482 is comprised of a dielectric layer 457 and a metal layer 486 that is etched with solder ball pads 488 and contacts 490. Holes or openings 495 are also formed through the dielectric layer 484 directly below the solder ball pads 488. Additionally, holes 509 extend through the metal layer 486 and dielectric layer 457. A portion of the dielectric layer 484 is punched out to create a cross-shaped cavity 494 (see FIG. 22B) within the dielectric layer 547. The cross-shaped cavity 494 has first, second, third, and fourth appendages 497, 499, 501, 503. Contacts 490, and traces 507 connecting the contacts 490 to the solder ball pads 488 are located adjacent the second and fourth appendages 499, 503 of the cross-shaped cavity 494.

The cross-shaped cavity 494 in the dielectric layer 547 does not extend through the metal layer 486. Referring to FIG. 22A, the metal layer 486 is etched, so that a portion of the metal layer or metal shelf 504 remains on the same or similar plane as the solder ball pads 488 and is adjacent the central portion 505 of the cross-shaped cavity 494 of the dielectric layer 484. This configuration allows for first, second, third, and fourth cavities 496, 498, 500, 501 that extend through both the dielectric layer 457 and metal layer 486.

As shown in FIG. 22A, the metal shelf 504 is adjacent the solder ball pads 488, which are located at the second and fourth corners 537, 539 of the metal layer 459. The first, second, third and fourth corners 506, 508, 510, 512 of the metal shelf 504 lie on top of the portion of the first, second, third and fourth inner corners 514, 516, 518, 520 of the dielectric layer 457 (see FIG. 22B) adjacent the cross-shaped cavity 494 of the dielectric layer 547.

Once the first and second metal substrates 452, 482 have been prepared, they can be adhered together to create a subassembly 450 with a partial cross-shaped cavity for receiving a microelectronic element 526 and a metal shelf 504 for supporting microelectronic elements (not shown). Referring to FIG. 23, the components of the subassembly prior to stacking are shown in plan view: the top face 530 of the second metal substrate 482, an adhesive layer 532, and the bottom face 534 of the first metal substrate 452. To create the subassembly 450, the adhesive layer 532 is placed between top face 530 of the second metal substrate 482 and the top face (not shown) of the first metal substrate 452. As shown in FIG. 23, prior to adhering the second metal substrate 482 to the first metal substrate 452, the first metal substrate 452 is rotated 90 degrees relative to the second metal substrate 482, so that the second and fourth appendages 483, 487 of the first metal substrate 452 will overlap the contacts 467 located on the first and third appendages 497, 501 of the cross-shaped cavity 480.

In this position, the contacts 467 on the first and third appendages 497, 501 of the second metal substrate 482 are no longer visible from the top plan view of the first metal substrate 452.

The first and third appendages 481, 485 of the first metal substrate 452 are then positioned adjacent the second set of contacts 462, which are adjacent the second and fourth appendages 499, 503 of the cross-shaped cavity. As in the previously discussed embodiments, this arrangement creates ledges 511 on the third and fourth appendages 78, 79, wherein the contacts 467 are located.

Figure 23A:
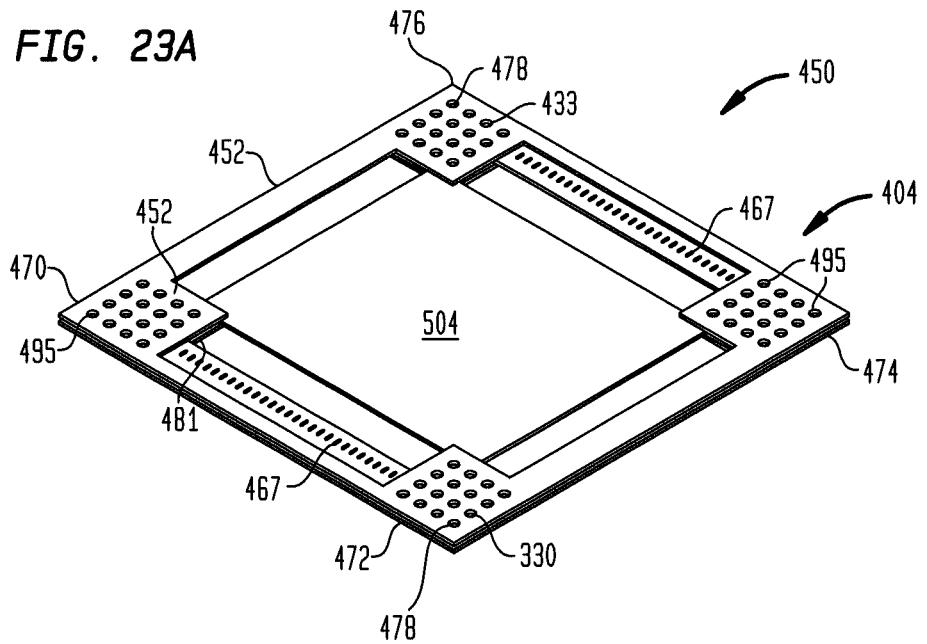
FIGS. 23A-B are perspective views of the assembled first and second portions in accordance with this alternative embodiment of the present invention.

The top surface 404 of the completed subassembly 408 is shown in FIG. 23A. In this embodiment, the first metal substrate 452 (the substrate without the metal shelf) lies on top of the second metal substrate 482 so that the recesses or holes 478 on the second and fourth corners 472, 476 of the first metal substrate 452 overlie the solder ball pads 330 located on the first and third corners (see FIG. 22A) of the second metal substrate 482. Additionally, holes or openings 495 directly below each of the solder ball pads 455 on the first metal substrate 452 are exposed in this view. The metal shelf 504 lies between the first and second metal substrates 452, 482.

Figure 23B:
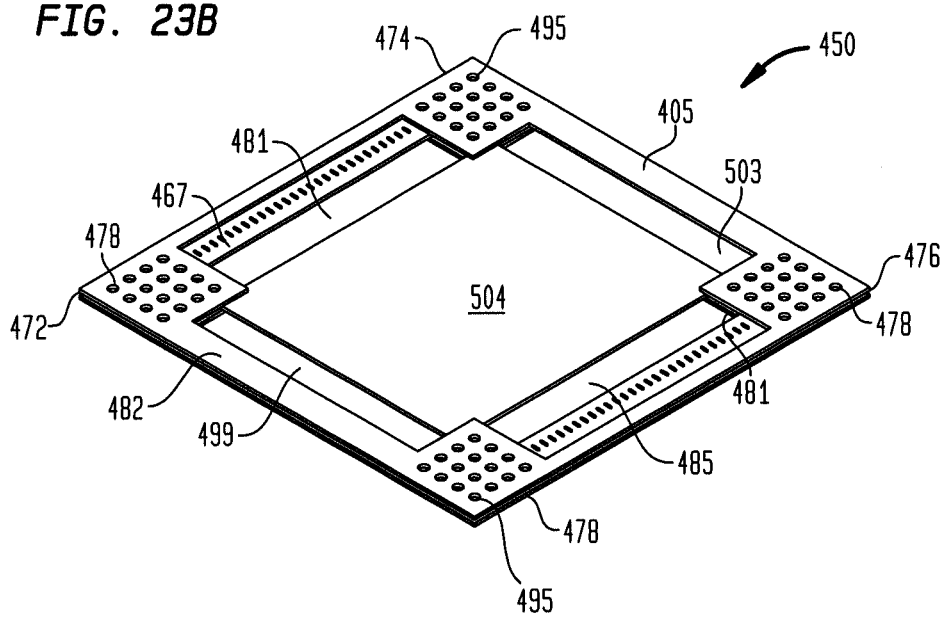

Referring to FIG. 23B, the bottom surface 405 of the subassembly 450 is shown. The bottom surface is virtually identical to the top surface 408, the only difference being that the contacts 467 are exposed adjacent the first and third appendages 481, 485 of the first metal substrate 452, as opposed to the second and fourth appendages 499, 503 of the second metal substrate 482. Thus, in the bottom view, the recesses 478 in the second metal substrate 482 overlap the solder ball pads 455 of the first metal substrate 452. Furthermore, holes or openings 478 leading to the bond pads 478 of the second metal substrate 482 are exposed.

Figure 24:
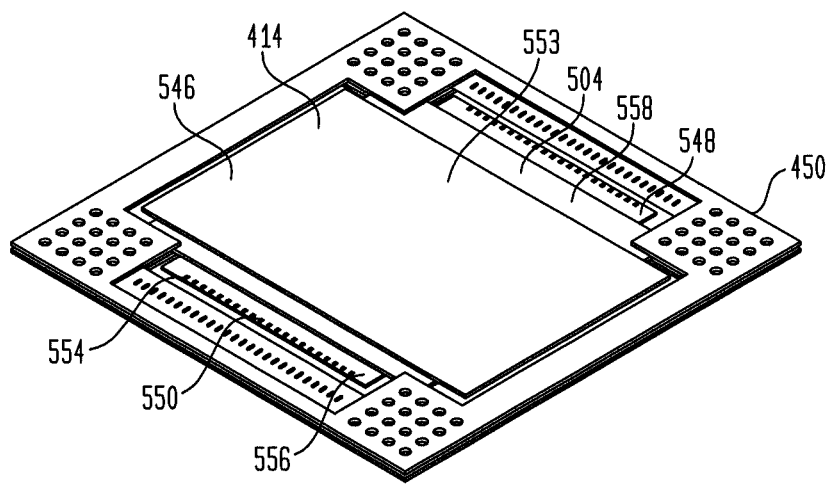
FIGS. 24-24A are perspective views of a packaged chip in accordance with this alternative embodiment of the present invention.
Figure 24A:
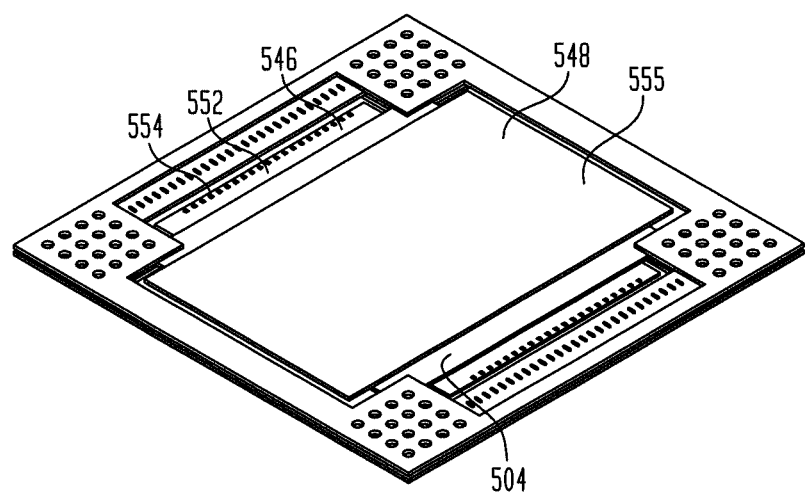

As illustrated in FIGS. 24-24A, the subassembly 450 may be coupled to a first microelectronic element 546 and a second microelectronic element 548. The first and second microelectronic elements 546, 548 are bare die, but may also be microelectronic packages and the like. As in the prior embodiments, the first microelectronic element 546 includes an active surface 552 (see FIG. 24A) and a rear surface 553. A plurality of bond pads 554 (see FIG. 24A) are exposed on the active surface 552 of the first microelectronic element 412. Similarly, the second microelectronic element 548 includes an active surface 556 (see FIG. 24) with a plurality of bond pads 550 exposed thereat (see FIG. 24A).

The active surface 552 of the first microelectronic element 546 is adjacent a first side 558 of the metal shelf 504. An adhesive layer (not shown) is used to attach the first microelectronic element 546 to the metal shelf and subassembly 450. The active surface 556 of the second microelectronic element is proximate a second side 560 of the metal shelf. An adhesive layer (not shown) is also used to attach the second microelectronic element 548 to the metal shelf and subassembly. As in the previous embodiments, the first and second microelectronic elements may be wire bonded (not shown) to the ledges of the subassembly. The first and second microelectronic elements 546, 548 are preferably positioned laterally adjacent the contacts 554 so that the microelectronic element is in the same plane as the substrate.

Figure 57:
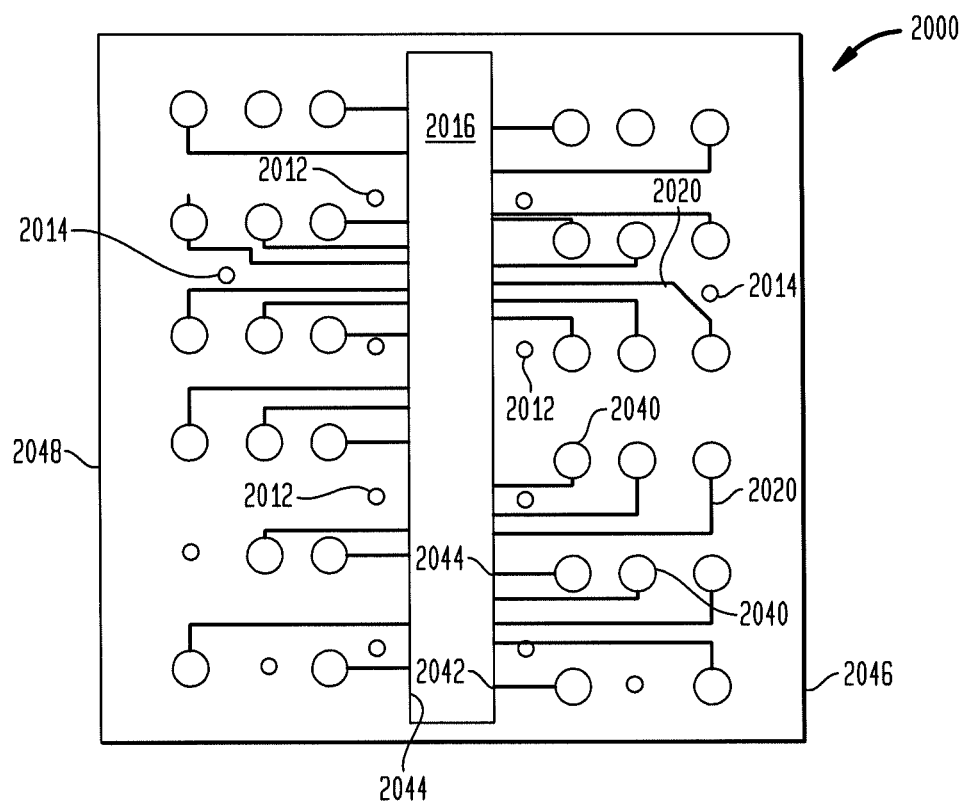
FIG. 57 is a bottom plan view of a package element in accordance with another alternative embodiment of the present invention.
Figure 57A:
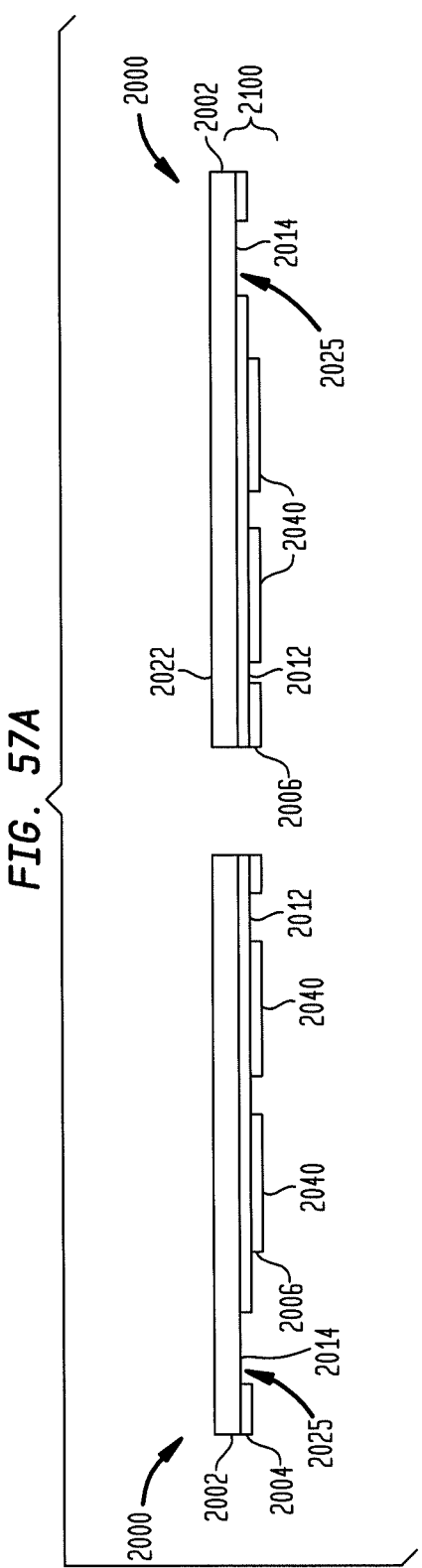
FIG. 57A is a sectional view taken along line 8-8 of FIG. 57.

In yet another alternative embodiment, as an alternative to the use of the more costly two-metal substrates for chip packaging, which requires circuitry to be placed and aligned onto both sides of a substrate, a pseudo two-metal substrate can be used for purposes of packaging a chip or the like. Referring to FIGS. 57 and 57A, a preferred pseudo two-metal substrate 2000 with an elongated die cavity 2016 is shown. Referring to FIG. 57A, the pseudo two-metal substrate 2000 includes a single metal substrate 2100 and a thick metal layer or ground plane 2002 laminated onto the single metal substrate 2100.

The single metal substrate 2100 includes a dielectric layer 2004 and a metal layer 2006. In the embodiment shown, the dielectric layer 2004 is disposed over the metal layer 2006 and is preferably formed from a polyimide, although any dielectric material may be used. The trace metal layer 2006 is preferably formed from highly conductive metals, such as copper or copper substrates. FR4, BT, dielectric substrates with patterned metal layers such as used for tape-automated bonding ("TAB") are common single metal substrates which may be used in accordance with this invention, although any single metal substrate will suffice.

Figure 57B:
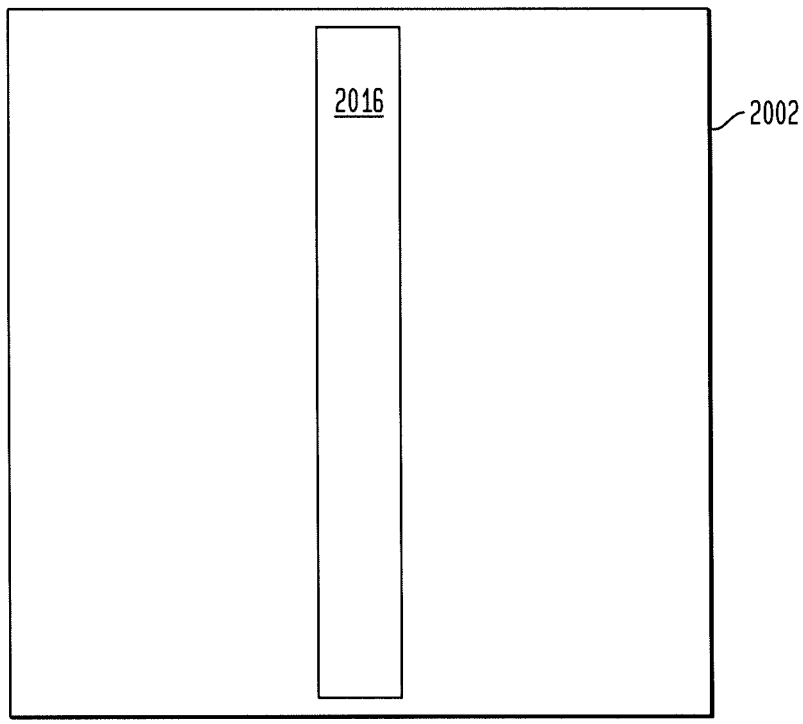
FIG. 57B is a top plan view of a package element in accordance with another alternative embodiment of the present invention.

Referring to FIGS. 57A and 57B, the ground plane 2002 is laminated onto the top surface of the dielectric layer 2004. Like the metal layer 2006, the ground plane 2002 is preferably formed from highly conductive metals, such as copper or copper substrates. As shown in FIG. 57B, a top plan view of the ground plane 2002 is shown. Unlike the metal layer 2006 which has circuitry and the like preferably etched thereon, the ground plane 2002 has no conductive elements exposed at its top surface.

Referring to FIG. 57, an elongated cavity 2016 extends across the middle length of the pseudo two-metal substrate 2000. In a preferred embodiment, the elongated cavity 2016 is arranged so that the distance between the outer left edge 2048 of the pseudo two-metal substrate 2000 and the left edge 2044 of the elongated cavity 2016 is equal to the distance between the outer right edge 2046 of the pseudo two-metal substrate 2000 and the right edge 2042 of the elongated cavity 2016. The elongated cavity 2016 may, of course, be positioned at any desirable location and may be of any shape.

As shown in FIGS. 57 and 57A, traces 2020 and contact pads 2040 are formed from the trace metal layer 2006. Holes or openings for solder balls 2014 and holes or openings for wire-bonding 2012 are preferably located adjacent the left and right edges 2042, 2044 of the elongated die cavity 2016. Once the circuitry is completed, a dielectric layer 2054 may be disposed over the trace metal layer 2006 of the pseudo two-metal substrate (See FIG. 58). The dielectric layer 2004 preferably includes various cutouts such as holes and recesses 2025 that are aligned with the contacts 2040 and elongated cavity 2016. The dielectric layer 2004 may be a single layer, or may be a laminate including several sublayers.

Figure 58:
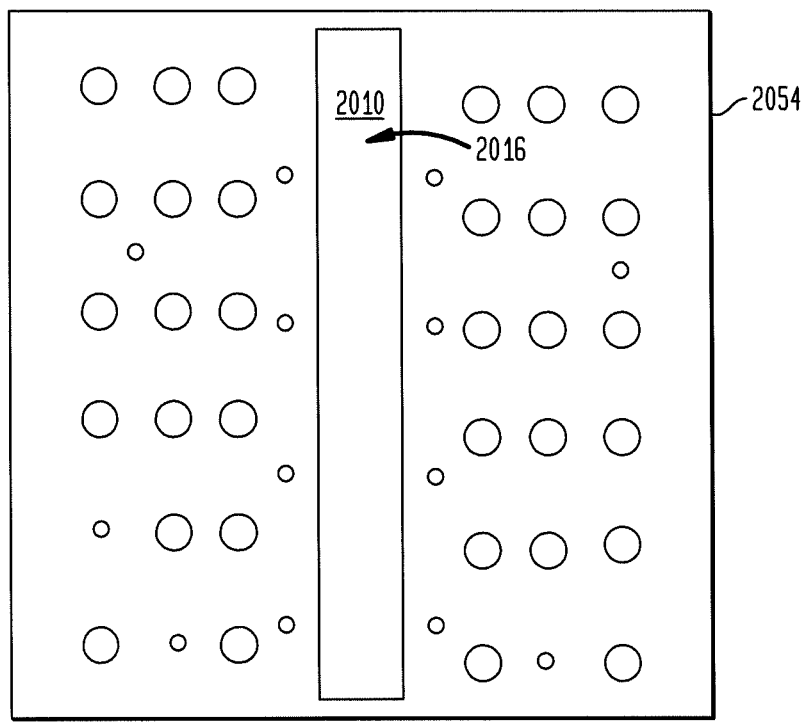
FIG. 58 is a rear plan view of a packaged chip in accordance with this alternative embodiment of the present invention.
Figure 58A:
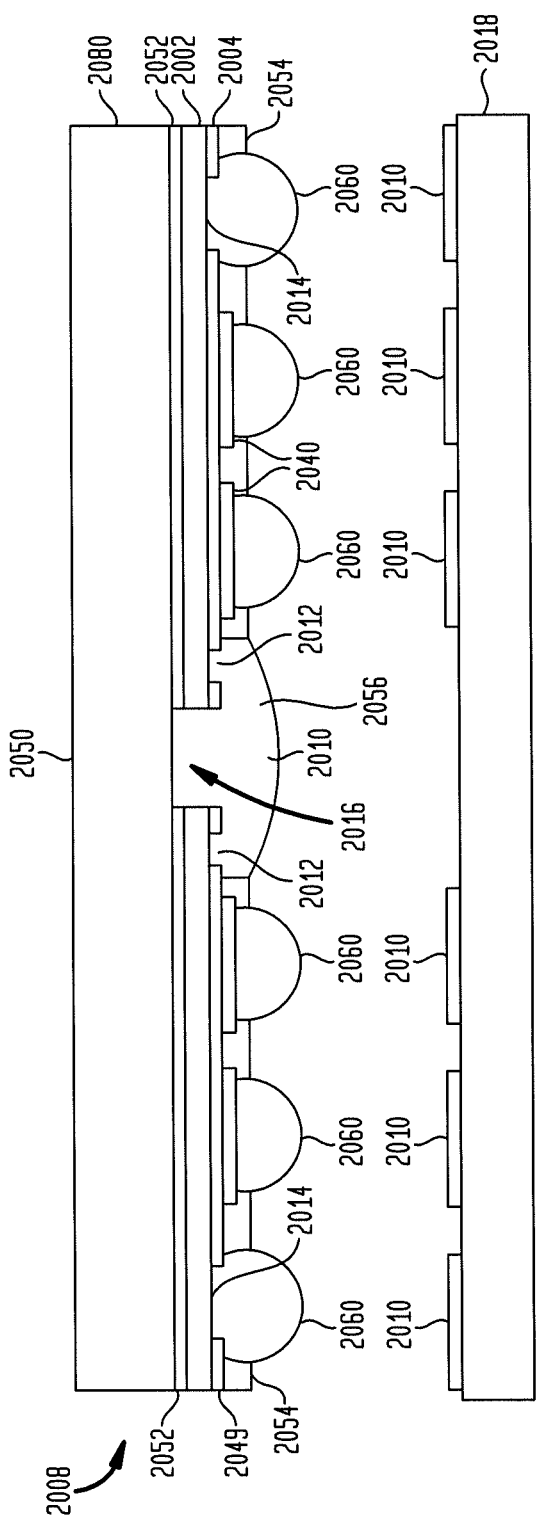
FIG. 58A is a sectional view taken along line 9-9 of FIG. 58.
Figure 59:
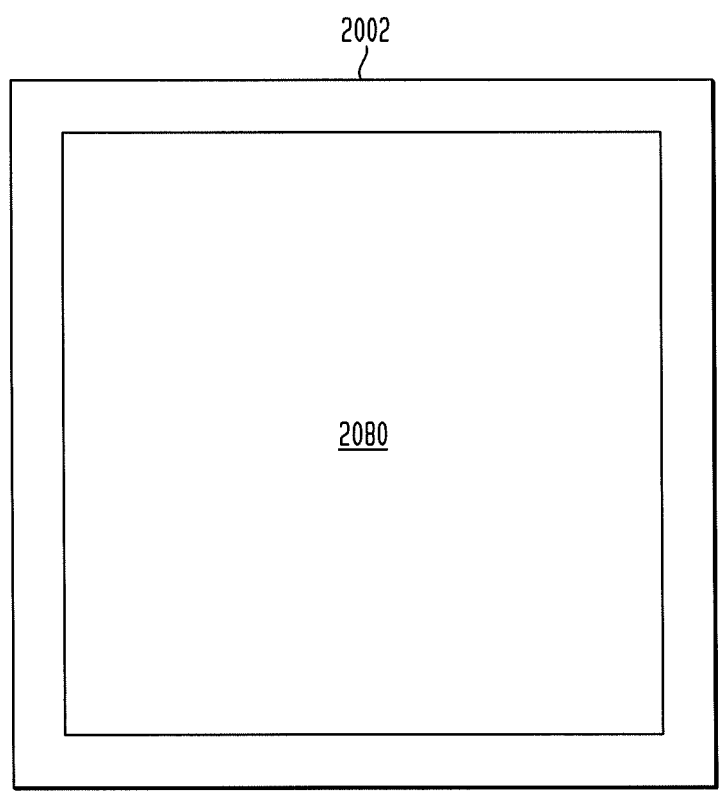
FIG. 59 is a top plan view of a packaged chip in accordance with this alternative of the present invention.

Referring to FIGS. 58 to 59, once the pseudo two-metal substrate is prepared, a microelectronic element 208 can be attached to the ground plane 2002 of the pseudo two-metal substrate 2000. Additionally, because of the arrangement of the holes or openings 2012 for solder balls 2060, solder balls from another packaged assembly (not shown) can be attached to the pseudo two-metal substrate 2000. As shown in FIG. 58A, solder balls 2060 can be deposited onto the contact pads 2040 of the pseudo two-metal substrate 2000 to create a packaged assembly 2008. Alternatively, solder balls 2060 may directly attach to the ground or ground plane 2002 through the holes or openings 2014.

Referring to FIG. 58A, the microelectronic element 2080 is preferably bare die, but may also be microelectronic packages and the like. Die attach 2052 is preferably used to attach the microelectronic element 2080 to the top surface 2049 of the ground plane 2002. An encapsulant 2010 may also be used to protect the bond wires 2056.

The microelectronic element 2080 is electrically connected to the pseudo two-metal substrate 2000 via bond wires 2056 extending from bond pads 2058 on the microelectronic element 2050 through the elongated cavity 2016 and into holes or openings 2012. The holes or openings 2012 provide for a direct connection to the ground plane 2002. Once the microelectronic element is attached to the subassembly 2008, the subassembly can be directly attached to contacts 2010 on a printed circuit board 2018 or the like.

The microelectronic element 2080 may be electrically attached to the pseudo two-metal substrate in various ways. Referring to FIG. 60, an alternative method of attaching the microelectronic element 2050 to the pseudo two-metal substrate 2000 is shown. Unlike the previous example, the dielectric layer 2004 does not extend to the right and left edges 2042, 2044 of the elongated cavity 2016, but rather ends just prior to the right and left edges 2042, 2044 of the elongated cavity 2016. This exposes an additional surface 2064 of the ground plane 2006 and provides for direct contact of the bond wires 2056 with the ground plane 2002.

Referring to FIG. 61, in still another alternative embodiment, instead of connecting to the ground plane 2008, bond wires 2180 directly attach to traces 2020 exposed at the dielectric layer 2004.

Figure 62:
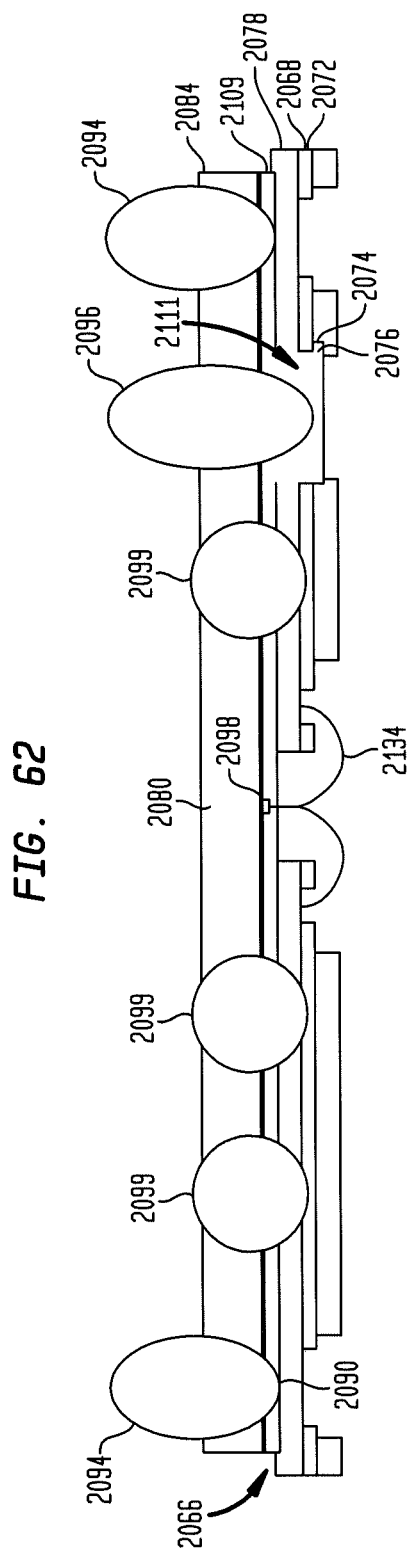
FIG. 62 is a sectional view of a packaged chip in accordance with still another alternative embodiment of the present invention.

If it is desired to stack the package with another package refers to another alternative embodiment, FIG. 62 that illustrates a packaged element 2066 utilizing a pseudo two-metal substrate that can easily be stacked with another package. As shown, the packaged element 2066 includes a single metal substrate including a dielectric layer 2068 and a metal layer 2074, from which a contact pad 2090 is preferably etched. The dielectric layer 2068 has top and bottom surfaces 2070, 2072. The bottom surface 2072 of the dielectric layer 2068 is proximate the top surface 2076 of the metal layer 2074. The thick metal layer or ground plane 2078 is adjacent the top surface 2070 of the dielectric layer 2068. As seen in the previous embodiments, an elongated cavity 2082 extends across the middle length of the pseudo two-metal substrate 2000.

Figure 63:
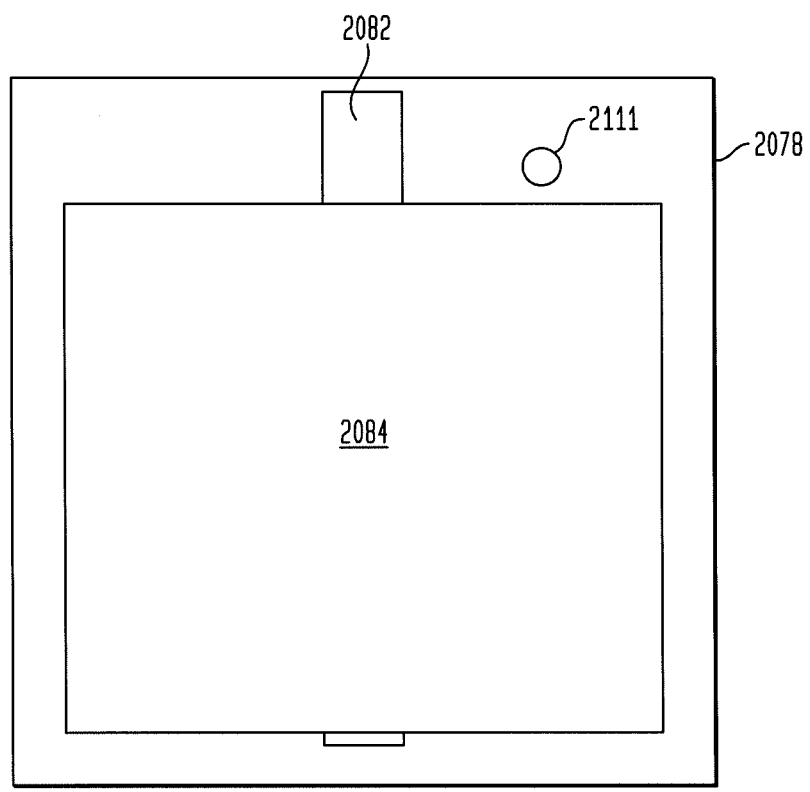
FIG. 63 is a top plan view of a portion of the alternative embodiment shown in FIG. 62.

Once the pseudo two-metal package element is prepared, a microelectronic element 2080 can be attached to the pseudo two-metal substrate 2000. As shown, bond wires 2134 connect bond pads 2098 on the microelectronic element 2084 to the ground plane 2078 through the elongated cavity 2082 created in the dielectric layer 2068 and metal layer 2074. In order to allow for a direct connection to the contact pads 2074, a ground opening 2111 (see FIG. 63) must be created to provide for a passageway to the contact pad 2074. Referring to FIG. 63, a top plan view of the microelectronic element 2080 positioned directly over the ground plane 2078 is shown. In order to provide access to the ground opening 2111, the microelectronic element 2080 cannot be positioned over the contact pad (see FIG. 62). Therefore, the microelectronic element 2080 must be positioned so as to allow space for solder connections or the like to another packaged microelectronic element (not shown). Additionally, a ground opening 2111 in the ground plane 2078 provides a connection to the contact 2090. In other words, the microelectronic element 2084 does not extend across a portion of the front row 2092 of contact pads 2090. The edges 2086 of the microelectronic element 2080 end just prior to the ground opening 2111. This provides for additional space adjacent to the microelectronic element for electrical connection to another packaged microelectronic element.

Referring back to FIG. 62, because the microelectronic element 2084 provides space for electrical connections to another package, solder balls 2094, 2096, extend along the entire front length of the pseudo two-metal substrate. The microelectronic element 2084 is therefore shown disposed behind the row of solder balls. The solder balls 2094 positioned on the outermost edges of the pseudo two-metal substrate are connected directly to the ground plane 2098. The solder ball 2096 is connected to the trace metal layer 2096. Solder balls 2099 are also arranged along the front length of the subassembly.

This alternate packaged microelectronic element 2084 may now be stacked with other stacked packages.

Figure 64:
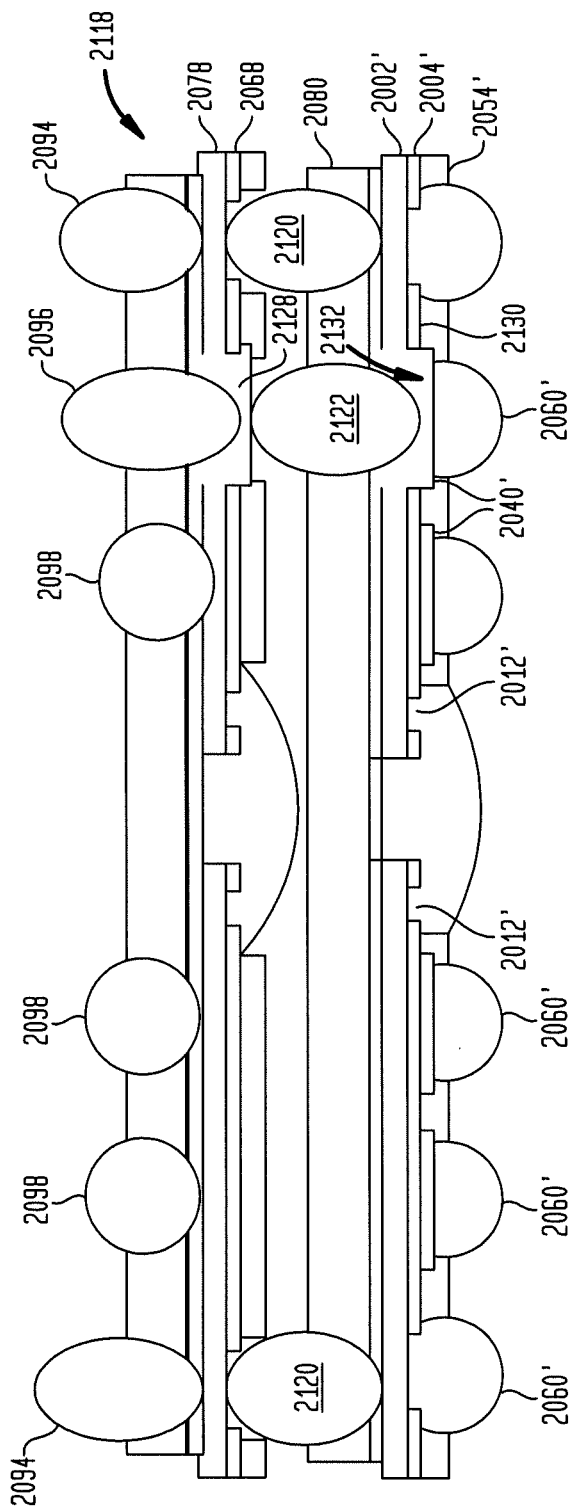
FIG. 64 is an elevational view of a stacked assembly in accordance with the present invention.

Referring to FIG. 64, the packaged microelectronic element 2084, can be stacked with other packaged microelectronic elements having a pseudo two-metal substrate. As shown, a stacked assembly 2114 includes a first assembly 2118 and a second assembly 2116.

The first assembly 2118 is identical to the assembly shown in FIGS. 61-63 and is numbered accordingly. The second assembly 2116 is similar to the assembly shown in FIGS. 58-61, except for the fact that like the first assembly 2118, the microelectronic element 2080' does not extend across the portion of the ground plane 2002' overlying contact pads exposed at the bottom surface of the dielectric layer 2004'. This arrangement provides for a space adjacent the microelectronic element 2080' for electrical connection of the first assembly 2118 to the second assembly 2116. Such a connection occurs either directly to the ground planes 2002' of the first and second assemblies 2118, 2116 or directly through the ground planes 2002' of the first and second assemblies 2118, 2116. As shown in FIG. 64, solder balls 2120 located at the outermost ends of the second assembly 2116 are connected directly to the respective ground planes 2078, 2002' of the first and second assemblies 2118, 2116. The solder balls 2120 are attached to the top surface 2124 of the ground plane 2002' of the second assembly 2116, and are also attached to the ground plane 2078 of the first assembly 2118 through an opening 2126 in the dielectric layer 2068. A solder ball 2122 is connected to the signal contact pads 2040 adjacent the bottom surfaces 2128, 2130 of the dielectric layers 2004' of the first and second assemblies 2118, 2116 through the opening 2132 in the ground plane 2002' of the second assembly 2116 and an opening 2111 in the dielectric layer 2068 of the first assembly 2118.

Many variations of the aforementioned substrates are possible to accommodate different design considerations for stacked packages. For example, the microelectronic element may be placed above, below, or within a substrate cavity. Furthermore, the microelectronic element may only be wire-bonded at one of its ends to a subassembly, or alternatively, it may be wire-bonded at both of its ends. Accordingly, the following examples (FIGS. 25-50) demonstrate a few of the various configurations of stacked subassemblies that can be accomplished using the principles set forth herein. For ease of discussion, the following examples utilize single metal substrates, but various substrates, including those discussed herein, may be utilized.

In a first series of embodiments, a single row of bond wires is used to attach a microelectronic element to a substrate with a cavity.

Referring first to FIGS. 25-27A, a stacked package 2200 (see FIG. 27) includes first and second subassemblies 600, 636. Referring to FIGS. 25-25A, a top plan view and a cross-sectional view of a first subassembly 600 and an attached microelectronic element 604 are shown. As in the previous examples, the first subassembly 600 is formed from a single metal substrate which has a metal layer 608 and a dielectric layer 610, such as a polyimide or the like. The metal layer 608 has upper and lower surfaces 611, 613, and is preferably formed from highly conductive materials, such as copper or copper alloys. Additionally, the lower surface 635 of a layer of solder mask 603 is proximate the upper surface 611 of the metal layer 608.

The first subassembly 600 has a rectangular-shaped cavity 606 which is positioned off-center so that the distance between the right edge 618 of the first subassembly 600 and the right edge 620 of the rectangular-shaped cavity 606 is greater than the distance between the left edge 614 of the first subassembly 600 and the left edge 616 of the rectangular-shaped cavity 606. Similarly, the distance between the top edge 624 of the first subassembly 600 and the top edge 622 of the rectangular-shaped cavity 606 is greater than the distance between the lower edge 626 of the first subassembly 600 and the lower edge 628 of the rectangular-shaped cavity 606.

A microelectronic element 604 is mounted face-up and adjacent the upper right side (not shown) of the rectangular-shaped cavity 606 of the first subassembly 600. die attach 609 is also used to attach the microelectronic element 604 to the metal layer 608. A single row of bond wires 632 located along the right side 631 of the microelectronic element 604 conductively connects bond pads 630 provided on a front face 634 of the microelectronic element 604 to contact pads 612 on the first subassembly 600. Since the microelectronic element 604 is not centered within the rectangular-shaped cavity, an opening 601 is created between the left edge 615 of the microelectronic element and the left edge 623 of the rectangular-shaped cavity 606, as well as between the bottom edge 627 of the microelectronic element 604 and bottom edge 629 of the rectangular-shaped cavity 606.

Figure 25B:
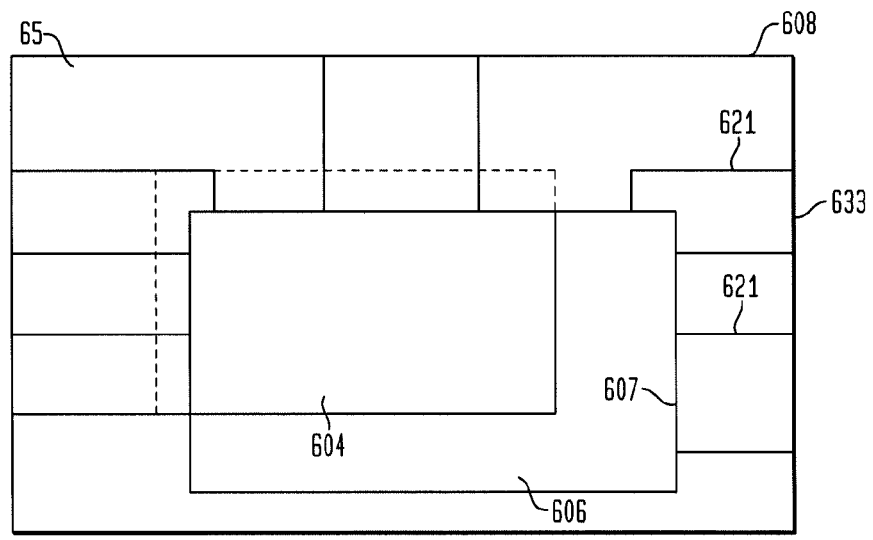

As shown in FIG. 25B, which is a rear view of the first subassembly 600, traces 621 on the outer face 59 of the metal layer 608 extend from the edges 607 of the rectangular-shaped cavity 606 to the outer edges 633 of the metal layer 608. For ease of illustration, only a few traces are shown in the figure, but additional trace patterns and/or circuitry may also be implemented on the metal layer 608.

Figure 26B:
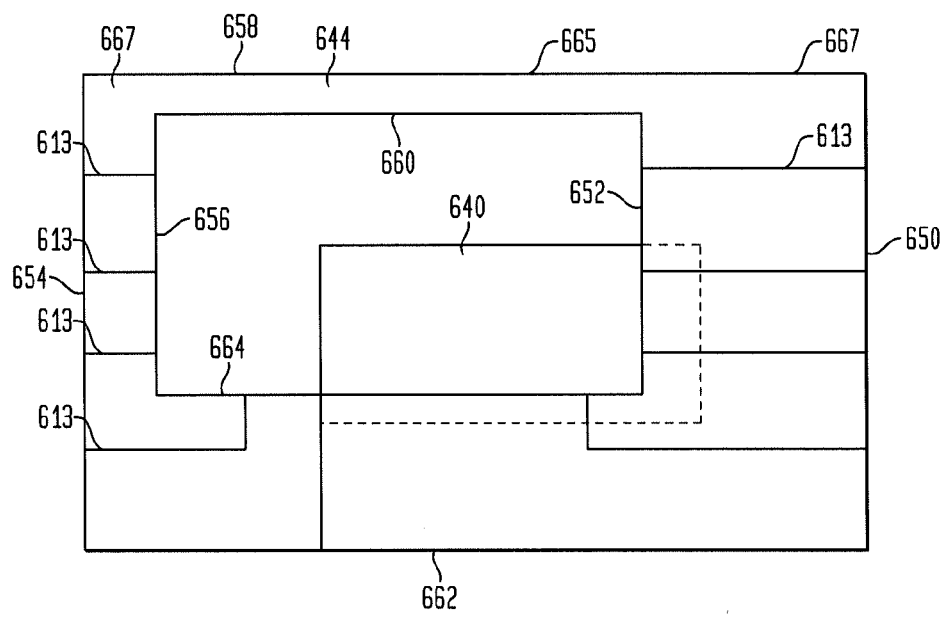

A second subassembly 636, which can be stacked together with the first subassembly 600, is shown in FIGS. 26 and 26A. As in the previous examples, the second subassembly 636 is formed from a single metal substrate which has a metal layer 644 and a dielectric layer 647, such as a polyimide or the like. A layer of solder mask 637 is also disposed above the metal layer 644. The second subassembly 636 has a rectangular-shaped cavity 646 which is positioned off-center so that the distance between the right edge 654 of the second subassembly 636 and the right edge 656 of the rectangular-shaped cavity 646 is less than the distance between the left edge 650 of the second subassembly 630 and the left edge 652 of the rectangular-shaped cavity 646. Similarly, the distance between the top edge 658 of the second subassembly 636 and the top edge 660 of the rectangular-shaped cavity 642 is less than the distance between the lower edge 662 of the second subassembly 636 and the lower edge 664 of the rectangular-shaped cavity 606. As shown in FIGS. 25A and 26B, the left side 641 of the second subassembly 636 is longer than the left side 617 of the first subassembly 600. Similarly, the right side 619 of the first subassembly is longer than the right side 653 of the second subassembly 636.

A microelectronic element 640 is mounted face-up above the lower left side 641 of the rectangular-shaped cavity 642 of the second subassembly 636. A single row of bond wires 668 located on the left side 643 of the microelectronic element 640 conductively connects bond pads 666 provided on a front face 670 of the microelectronic element 640 to contact pads 648 on the second subassembly 636. Because the microelectronic element 640 is not centered within or above the rectangular-shaped cavity 642, an opening 649 is created between the right side 671 of the microelectronic element and the right edge 656 of the rectangular-shaped cavity 642, as well as the left edge 651 of the microelectronic element 640 and top edge 660 of the rectangular-shaped cavity 642 is formed.

As shown in FIG. 26B, which is a bottom view of the second subassembly 636, traces 613 on the outer face 667 of the metal layer 644 extend from the edges 652, 656, 660, 664 of the rectangular-shaped cavity 642 to the outer edges 650, 654, 658, 662 of the subassembly 636. For ease of illustration, only a few traces are illustrated in the figure, but additional trace patterns and/or circuitry may also be implemented.

Once the first and second subassemblies 600, 636 and their respective microelements 604, 640 are prepared, the first and second subassemblies 600, 636 can be stacked and attached together in a manner which minimizes the overall stack height. Referring to FIGS. 27 and 27A, a top plan view and cross-sectional view of the first and second subassemblies 600, 636 stacked together are shown. The layer of solder mask 637 on the second subassembly 636 is used to attach the first and second subassemblies 600, 636 together. Once the subassemblies are stacked together, the solder mask 637 is located between the dielectric layer 610 of the first subassembly 600 and the metal layer 644 of the second subassembly 636.

In the stacked arrangement, the right edge 620 of the rectangular-shaped cavity 606 on the first subassembly extends over a portion of the rectangular-shaped cavity 646 in the second subassembly 636. Due to the staggered arrangement of the first and second subassemblies 600, 636, the bond wires 632 extending from the microelectronic element 604 of the first subassembly 600 to the contacts 612 exposed at the first subassembly 600 are positioned on the right side 619 of the stacked subassembly, and the bond wires 668 extending from the microelectronic element 640 to the contacts 666 on the second subassembly 636 are positioned on the left side 617. Additionally, the opening 601 in the first subassembly 600 is adapted to receive the bond wires 668 of the second subassembly 636.

As shown, the microelectronic element 640 of the second subassembly 636 is positioned within the rectangular-shaped cavity 606 (see FIGS. 25, 25A) of the first subassembly. Furthermore, the rectangular-shaped cavity 642 is capable of receiving a microelectronic element (not shown) of another package (not shown). The particular arrangement of the subassemblies 600, 636 and the microelectronic elements 604, 640 reduces the overall size of the packaged chip and allows for the stacking of additional packaged chips.

Referring to FIGS. 31-33, an example of an alternative stacked package 2220 (see FIG. 33A) is illustrated, wherein a single row of bond wires is used to attach microelectronic elements to first and second assemblies within the first and second subassembly cavities. FIGS. 31 and 31A provide a top plan view and a cross-sectional view of a first subassembly 728 of the stacked package 2002. As in the previous example, the first subassembly 728 includes a single metal substrate having a metal layer 736 and a dielectric layer 738. The metal layer 736 has a top surface 735 and a bottom surface 737. A layer of solder mask 741 is also disposed proximate the top surface 735 of the metal layer 736.

A rectangular-shaped cavity 734 (see FIG. 31) is also located on the first subassembly 728. The rectangular-shaped cavity 734 is arranged so that the distance between the left edge 753 of the first subassembly 728 and the left edge 744 of the rectangular-shaped cavity 734 is less than the distance between the right edge of the first subassembly 728 and the right edge of the rectangular-shaped cavity 734.

The right side 745 of the microelectronic element 732 is attached to the first subassembly 728. Bond wires 762 located along the right side 745 of the microelectronic element 732 conductively connect bond pads 758 provided on a front face 747 of the microelectronic element 732 to contact pads 740 located on the first subassembly 728. As best shown in FIG. 31A, contrary to the previous example, the microelectronic element 732 is positioned within the rectangular-shaped cavity 734 (as opposed to above the cavity) so that the microelectronic element 732 lies within the same plane as the dielectric layer 738 and metal layer 736. In this alternate arrangement, the microelectronic element is laterally adjacent to the first subassembly 728. Bonding on only one side of the microelectronic element 732 creates an opening 739 between the left edge 744 of the rectangular-shaped cavity and the left edge 759 of the microelectronic element 732.

Figure 31B:
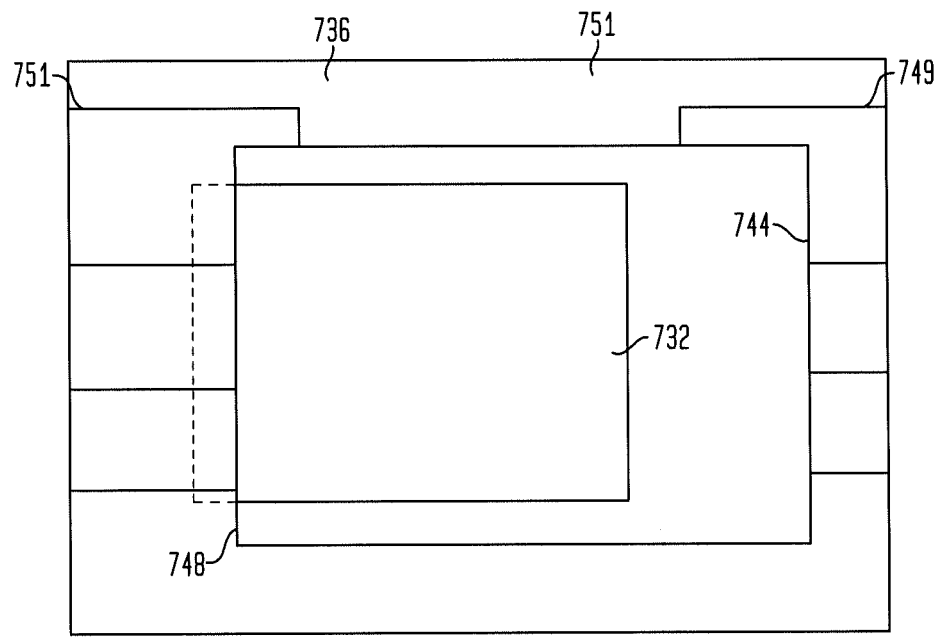

A bottom view of the first subassembly 728 is shown in FIG. 31B. Traces 749 on the outer face 751 of the metal layer extend from the edges 744, 748, 760, 756 of the rectangular-shaped cavity 734 to the edges 742, 746, 753, 754 of the first subassembly 728. For ease of illustration, only a few traces are shown in the figure, but additional traces and/or circuitry may also be implemented on the metal layer 736.

Referring to FIGS. 32 and 32A, a top plan view and cross-sectional view of the second subassembly 770 are shown. Like the first subassembly 728, the second subassembly 770 includes a single metal substrate which has a metal layer 780 disposed above a dielectric layer 782, such as a polyimide. A layer of solder mask 729 is also disposed above the metal layer 780. A rectangular-shaped cavity 778 is located on the second subassembly 770. The distance from the left edge 786 of the second subassembly 770 to the left edge 788 of the rectangular-shaped cavity 778 is less than the distance between the left edge 742 of the first subassembly 728 and left edge 744 of the rectangular-shaped cavity 778. The right side 801 of the second subassembly 770 is shorter than the right side 768 of the first subassembly 728, whereas the left side 781 of the second subassembly 770 is longer than the left side 769 of the first subassembly 728.

A microelectronic element 776 is mounted face-up within the rectangular-shaped cavity 778. The left side 785 of the microelectronic element 776 is attached to the left side 781 of the second subassembly 770. Bond wires 804 conductively connect bond pads 802 provided on a front face 806 of the microelectronic element 776 to contact pads 784 located on the second subassembly 770. Like the first subassembly 728, the microelectronic element 776 lies within the same plane as the dielectric layer 782 and metal layer 780. This arrangement provides for an opening 787 between the right edge 789 of the microelectronic element 776 and the right edge 789 of the rectangular-shaped cavity 778.

Figure 32B:
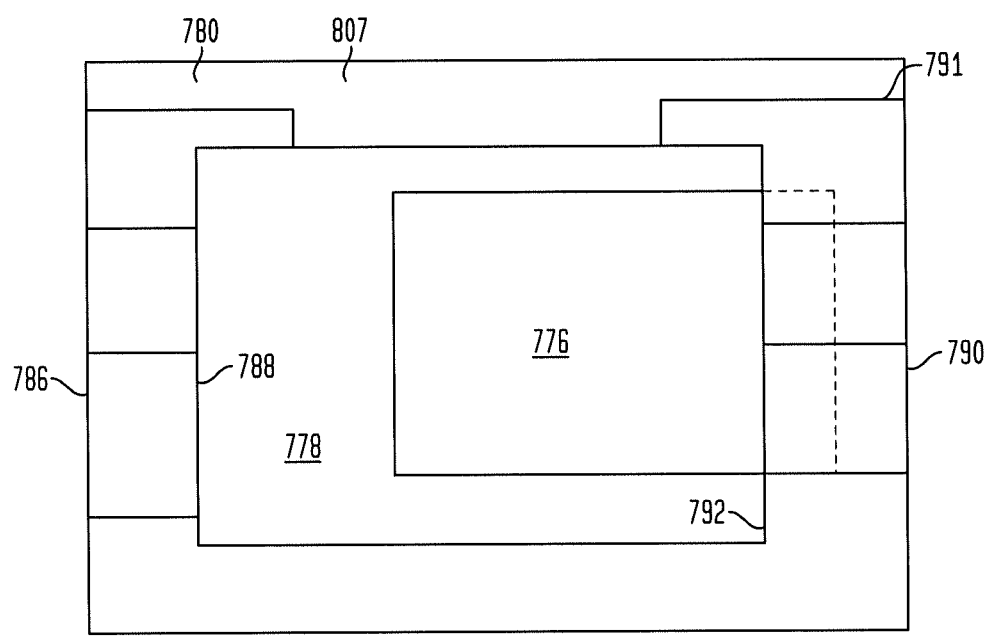

As shown in FIG. 32B, the bottom view of the second subassembly 770, traces 791 on the outer face 807 of the metal layer 780 extend from the edges 786, 790 of the second subassembly 770 to the left and right edges 788, 792 of the rectangular-shaped cavity 778. For ease of illustration, only a few traces are shown in the figure, but additional trace patterns and/or circuitry may also be implemented on the metal layer 780.

Referring to FIGS. 33-33A, a top plan view and a cross-sectional view of the stacked package 2220, which include first and second subassemblies 728, 770, are shown. The first subassembly 728 is attached to the second subassembly 770 via the layer of solder mask 729 on the second subassembly 770. The solder mask 729 is directly attached to the bottom surface of the dielectric layer 738 of the first subassembly 728.

As shown in FIG. 33A, the left edge 744 of the cavity of the second subassembly 770 overlaps the left edge 744 of the rectangular-shaped cavity 734 on the first subassembly 728, whereas, the right edge 748 of the rectangular-shaped cavity 724 of the first subassembly 728 overlaps the right edge 789 of the rectangular-shaped cavity 778 in the second subassembly 770. In other words, one edge of the rectangular-shaped cavities 744, 787 of either the first or second subassembly 728, 770 therefore overlies the respective edge of the other cavity. There is also a gap 803 between the microelectronic elements 732, 776 of the first and second subassemblies 728, 770 which provides an additional dielectric layer between the two microelectronic elements.

As shown in FIG. 33A, the orientation of the microelectronic elements in the first and second subassemblies 728, 770 reduces the stack height. Although both microelectronic are arranged in a horizontal position within the substrate cavities, the microelectronic elements are mounted on the left and right sides of the respective subassemblies. This provides for stacking of the first and second subassemblies 728, 770 in a staggered fashion which further allows for the bond wires 804 of the second subassembly 770 to fit within the opening 787 in the first subassembly 728. As the components of each of the subassemblies are complementary to one another, this arrangement provides for thinner stacked packaging.

In a second series of stacked packages, two rows of bond wires are used to attach a microelectronic element to a subassembly having a cavity therein. FIGS. 28-30A provide a first example of a stacked package 2210 having microelectronic elements wire-bonded at both ends to respective subassemblies. A stacked package 2210 (see FIG. 30) includes first and second subassemblies 672, 708 having each of the respective ends of the microelectronic elements 676, 710 wire-bonded above cavities in the first and second subassemblies 672, 708. Referring to FIGS. 28 and 28A, a top plan view and cross-sectional view of the first subassembly 672 is shown. As in the previous example, the first subassembly 672 includes a single metal substrate having a metal layer 680, a dielectric layer 682, and a layer of solder mask 673. The metal layer 680 is disposed above the dielectric layer 682, but below the layer of solder mask 673. A rectangular-shaped cavity 678 is located on the first subassembly 672 in a vertical position, such that the distance between the left edge 686 of the first subassembly 672 and the left edge 688 of the rectangular-shaped cavity 678, as well as the distance between the right edge 690 of the subassembly and right edge 692 of the cavity, is significantly greater than the distances between the top edge 694 of the subassembly and top edge 696 of the rectangular-shaped cavity 670, as well as the lower edge 698 of the subassembly 672 and the lower edge 700 of the rectangular-shaped cavity 678.

The microelectronic element 676 is placed in a horizontal direction above the rectangular-shaped cavity 678. The left and right edges 679, 681 of the microelectronic element 676 are respectively attached to the left and right sides 689, 691 of the first subassembly 672 which are respectively adjacent the left and right edges 688, 692 of the rectangular-shaped cavity 678. Bond wires 704 located on the left and right sides 679, 681 of the microelectronic element 676 conductively connect bond pads 702 provided on a front face 706 of the microelectronic element 676 to contact pads 684 on the first subassembly 672. A first horizontal opening 707 and second horizontal opening 709 are created adjacent the rectangular-shaped cavity 678 by the placement of the microelectronic element 676. The first horizontal opening 707 is located between the top edge 696 of the rectangular-shaped cavity 678 and the top edge 683 of the microelectronic element 676. The second horizontal 709 is located between the lower edge 700 of the rectangular-shaped cavity 678 and the bottom edge 703 of the microelectronic element.

As shown in FIG. 28B, which is a bottom view of the first subassembly 672, traces 693 on the outer face 705 of the metal layer 680 extend from the edges 688, 692, 696, 700 of the rectangular-shaped cavity 678 to the edges 686, 690, 694, 698 of the first subassembly 672. For ease of illustration, only a few traces are shown in the figure, but additional trace patterns and/or circuitry may also be implemented.

Referring to FIGS. 29 and 29A, a top plan view and cross-sectional view of the second subassembly 708 is shown. The second subassembly 708 includes metal layer 713 disposed above a dielectric layer 714, such as a polyimide or the like. A layer of solder mask 729 is disposed above the metal layer 713.

A rectangular-shaped cavity 712 is located on the second subassembly 708 in a horizontal direction, such that the distance between the left edge 716 of the second subassembly 708 and the left edge 717 of the rectangular-shaped cavity 712, as well as the distance between the right edge 718 of the second subassembly 708 and right edge 719 of the rectangular-shaped cavity 712, is greater than the distances between the top edge 720 of the second subassembly 708 and top edge 721 of the rectangular-shaped cavity 712, as well as the lower edge 722 of the second subassembly 708 and the lower edge 723 of the rectangular-shaped cavity 712. The distance between the top edge 720 of the second subassembly 708 and top edge 721 of the rectangular-shaped cavity of the second subassembly, as well as the distance between the bottom edge 722 of the second subassembly 708 and bottom edge 723 of the rectangular-shaped cavity 712 of the second subassembly 708, is greater than the distance between the top edge 694 of the first subassembly 672 and top edge 696 of the rectangular-shaped cavity 678 of the first subassembly 672, as well as the distance between the lower edge 698 of the first subassembly 672 and lower edge 700 of the rectangular-shaped cavity 678 of the first subassembly 672.

The microelectronic element 710 is placed in a vertical direction above the rectangular-shaped cavity 712, such that a first vertical opening 711 is created in the space between the left edge 717 of the rectangular-shaped cavity and the left edge 731 of the microelectronic element 710. Similarly, a second vertical opening 727 is created in the space between the right edge 733 of the microelectronic element 710 and right edge 718 of the rectangular-shaped cavity 712. Bond wires 725 (see FIG. 29) conductively connect bond pads 724 provided on a front face 766 of the microelectronic element 710 to contact pads 715 on the second subassembly 708.

As shown in FIG. 29B, which is a bottom view of the metal layer 713 of the second subassembly 708, traces 697 on the outer face 695 of the metal layer 713 extend from the edges 717, 719, 721, 723 of the rectangular-shaped cavity 712 to the outer edges 716, 720, 722, 718 of the second subassembly 708. For ease of illustration, only a few traces 697 are shown in the figure, but additional trace patterns and/or circuitry may also be implemented on the metal layer 608.

Referring to FIGS. 30 and 30A, a stacked package 2210 including the first and second subassemblies 672, 708 and the respective microelectronic elements 676, 710 is shown. Referring to FIG. 30A, the solder mask 729 of the second subassembly 708 joins the dielectric layer 682 of the first subassembly 672 to the metal layer 713 of the second subassembly 708. When the first and second subassemblies 672, 708 are attached together, the microelectronic element 710 of the second subassembly 708 fits within the rectangular-shaped cavity 678 of the first subassembly 672. Additionally, the openings 711, 727 and 726 of the second subassembly 708 provide openings for bond wires (not shown) of another stacked package to fit therein. As in the previous example, the edges 772 of the rectangular-shaped cavity 678 in the first subassembly 672 extend beyond the edges 773 of the cavity in the second assembly. As the components of each of the subassemblies are complementary to one another and provide space for the bond wires 704, 725, this arrangement provides for thinner stacked packaging.

Figure 34:
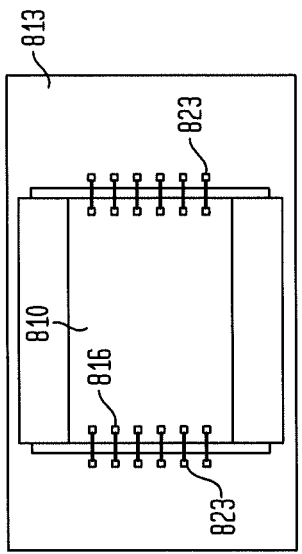
FIG. 34-34A are top plan and sectional views of an alternative stacked package in accordance with another alternative embodiment of the present invention.
Figure 34A:
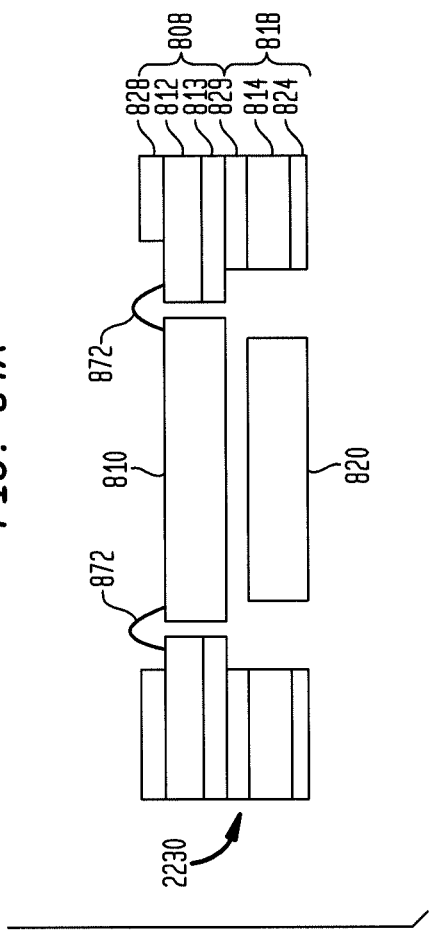

Turning next to FIGS. 34-34A, a second example of an embodiment for a stacked package having each end of the attached microelectronic elements wire-bonded to respective subassemblies is shown. As shown, there is a stacked package 2230 having first and second subassemblies 808, 818.

First and second subassemblies 808, 818 of this alternate embodiment respectively include a dielectric layer 813, 824, a metal layer 812, 814, a layer of solder mask 828, 829, and a rectangular-shaped cavity 811, 821 which receives first and second microelectronic elements 810, 820. The metal layer 812, 814 is disposed above the dielectric layers 813, 824 and below the layer of solder mask 828, 829.

The subassemblies are attached together by the layer of solder mask 829 on the second subassembly 818. When stacked together, the solder mask 829 of the second subassembly 818 is attached to the dielectric layer 813 of the first subassembly 808. In contrast to the previous embodiment, the microelectronic elements 810, 820 are positioned within the rectangular-shaped cavities 811, 822 (as opposed to above the rectangular-shaped cavities). The microelectronic elements 810, 820 are wire-bonded at each of their respective ends to the first and second subassemblies 808, 818, such that two rows of bond wires 888 conductively connect bond pads 825 provided on a front face of the microelectronic elements 810, 820 to contacts 823 provided on the respective subassemblies. (The bond wires and contacts on the second subassembly are not shown in this view.) This arrangement provides for the microelectronic elements 810, 820 to be in the same plane as the metal layers 812, 814 and solder mask layers 828, 829. Furthermore, as the first and second microelectronic elements 810, 820 are located within the respective rectangular-shaped cavities 811, 821, the packages are capable of being stacked together in a manner which minimizes the stack height.

In a third series of alternate embodiments for stacked packages shown in FIGS. 35-37A, a metal shelf is introduced within the cavity of the subassembly to provide additional support to either the front face or rear face of microelectronic elements attached therein. As in the previous examples, for ease of discussion, the third series of embodiments will be broken down into examples of single and double rows of wire bonding.

Referring to FIGS. 35-37, a stacked package 2240 (see FIG. 37A) includes first and second subassemblies 830, 856 having only one end of the attached microelectronic elements wire-bonded to the first and second subassemblies 830, 856. Referring to FIGS. 35 to 35A, a top plan view and cross-sectional view of a first subassembly 830 with an attached microelectronic element is shown. As in the previous example, the first subassembly 830 is preferably a single metal substrate having a metal layer 832 and a dielectric layer 836, such as a polyimide or the like. A layer of solder mask 841 is also disposed above the metal layer 832.

The first subassembly 830 has a rectangular-shaped cavity 833 which is positioned off-center so that the distance between the right edge 844 of the first subassembly 830 and the right edge 846 of the rectangular-shaped cavity 833 is greater than the distance between the left edge 840 of the first subassembly 830 and the left edge 842 of the rectangular-shaped cavity 606. Similarly, the distance between the top edge 847 of the first subassembly 600 and the top edge 847 of the rectangular-shaped cavity 833 is greater than the distance between the lower edge 851 of the first subassembly 600 and the lower edge 853 of the rectangular-shaped cavity 833.

A metal shelf 837 having a top surface 845 and a bottom surface 848 is also disposed within the first subassembly 830. The metal shelf 837 is preferably etched from the metal layer 832, such as the metal shelf disclosed herein in FIGS. 21-24. As best seen in FIG. 35A, the metal shelf 837 extends across and above the length of the rectangular-shaped cavity 833. An opening 839 in the metal shelf is located directly adjacent the left edge 842 of the rectangular-shaped cavity 833. As will be described in greater detail herein, the opening 839 can provide a passageway for bond wires of another package to fit therein during stack packaging.

A microelectronic element 834 is mounted face-up on the upper right side 850 of the rectangular-shaped cavity 833 of the first subassembly 830. Solder mask 841 is used to attach the rear face of the microelectronic element 834 to the top surface 845 of the metal shelf 837. As best seen in FIG. 35, a single row of bond wires 853 located on the right side 849 of the microelectronic element 834 conductively connects bond pads 843 provided on a front face 852 of the microelectronic element 834 to contact pads 612 on the first subassembly 830.

A second subassembly 856 capable of being stacked together with the first subassembly 830 is shown in FIGS. 36 and 36A. Like the first subassembly, the second subassembly 856 includes a single metal substrate which has a metal layer 864 and a dielectric layer 866, such as a polyimide or the like. A layer of solder mask 875 is disposed above the metal layer 846. The second subassembly 856 has a rectangular-shaped cavity 862 which is positioned off-center so that the distance between the right edge 868 of the second subassembly 856 and the right edge 870 of the rectangular-shaped cavity 862 is less than the distance between the left side 874 of the second subassembly 856 and the left edge 876 of the rectangular-shaped cavity 862. Similarly, the distance between the top edge 878 of the second subassembly 856 and the top edge 880 of the rectangular-shaped cavity 862 is less than the distance between the lower edge 626 of the second subassembly 856 and the lower edge 884 of the rectangular-shaped cavity 606.

A metal shelf 865 having a top surface 871 and bottom surface 877 is also disposed within the second subassembly 856. As best seen in FIG. 36A, the metal shelf 865 extends across the length of the rectangular-shaped cavity 862. An opening 869 in the metal shelf 865 is located directly adjacent the right edge 870 of the rectangular-shaped cavity. As will be described in greater detail herein, the opening 869 provides a passageway for bond wires of another packaged microelectronic element to fit therein during stack packaging.

A microelectronic element 860 is mounted face-up on the lower left side 876 of the rectangular-shaped cavity 862 of the second subassembly 856. Solder mask 875 is used to attach the rear face 898 of the microelectronic element 860 to the top surface 871 of the metal shelf 865. A single row of bond wires 888 located on the left side 889 of the microelectronic element 860 conductively connect bond pads 886 provided on a front face 890 of the microelectronic element 860 to contact pads 872 on the second subassembly 856.

The first and second subassemblies 830, 856 and the microelectronic elements 834, 860 can now be stacked together in a manner which minimizes the stack height. Referring to FIGS. 37 and 37A, a top plan view and cross sectional view of the stacked package 2240, including first and second subassemblies 830, 856, are shown. The dielectric layer 836 of the first subassembly 830 attaches to the solder mask 875 of the second subassembly 856. Because of the arrangement of the respective microelectronic elements 860 on the first and second subassemblies 830, 856 the microelectronic element 834, 860 of the second subassembly 856 is positioned within the rectangular-shaped cavity 833 of the first subassembly 830. Furthermore, the opening 869 in the metal shelf 837 of the first subassembly 830 permits the bond wires 888 of the second subassembly 856 to be inserted therein. Such an arrangement provides for a reduction in the overall size of the packaged microelectronic element. As best seen in FIG. 37A, the right edge 846 of the rectangular-shaped cavity 833 of the first subassembly 830 overlaps the right edge 870 of the rectangular-shaped cavity 862 of the second subassembly 856, and also a portion of the rectangular-shaped cavity 862 of the second subassembly 856. Conversely, the left edge 876 of the rectangular-shaped cavity 862 in the second subassembly 856 overlaps the left edge 842 of the rectangular-shaped cavity 833 of the first subassembly 830.

Referring to FIGS. 38-40A, another alternative stacked package 2250 is shown. The stacked package 2250 (see FIG. 40A) includes first and second subassemblies 900, 932 having one end of the respectively attached microelectronic elements 902, 934 wire-bonded in a face-up position to the first and second subassemblies 900, 932. Referring to FIGS. 38 and 38A, a top plan view and cross-sectional view of a first subassembly 900 of the stacked package 2250 with an attached microelectronic element 902 is shown. As in the previous example, the first subassembly 900 includes a single metal substrate having a metal layer 905, and a dielectric layer 906, such as a polyimide or the like. Additionally, a layer of solder mask 926 is disposed below the metal layer 905. The metal layer 905 has top and bottom surfaces 911, 913. The dielectric layer 906 has top and bottom surfaces 917, 919. In this alternate embodiment, the bottom surface 913 of the metal layer 905 overlies the top surface 929 of the solder mask 926. The top surface 911 of the metal layer 905 is proximate the bottom surface 919 of the dielectric layer 906.

A rectangular-shaped cavity 904 is positioned off-center within the first subassembly 900 so that the distance between the right edge 912 of the first subassembly 900 and the right edge 914 of the rectangular-shaped cavity 904 is greater than the distance between the left edge 908 of the first subassembly 900 and the left edge 910 of the rectangular-shaped cavity 904. In contrast, the distance between the top edge 916 of the first subassembly 900 and the top edge 914 of the rectangular-shaped cavity 904 is approximately equal to the distance between the lower edge 920 of the first subassembly 900 and the lower edge 922 of the rectangular-shaped cavity 904.

First subassembly 900 further includes metal shelf 903 disposed between the dielectric layer 906 and solder mask 926. The metal shelf 903 has an opening 915 located between an inner left edge 921 of the metal shelf 903 and the left edge 910 of the first subassembly 900.

A microelectronic element 902 is mounted face-up along the right side 923 of the rectangular-shaped cavity 904 of the first subassembly 900. A single row of bond wires 928 located on the right side 923 of the microelectronic element 902 conductively connects bond pads 924 provided on a front face 930 of the microelectronic element 902 to contact pads 907 on the first subassembly 900. As in the previous examples, traces (not shown) on the metal layer 905 extend from the edges 910, 922, 914, 918 of the rectangular-shaped cavity 606 to the outer edges of the subassembly 908, 912, 916, 920.

A second subassembly 932 which can be stacked together with the first subassembly 900 is shown in FIGS. 39 and 39A. Like the first subassembly 900, the second subassembly 932 includes a single metal substrate which has a metal layer 938, a dielectric layer 940, such as a polyimide or the like, and a layer of solder mask 943. The metal layer 938 has top and bottom surfaces 947, 949. The dielectric layer 940 also has top and bottom surfaces 939, 941. In this alternate embodiment, the bottom surface of metal layer 938 is proximate the bottom surface 941 of dielectric layer 940 and the top surface 951 of the solder mask 943.

A rectangular-shaped cavity 936 is positioned off-center within the second subassembly 932 so that the distance between the right edge 950 of the second subassembly 932 and the right edge 950 of the rectangular-shaped cavity 936 is less than the distance between the left edge 946 of the first subassembly 900 and the left edge 940 of the rectangular-shaped cavity 936. The distance between the top edge 959 of the second subassembly 900 and the top edge 954 of the rectangular-shaped cavity 936 is approximately equal to the distance between the lower edge 952 of the second subassembly 932 and the lower edge 960 of the rectangular-shaped cavity 936.

The second subassembly 932 further includes a metal shelf 933 disposed above the dielectric layer 906 and metal layer 905. The metal shelf 933 extends across the rectangular-shaped cavity 936. An opening 944 in the metal shelf 933 is located between an inner right edge 963 of the metal shelf 933 and the right edge 950 of the rectangular-shaped cavity 936.

A microelectronic element 934 is mounted face-up on the lower left side 969 of the rectangular-shaped cavity 936 of the second subassembly 932. A single row of bond wires 964 located on the left side 931 of the microelectronic element 934 conductively connects bond pads 962 provided on a front face 966 of the microelectronic element 934 to contact pads 942 on the second subassembly 932. In this arrangement, the microelectronic element 934 is located within the rectangular-shaped cavity 936. Traces (not shown) on the metal layer 938 extend from the left and right edges 946, 950 of the rectangular-shaped cavity 936 to the outer left and right edges 946, 950 of the second subassembly 932.

The first and second subassemblies 900, 932 and corresponding microelectronic elements 902, 934 can now be stacked together in a manner which minimizes the stack height. Referring to FIGS. 40 and 40A, a top plan view and cross sectional view of the stacked subassemblies are shown. In contrast to previous embodiments, the layer of solder mask 943 on the second subassembly 932 does not attach to the dielectric layer 906 of the first assembly 900. In this embodiment, it is the layer of solder mask 926 on the first subassembly 900 that attaches to the microelectronic element 934 of the second subassembly 932. This arrangement provides for the layer of solder mask 926 on the first subassembly 900 to be proximate the front face 966 of the microelectronic element 934 of the second subassembly 932. Additionally, as best seen in FIG. 40A, the opening 915 created in the first subassembly 900 provides a passageway for the bond wires 964 on the second subassembly 932 to pass therethrough.

The previous two embodiments of stacked packages provided examples of a microelectronic element wire-bonded on only one of its sides to a subassembly in a face-up position either above the subassembly cavity or within the subassembly cavity. In the following example, the microelectronic elements are also wire-bonded within the subassembly cavity, but in a face-down position.

Figure 41:
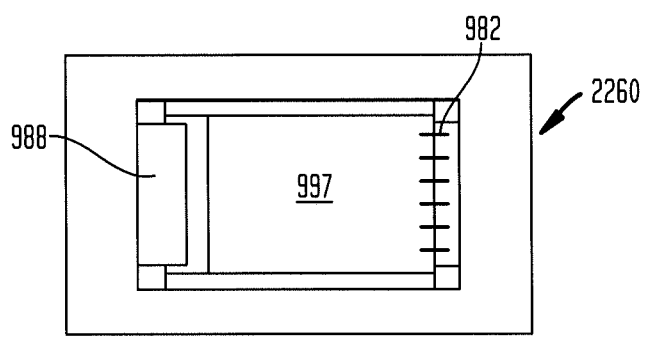
FIGS. 41-41A are a top plan view and sectional view of an alternative stacked package in accordance with another alternative embodiment of the present invention.
Figure 41A:
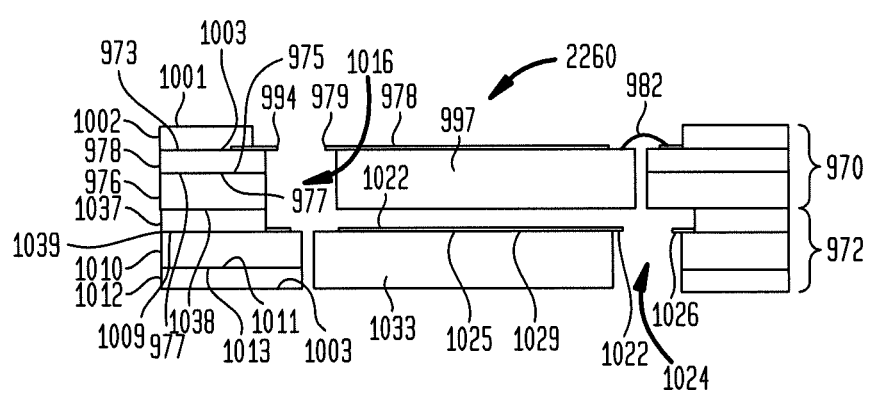
Figure 50B:
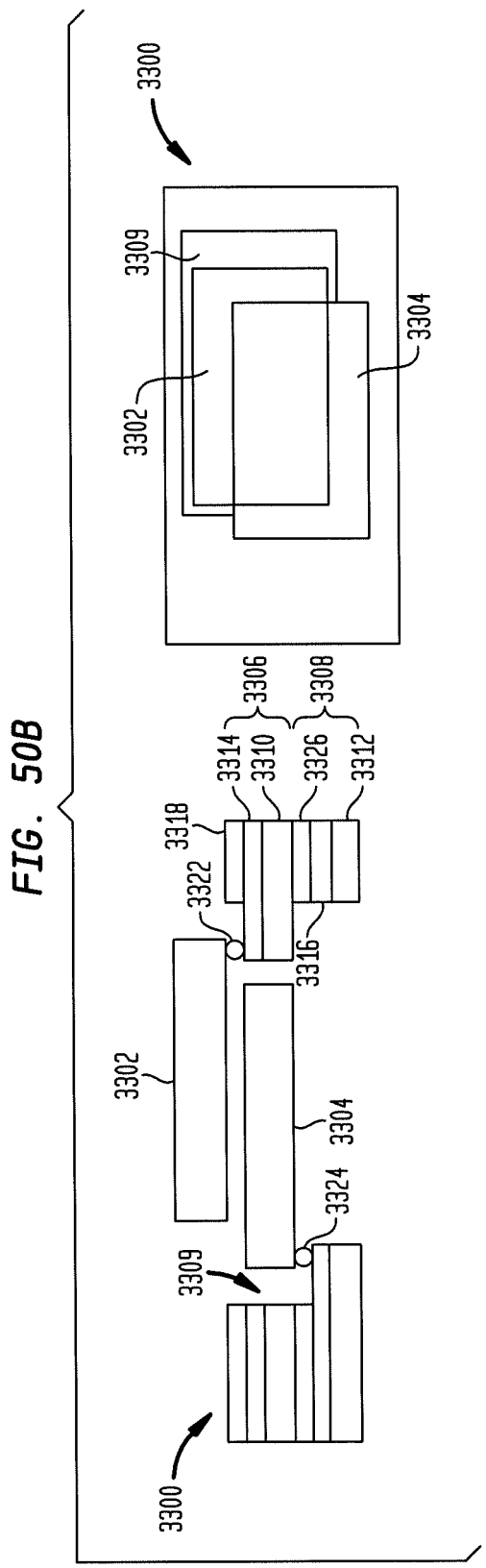
FIG. 50B is an alternate embodiment in accordance with the present invention.

Referring to FIGS. 41 and 41A, a stacked package 2260 includes first and second subassemblies 970, 972. The first and second subassemblies 970, 972 both include a metal layer 978, 1010, having a top surface 973, 1009 and a bottom surface 975, 1011, a dielectric layer 976, 1012, having a top surface 977, 1013 and a bottom surface 971, 1003, and a layer of solder mask 1002, 1037, having a top surface 1001, 1038 and a bottom surface 1003, 1039. In this alternate embodiment, the bottom surface 1003, 1039 of the solder mask 1002, 1037 is proximate the top surface 973, 1009 of the metal layer 978, 1010. The bottom surface 975, 1011 of the metal layer 978, 1010 is proximate the top surface 1001, 1013 of the dielectric layer 976, 1012.

Each of the first and second subassemblies 970, 972 have a rectangular-shaped cavity 988, 1024 capable of receiving a microelectronic element 997, 1033. Each of the first and second subassemblies 970, 1006 also has a metal shelf 978, 1022 disposed above the microelectronic elements 997, 1033. The metal shelf 986, 1014 extends across the rectangular-shaped cavity 988, 1024. An opening 980, 1016 in the metal shelf 986 of the first subassembly 970 is located between an inner left edge 994 of the metal shelf 978 and the left edge 979 of the metal shelf 978 that is proximate to microelectronic element 997. An opening 1016 in the metal shelf 1014 of the second subassembly 972 is located between an inner right edge 1026 of the metal shelf 1022 and the right edge 1028 of the metal shelf 1022 proximate the microelectronic element 1033.

Microelectronic elements 997, 1033 are attached to the metal shelves 978, 1022 of the respective subassemblies in a face-down position. Referring to FIG. 41A, the bottom surfaces 1023, 1025 of the metal shelves are disposed over the top surfaces 1027, 1029 of the microelectronic elements and are attached to the microelectronic elements 997, 1033 by the layer of die attach 1002, 1037. This arrangement differs from previous embodiments, wherein the bottom surfaces of the microelectronic elements of those embodiments would be attached to the top surface of the metal shelf. Bond wires 982 on the right side of the first microelectronic element conductively connect bond pads on the microelectronic elements to contacts 984 on the metal layer 974. Bond wires 1018 on the left side 1036 of the second microelectronic element 1033 conductively connect to contacts 1020 on the metal layer 1010 of the second subassembly 1006.

As shown in FIG. 41, when the first and second subassemblies 970, 1006 are stacked together, the bottom surface 1011 of the dielectric layer 1012 of the first subassembly 970 is proximate the top surface 1038 of the layer of solder mask 1037 on the second subassembly 972. The opening 980 in the first subassembly 970 provides a passageway for bond wires 1018 on the second subassembly 1008 to pass therethrough. The opening 1016 in the second subassembly 972 is also capable of receiving bond wires of another stacked package (not shown), thereby making it easy to attach additional stacked packages.

The previous three examples in the third series of alternate stacked packages illustrated microelectronic packages having microelectronic elements wire-bonded on only one side and disposed above or below a metal shelf. The following alternate embodiments provide examples of stacked packages including microelectronic packages having microelectronic elements wire-bonded on both ends to subassemblies with cavities.

Referring first to FIGS. 42-44A, an alternative stacked package 2270 is shown having microelectronic elements wire-bonded at both ends to first and second subassemblies 1090, 1150. A top plan view and cross-sectional view of a first subassembly 1090 is shown. The first subassembly 1090 is preferably a single metal substrate having a dielectric layer 1108, a metal layer 1106, and a metal shelf 1104. The metal layer 1106 and metal shelf 1104 have respective top surfaces 1103, 1107 and respective bottom surfaces 1105, 1109. The bottom surface 1105 of the metal layer 1106 is proximate the top surface 1111 of the dielectric layer 1108. The top surface 1103 of the metal layer 1106 is proximate the bottom surface of the layer of solder mask.

A rectangular-shaped cavity 1102 is located on the first subassembly 1090 in a horizontal position, such that the distance between the left edge 1112 of the first subassembly 1090 and the left edge 1112 of the rectangular-shaped cavity 1102, as well as the distance between the right edge 1118 of the first subassembly 1090 and right edge 1122 of the rectangular-shaped cavity 1102 is greater than the distances between the top edge 1126 of the first subassembly 1090 and top edge 1115 of the rectangular-shaped cavity 1103, as well as the lower edge 1134 of the subassembly 1090 and the lower edge 1136 of the cavity.

The metal shelf 1104 is preferably etched from the metal layer, such as the metal shelf 1104 disclosed herein in FIGS. 21 to 24. The metal shelf 1104 extends across the length of the rectangular-shaped cavity 1102. First and second shelf openings 1140, 1144 (see FIG. 42) in the metal shelf 1104 are respectively located directly adjacent the top edge 1115 and bottom edge 1136 of the rectangular-shaped cavity 1102. As will be described in greater detail herein, the first and second openings 1140, 1144 provide a passageway for bond wires (not shown) of a second packaged chip to fit therein during stack packaging.

A layer of die attach 1141 is used to attach the bottom surface 1123 of the microelectronic element to the top surface 1107 of the metal shelf 1104. The microelectronic element 1098 is placed face-up in a horizontal direction above and across the rectangular-shaped cavity 1102, such that a first horizontal opening 1119 is created in the space between the top edge 1115 of the rectangular-shaped cavity 1102 and the top edge 1148 of the microelectronic element 1098. Similarly, a second horizontal opening 1121 is created in the space between the lower or bottom edge 1136 of the rectangular-shaped cavity 1102 and the lower or bottom edge 1149 of the microelectronic element 1098. Bond wires 1142 located on the left and right sides 1135, 1137 of the microelectronic element 1098 conductively connect bond pads 1138 provided on a front face 1146 of the microelectronic element 1098 to contact pads 1110 on the first subassembly 1090. As in the previous embodiments, traces (not shown) on the bottom surface 1105 of the metal layer 1106 extend from the edges 1114, 1115, 1122, 1136 of the rectangular-shaped cavity 1102 to the edges 1112, 1126, 1118, 1134 of the first subassembly 1090. It is to be understood that any trace patterns and/or circuitry may also be implemented on the metal layer 1106.

Referring to FIGS. 43, 43A, a top plan view and cross-sectional view of the second subassembly 1150 is shown. The second subassembly 1150 is a single metal substrate having a dielectric layer 1164, a metal layer 1160, and a metal shelf 1152 preferably etched from the metal layer 1106, such as the metal shelf 504 disclosed herein in FIGS. 21 to 24. The metal layer 1160 and metal shelf 1152 have respective top 1159, 1151 and bottom surfaces 1161, 1153. The bottom surface 1161 of the metal layer 1160 overlies the top surface 1163 of the dielectric layer 1164. A layer of solder mask 1200 is disposed over the top surface 1159 of the metal layer 1160.

A rectangular-shaped cavity 1158 is located on the second subassembly 1150 in a horizontal direction, such that the distance between the left edge 1172 of the second subassembly 1150 and the left edge 1174 of the rectangular-shaped cavity 1158, as well as the distance between the right edge 1178 of the second subassembly 1150 and right edge 1182 of the rectangular-shaped cavity 1158 is greater than the distances between the top edge 1186 of the second subassembly 1150 and top edge 1188 of the rectangular-shaped cavity 1158, as well as the lower edge 1190 of the second subassembly 1150 and the lower edge 1192 of the rectangular-shaped cavity 1158.

The metal shelf 1152 of the second subassembly extends across the length of the rectangular-shaped cavity 1158. First and second shelf openings 1167, 1169 in the metal shelf 1152 are respectively located between the left and right edges 1174, 1182 of the rectangular-shaped cavity and the left and right edges 1172, 1178 of the microelectronic element 1156. As will be described in greater detail herein, the first and second shelf openings 1167, 1169 provide a passageway for bond wires of another packaged chip to fit therein during stack packaging.

As in the first subassembly 1090, a layer of die attach 1200 is used to attach the bottom surface 1171 of the microelectronic element 1156 to the top surface 1151 of the metal shelf 1152. The microelectronic element 1156 is placed face-up on the metal shelf 1152 in a vertical direction above and across the rectangular-shaped cavity 1158, such that a first vertical opening 1173 is created in the space between the left edge 1174 of the rectangular-shaped cavity and the left edge 1168 of the microelectronic element 1156. Similarly, a second vertical opening 1175 is created in the space between the right edge 1176 of the microelectronic element 1156 and right edge 1182 of the rectangular-shaped cavity 1158. Bond wires 1196 (see FIG. 43) located on the front face 1198 of the microelectronic element 1156 conductively connect bond pads 1194 provided on a front face 1198 of the microelectronic element 1156 to contact pads 1166 on the second subassembly 1150.

As in the previous examples, traces (not shown) on the bottom surface 1153 of the metal layer 1160 extend from the edges 1188, 1174, 1192, 1182 of the rectangular-shaped cavity 1158 to the outer edges 1172, 1186, 1178, 1190 of the second subassembly 1150. It should be understood that additional trace patterns and/or circuitry may also be implemented on the metal layer 608.

Referring to FIGS. 44 and 44A, a stacked package 2270 including first and second subassemblies 1090, 1150 is shown. The first subassembly 1090 is attached to the second subassembly 1150 by the layer of solder mask 1200 on the second subassembly 1150. The top surface 1128 of the solder mask 1200 on the second subassembly 1150 is proximate the bottom surface of the dielectric layer 1108. Due to the arrangement of the microelectronic element 1098 in the first subassembly 1090 in a horizontal position above the rectangular-shaped cavity 1102, the microelectronic element 1156 of the second subassembly 1150 fits within the rectangular-shaped cavity 1102 of the first subassembly 1090. Furthermore, the interior edges 1117 of the rectangular-shaped cavity 1098 on the first subassembly 1090 extend beyond the interior edges 1120 of the rectangular-shaped cavity 1158 on the second subassembly. Moreover, bond wires 1196 used to attach the microelectronic element 1156 to the second subassembly 1150 fit within the openings 1140, 1144 of the metal shelf of the first subassembly 1090. This alternative stacked arrangement provides for yet another stacked and compact package.

Turning next to FIGS. 45-47A, a second alternative stacked package 2280 (see FIG. 47A) is shown having microelectronic elements wire-bonded at both of their ends and located face-up within the subassembly cavities (as opposed to above the subassembly cavity). Referring to FIG. 45, a first subassembly 1202 is shown having a dielectric layer 1216, a metal layer 1212, a metal shelf 1204 preferably etched from the metal layer 1212 and a layer of solder mask 1222. The dielectric layer 1216 has a top surface 1262 and lower surface 1264.

Unlike the previous example, the lower surface 1264 of the dielectric layer 1216 is proximate the top surface 1258 of the metal layer 1212. Similarly, the lower surface 1260 of the metal layer 1212 overlies a layer of solder mask 1222 which provides a means for attachment of the first subassembly to other microelectronic packages.

A rectangular-shaped cavity 1210 is located on the first subassembly 1202 in a horizontal direction, such that the distance between the left edge 1224 of the first subassembly 1202 and the left edge 1226 of the rectangular-shaped cavity 1210, as well as the distance between the right edge 1230 of the first subassembly 1202 and right edge 1234 of the rectangular-shaped cavity 1210 are greater than the distances between the top edge 1238 of the first subassembly 1202 and top edge 1240 of the rectangular-shaped cavity 1210, as well as the lower edge 1242 of the first subassembly 1202 and the lower edge 1244 of the rectangular-shaped cavity 1210.

As shown in FIG. 45, upper and lower cavities 1270, 1272 are located above and below the rectangular-shaped cavity 1210. The upper cavity 1270 is located between the upper edge 1238 of the first subassembly 1202 and rectangular-shaped cavity 1210. The lower cavity 1272 is located between the lower edge 1242 of the first subassembly 1202 and lower edge 1244 of the rectangular-shaped cavity 1210.

As best seen in FIG. 45A, the metal shelf 1204 extends across the length of the rectangular-shaped cavity 1210. A layer of die attach 1275 is used to attach the bottom surface 1278 of the microelectronic element 1208 to the top surface 1286 of the metal shelf 1204. The microelectronic element 1208 is placed face-up in a horizontal direction within the rectangular-shaped cavity 1210. Bond wires 1248 located on the left and right sides 1219, 1221 of the microelectronic element 1208 conductively connect bond pads 1246 provided on the front face 1250 of the microelectronic element 1208 to contact pads 1218 on the first subassembly 1202. As in the previous examples of stacked packages, traces (not shown) on the bottom surface metal layer 1212 extend from the edges of the rectangular-shaped cavity to the edges 1224, 1238, 1230, 1242 of the first subassembly 1202. It is to be understood that any trace patterns and/or additional conductive elements may be placed on the metal layer.

Referring to FIGS. 46 and 46A, a top plan view and cross-sectional view of a second subassembly 1274 is shown. The second subassembly 1274 is preferably a single metal substrate having a dielectric layer 1288, a metal layer 1284, and a metal shelf 1276, such as the metal shelf disclosed herein in FIGS. 21 to 24. The metal layer 1284 and metal shelf 1276 have top surfaces 1330, 1326 and bottom surfaces 1332, 1328. The bottom surface 1332 of the metal layer 1284 overlies the top surface 1292 of the layer of solder mask 1294, as well as a portion of the metal shelf 1276. The top surface 1330 of the metal layer 1284 is proximate the bottom surface 1293 of the dielectric layer 1284.

A rectangular-shaped cavity 1282 is located on the second subassembly 1274 in a vertical position, such that the distance between the left edge 1296 of the second subassembly 1274 and the left edge 1298 of the rectangular-shaped cavity 1282, as well as the distance between the right edge 1302 of the subassembly and right edge 1306 of the rectangular-shaped cavity 1282 is significantly greater than the distance between the top edge 1310 of the second subassembly 1274 and top edge 1312 of the rectangular-shaped cavity 1282, as well as the lower edge 1314 of the subassembly and the lower edge 1316 of the rectangular-shaped cavity 1282.

The metal shelf 1276 is preferably etched from the metal layer 1284, such as the metal shelf disclosed herein in FIGS. 21 to 24. Unlike the previous embodiments, the metal shelf 1276 extends across the entire length of the rectangular-shaped cavity 1282. Left and right cavities 1342, 1344 are located to the right and left of the rectangular-shaped cavity 1282. The left cavity 1342 is located between the left edge 1296 of the second subassembly 1274 and left edge 1298 of the rectangular-shaped cavity 1282. The right cavity 1344 is located between the right edge 1302 of the second subassembly 1274 and the right edge 1306 of the rectangular-shaped cavity 1282. As will be described in greater detail herein, the left and right cavities 1342, 1344 provide a passageway for bond wires of a second packaged chip to fit therein during stack packaging.

The microelectronic element 1280 is attached to the top surface 1326 of the metal shelf 1276 by a layer of die attach 1294. The microelectronic element 1280 is placed face-up in a vertical direction within the rectangular-shaped cavity 1282. Bond wires 1320 located on the top and bottom portions 1291, 1346 of microelectronic element 1280 conductively connect bond pads 1318 provided on the front face 1322 of the microelectronic element 1280 to contact pads 1290 on the metal shelf 1276 of the second subassembly 1274. Traces (not shown) on the outer face (not shown) of the metal layer extend from the edges 1298, 1312, 1276, 1316 of the rectangular-shaped cavity 1282 to the outer edges 1296, 1310, 1302, 1314 of the second subassembly 1274.

Referring to FIGS. 47-47A, a top plan view and a cross-sectional view of the first and second subassemblies 1202, 1274 stacked together is shown. The first subassembly 1202 is attached to the second subassembly 1274 by the layer of solder mask 1222 on the first subassembly 1202. The solder mask 1222 is directly attached to the front face 1322 of the microelectronic element 1280 of the second subassembly 1274. Because the microelectronic element 1280 of the second subassembly 1274 is greater in height than the remainder of the second subassembly 1274, the top surface 1334 of the dielectric layer 1288 does not contact the lower surface 1273 of the solder mask on the first subassembly. A space 1347 therefore remains between the lower surface 1273 of the solder mask 1222 of the first subassembly 1202 and the top surface 1334 of the dielectric layer 1288 of the second subassembly.

As shown in FIG. 47, the orientation of the microelectronic elements 1280, 1208 in the first and second subassemblies helps to minimize the stack height. The horizontally oriented microelectronic element 1208 is wire-bonded at its left and right ends 1220, 1221, whereas the vertically oriented microelectronic element 1280 of the second subassembly is wire-bonded at its top and bottom ends 1291, 1346. The upper and lower cavities 1270, 1272 on the first subassembly receive the bond wires 1320 of the vertically oriented microelectronic element 1280 on the second subassembly. Similarly, the left and right cavities 1342, 1344 on the second subassembly are capable of receiving bond wires of another stacked subassembly.

Referring to FIGS. 48-50A, an alternative stacked package 1404 (see FIG. 50A) having microelectronic elements attached to a metal shelf and wire-bonded at both ends is shown. This alternative stacked arrangement provides for yet another stacked package which utilizes cavities within the subassembly to minimize the thickness of a stacked package, as well as openings to permit the passage of bond wires.

The stacked package 1404 includes first and second subassemblies 1400, 1438. The first subassembly 1400 includes a dielectric layer 1406 having upper and lower surfaces 1408, 1410, a metal layer 1412 having upper and lower surfaces 1414, 1416, and a layer of solder mask 1418 having upper and lower surfaces 1420, 1422. The upper layer 1408 of the dielectric layer 1406 is proximate the lower surface 1416 of the metal layer 1412. Similarly, the upper layer 1414 of the metal layer 1412 is proximate the lower surface 1422 of the solder mask 1418.

A cavity 1424 is disposed within the first subassembly 1400 that has a length which is equal to its width. The cavity 1424 is designed to be big enough to fit a desired microelectronic element therein.

A metal shelf 1426 is also disposed within the first subassembly 1400 and is preferably formed as described in FIGS. 14 to 21. The metal shelf 1426 has top and bottom surfaces 1428, 1430 (see FIG. 48A), as well as upper and lower openings 1432, 1434 adjacent the upper edge 1423 and lower edge 1425 of the cavity 1424.

The upper surface 1435 of the microelectronic element 1436 is attached to the bottom surface 1430 of the metal shelf 1426 within the subassembly cavity 1424 via a layer of solder mask 1434. In this alternate embodiment, the microelectronic element 1436 extends horizontally across and within the cavity 1424 so that the microelectronic element 1436 is in a face-down position. Bond wires 1429 extending from bond pads 1419 on the microelectronic element 1436 are electrically connected to contacts 1435 on the metal layer 1412 of the first subassembly 1400. The bond wires 1429 are then encapsulated by an encapsulating material 1433.

Referring to FIGS. 49 and 49A, the second subassembly 1438 is shown. Like the first subassembly 1400, the second subassembly 1438 includes a dielectric layer 1440 having upper and lower surfaces 1442, 1444, a metal layer 1446 having upper and lower surfaces 1448, 1450, and a layer of solder mask 1452 having upper and lower surfaces 1454, 1456. The upper layer 1442 of the dielectric layer 1440 is proximate the lower surface 1450 of the metal layer 1446. Similarly, the upper layer 1448 of the metal layer 1446 is proximate the lower surface 1456 of the solder mask 1452.

A cavity 1476 is disposed within the second subassembly 1400 that has a length which is equal to its width. The cavity 1476 is designed to be big enough to fit a microelectronic element therein.

A metal shelf 1458 is also disposed within the second subassembly 1438 and is preferably formed as described in FIGS. 14 to 21. The metal shelf 1458 has top and bottom surfaces 1400 and 1462, as well as left and right openings 1457, 1459 adjacent the left and right edges 1461, 1463 of the cavity. As in the previous embodiments, the left and right openings 1457, 1459 will provide a space for bond wires to pass through.

The upper surface 1480 of the microelectronic element 1478 is attached to the metal shelf 1458 within the subassembly cavity 1476 by a layer of die attach 1468. The microelectronic element 1478 extends vertically across and within the cavity 1476 so that the microelectronic element 1478 is in a face-down position. Bond wires 1474 (see FIG. 49) extending from bond pads 1466 on the microelectronic element 1478 are electrically connected to contacts 1484 on the metal layer 1446 of the second subassembly 1438. The bond wires 1474 are then encapsulated by an encapsulant material 1464.

Referring to FIGS. 50 and 50A, a top plan view and sectional view of a stacked package 1486 including the first and second subassemblies 1400, 1438 is shown. The first subassembly 1400 is attached to the second subassembly 1438 by the layer of solder mask 1452 on the second subassembly 1438. Once the first and second subassemblies 1400, 1430 are attached together, the upper surface 1454 of the layer of solder mask 1452 on the second subassembly 1438 is proximate the lower surface 1444 of the dielectric layer 1440 of the first subassembly 1400. A gap 1488 also exists between the lower surface 1482 of the microelectronic element 1478 of the first subassembly 1400 and the top surface of the metal shelf 1458 on the second subassembly 1438.

As shown in FIG. 50, bond wires 1474 on the second subassembly 1438 fit into the upper and lower openings 1432, 1434 in the first subassembly 1400. As shown in FIG. 50A, the left and right openings 1457, 1459 in the second subassembly 1438 are capable of receiving bond wires 1474 from another stacked package. The openings created in the subassemblies therefore provide for thinner stacked packaging.

It should be understood that although in the previous examples of stacked packages the microelectronic elements were wire bonded to the first and second subassemblies, any type of electrical connection, such as a solder ball or a pin, may be used to connect the microelectronic element to the corresponding subassembly. For example, referring to FIG. 50B, an alternative stacked package 3300 is shown which is similar to FIGS. 25-27A, but differs only in the manner in which the first and second microelectronic elements 3302, 3304 are attached to the respective first and second subassemblies 3305, 3308.

As in the previous examples, the first and second subassemblies 3306, 3308 each respectively includes a dielectric layer 3310, 3312, a metal layer 3314, 3316 disposed over the dielectric layer 3310, 3312, and a layer of solder mask 3318, 3320 disposed over the metal layer 3314, 3316. Additionally, each of the first and second subassemblies 3306, 3308 has a cavity 3309, 3313 therein. As shown, the first and second microelectronic elements 3302, 3304 are mounted in a face down position and electrically connected to the first and second subassemblies 3306, 3308 by solder balls 3322, 3324. In this arrangement, the first and second microelectronic elements 3302, 3304 are positioned above the first and second subassemblies 3306, 3308. Furthermore, the second microelectronic element 3304 fits within the cavity 3309 of the first subassembly 3306.

Figure 51:
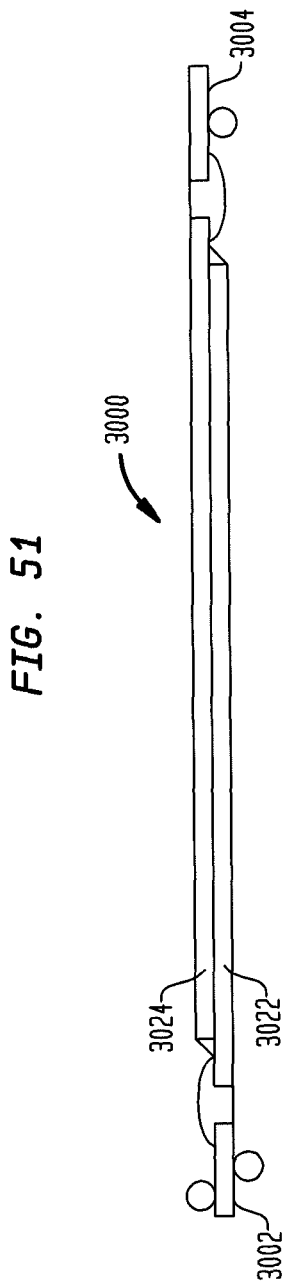
FIG. 51 is a sectional view of a packaged assembly in accordance with a preferred embodiment of the present invention.

Referring to FIG. 51, a sectional view of yet another embodiment in accordance with the present invention is shown. An interleaved dual chip package 3000 is shown which includes first and second chip carriers 3002, 3004 and first and second chips 3022, 3024 in a face to face relationship.

Figure 52:
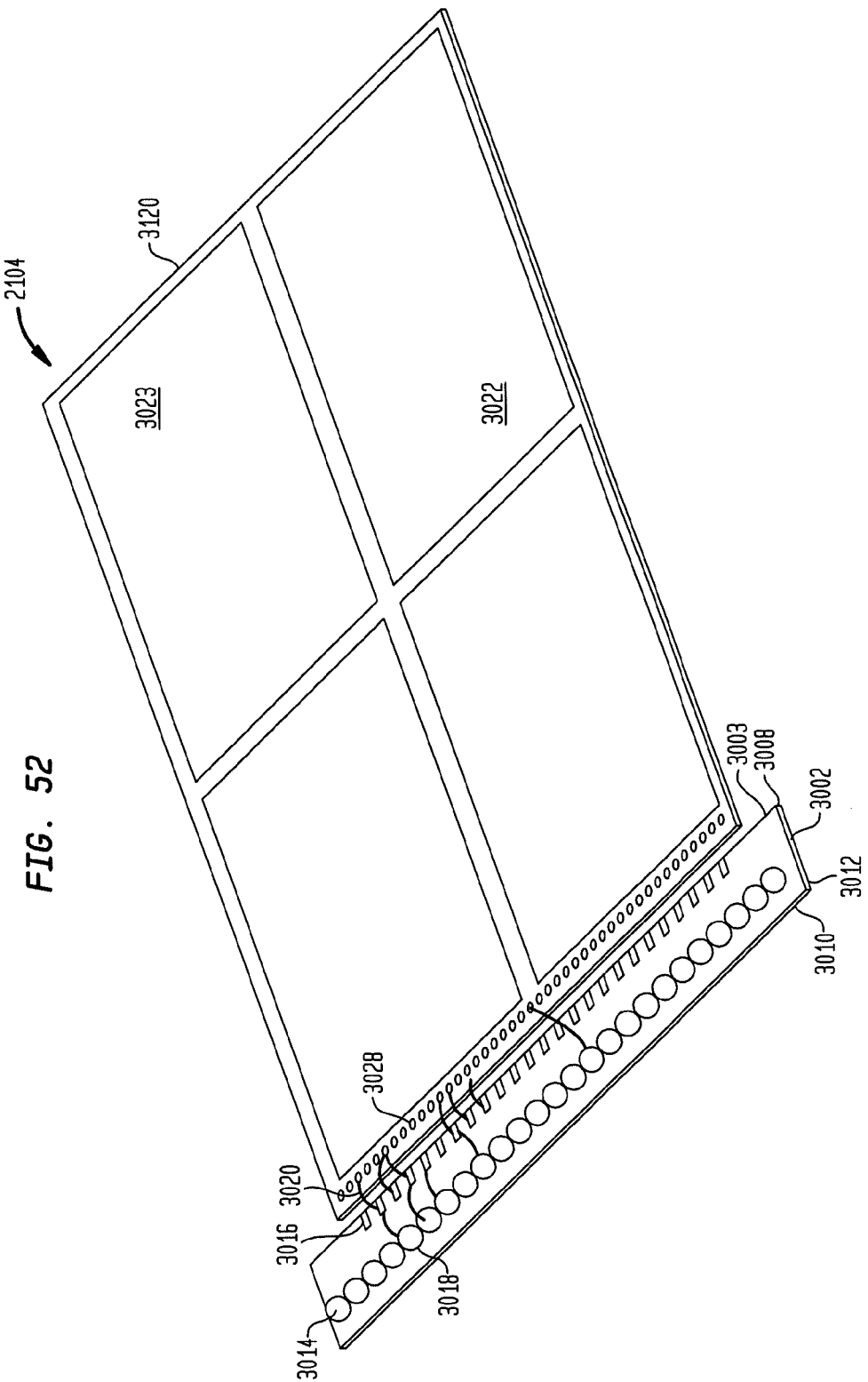
FIG. 52 is a perspective view of a portion of the packaged assembly in accordance with this aspect of the invention.

Referring to FIG. 52, a first portion 3104 of the dual chip package 3000 is shown prior to the addition of the encapsulant material (not shown). The first portion 3104 includes a first chip carrier 3002, which is elongated and strip-like. The first chip carrier 3002 includes a dielectric element 3008 which has a front surface 3010 and a rear surface 3012. Solder balls pads 3020, contacts 3016, and traces 3018 are exposed at the front surface 3010 of the dielectric element 3008.

The width of the first chip carrier 3002 is preferably slightly larger than the maximum distance in the widthwise direction between the solder balls 3014 and contacts 3016 on the first chip carrier 3002. In the preferred embodiment, the first chip 3022 may be connected to the dielectric element 3008 via bond wires 3020 extending from bond pads 3028 on a front face of the first chip 3022 to contacts 3016 on the first chip carrier 3002. The first chip 3022 is laterally adjacent the first chip carrier 3002 so that the bond wires 3020 extend across an edge 3003 of the first chip carrier. This provides for the first chip 3022 to be in the same plane as the first chip carrier 3002. Furthermore, such an arrangement reduces the height of the packaged first chip 3022.

An encapsulant material 3006 (see FIG. 53) may then be used to surround the bond wires 3020 and to further secure them in place. The encapsulant material 3006 should preferably not cover the surfaces of the terminal portions, so that these surfaces remain exposed for mounting.

Figure 53:
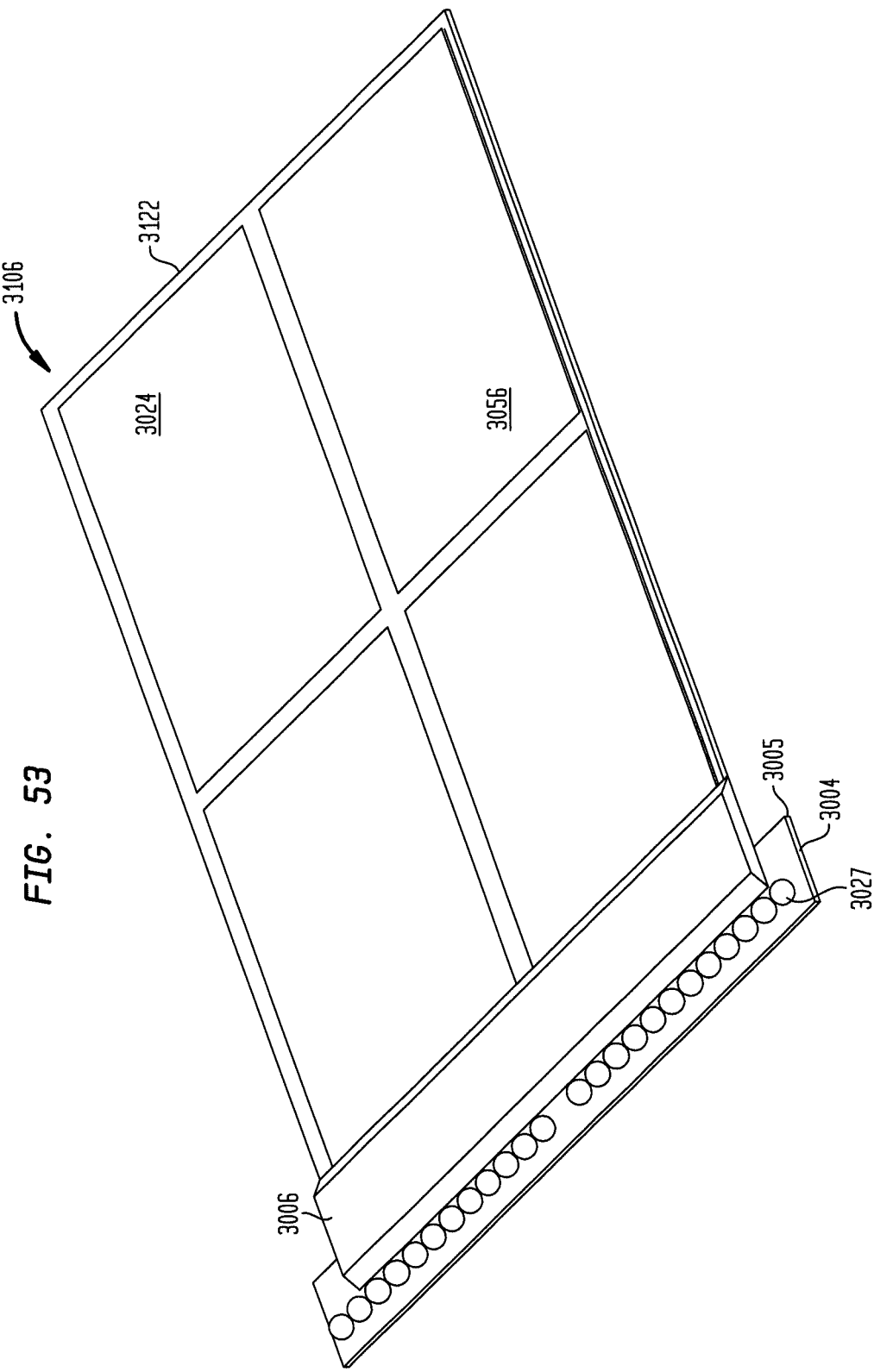
FIG. 53 is a perspective view of a portion of the packaged assembly in accordance with this aspect of the invention.

As shown in FIG. 53, the second portion 3106 of the dual chip package includes a second chip 3024 and a second chip carrier 3004 (with an encapsulant shown for purposes of illustration). The second portion 3106 is identical to the first portion 3104 of the dual chip package 3000, and includes a second chip 3024 and an elongated and strip-like second chip carrier 3004. Bond wires (not shown) connect bond pads (not shown) on the second chip 3024 to contacts (not shown) extending along the length of the second chip carrier 3004, so that the second chip 3024 is laterally adjacent the second chip carrier 3004. The bond wires therefore extend across an edge 3005 of the second chip carrier 3004. A row of solder balls 3027 is also adjacent the contacts (not shown).

When it is desired to create a full dual-chip package, the second portion 3106 is inverted so that the front face 3056 of the second chip 3056 is adjacent the front face 3023 of the first chip 3022. The second portion 3106 is also rotated 180° and positioned over the first portion 3104 so that the outer edge 3120 of the first portion 3104 is adjacent the solder balls 3027 on the second chip carrier 3004 of the second portion 3106. Similarly, the outer edge 3122 of the second portion 3106 is adjacent the solder balls 3014 of the first portion 3104. An adhesive solder layer 3080 (see FIG. 1) is preferably used to adhere the first and second portions 3104 and 3106 of the chip packages together.

In this embodiment, the first and second chips 3022, 3024 are preferably up to 75 micrometers thick and the chip carrier is also up to 75 micrometers thick, so that the thinnest stacked package can be made. Furthermore, this arrangement allows for the first and second chips 3022, 3024 to be individually tested.

Figure 55:
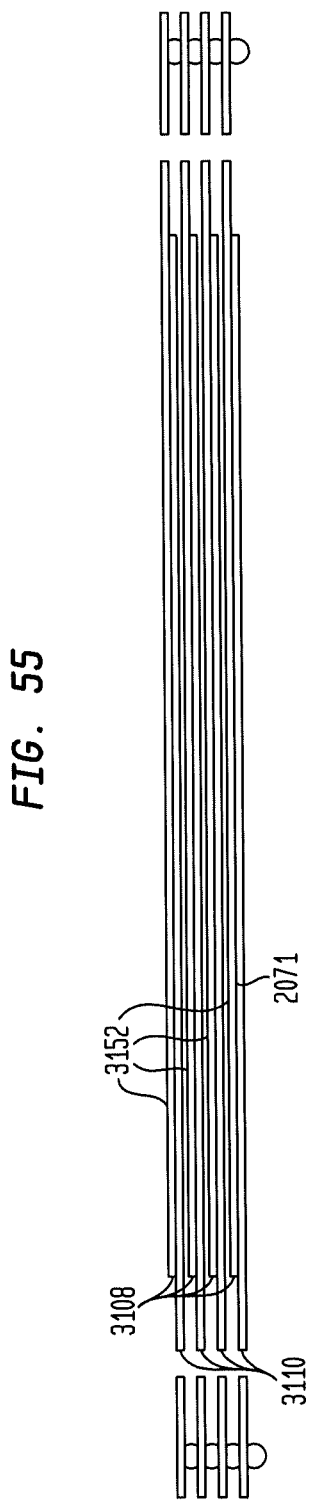
FIG. 55 is a sectional view of a stacked package assembly in accordance with a preferred embodiment of the present invention.

The dual chip package 3000 is capable of being stacked with other dual chip packages. The solder balls 3014, 3027 extending along the length of the first and second ship carriers 3002, 3004 can be used to provide a means for connecting to other chip packages. Referring to FIG. 55, four dual chip packages, each individually comprised of an upper chip package 3108 and a lower chip package 3110, are shown. In the stacked position, the upper chip packages 3108 have been inverted so that the front faces 3150 of the microelectronic elements 3152 in the upper chip package are attached to the front faces 3071 of the microelectronic elements 3152 of the lower chip packages 3110. Solder balls 3014 on the rear faces of the first and second chips 3022, 3024 are used to provide an electrical connection between each of the chip packages.

Figure 54:
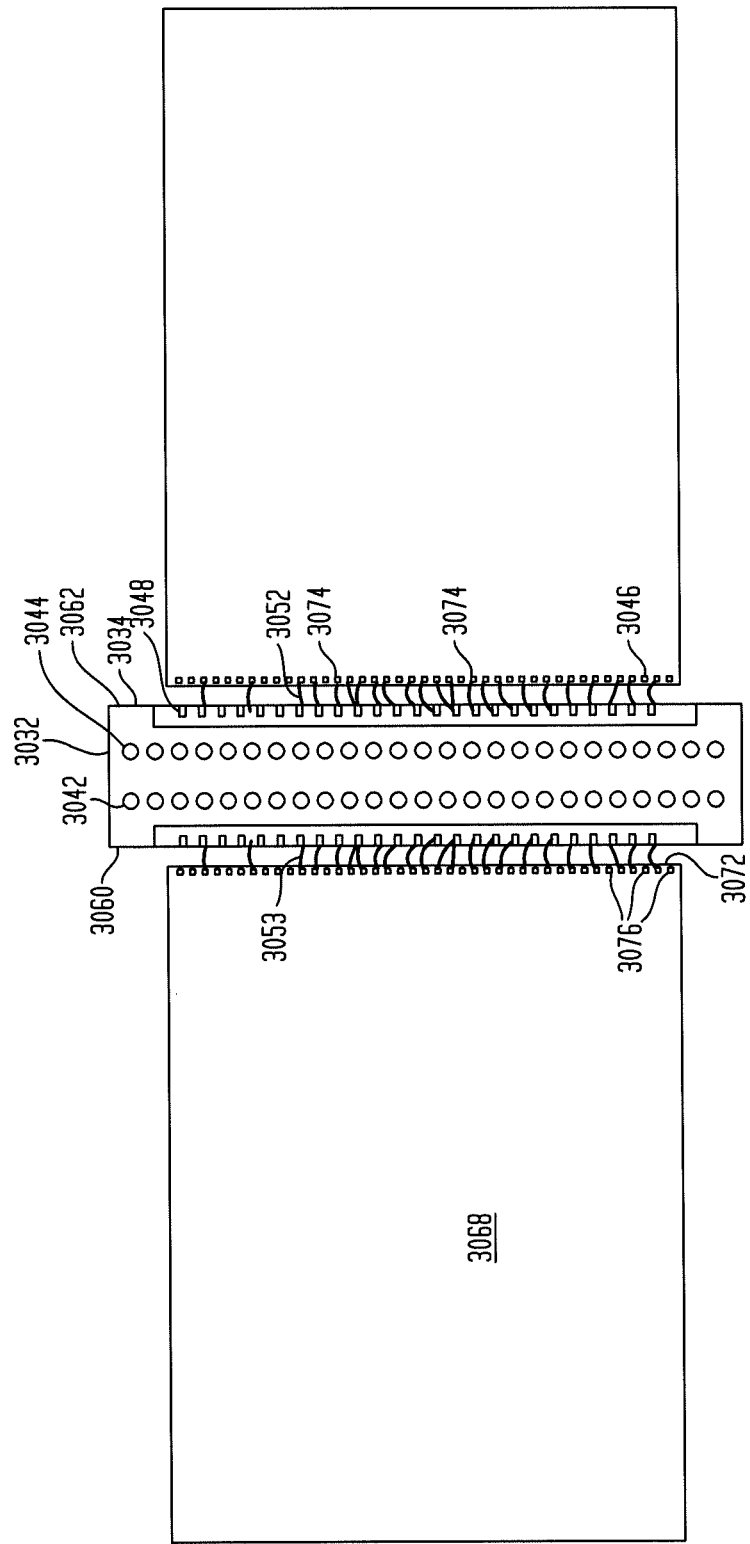
FIG. 54 is a perspective view of the packaged assembly in accordance with this aspect of the invention.

Referring to FIGS. 54 and 55, an alternative dual chip package 3030 in accordance with the present invention is shown. A chip carrier 3032 is shown which includes a dielectric element 3034 with a front surface 3036 and a rear surface (not shown). A first row 3042 and a second row 3044 of solder ball pads 3040 extend along the length of the chip carrier 3032. Similarly, a first row 3048 and a second row 3050 of contacts 3046 align the left and right edges 3060, 3062 on the front face of the chip carrier 3032.

A first row 3064 of bond wires 3053 conductively connect bond pads 3076 on the first chip 3068 to contacts 3046 located along the left edge 3072 of the chip carrier 3032. A second row 3066 of bond wires 3052 conductively connect bond pads 3074 on the second chip 3070 to contacts 3078 along the right edge 3062 the chip carrier 3032. In each of these configurations, the first and second chips 3068, 3070 are laterally adjacent the chip carriers 3032. The respective bond wires 3053, 3052 therefore cross left and right edges 3060, 3062 of the chip carrier 3032.

Figure 56:
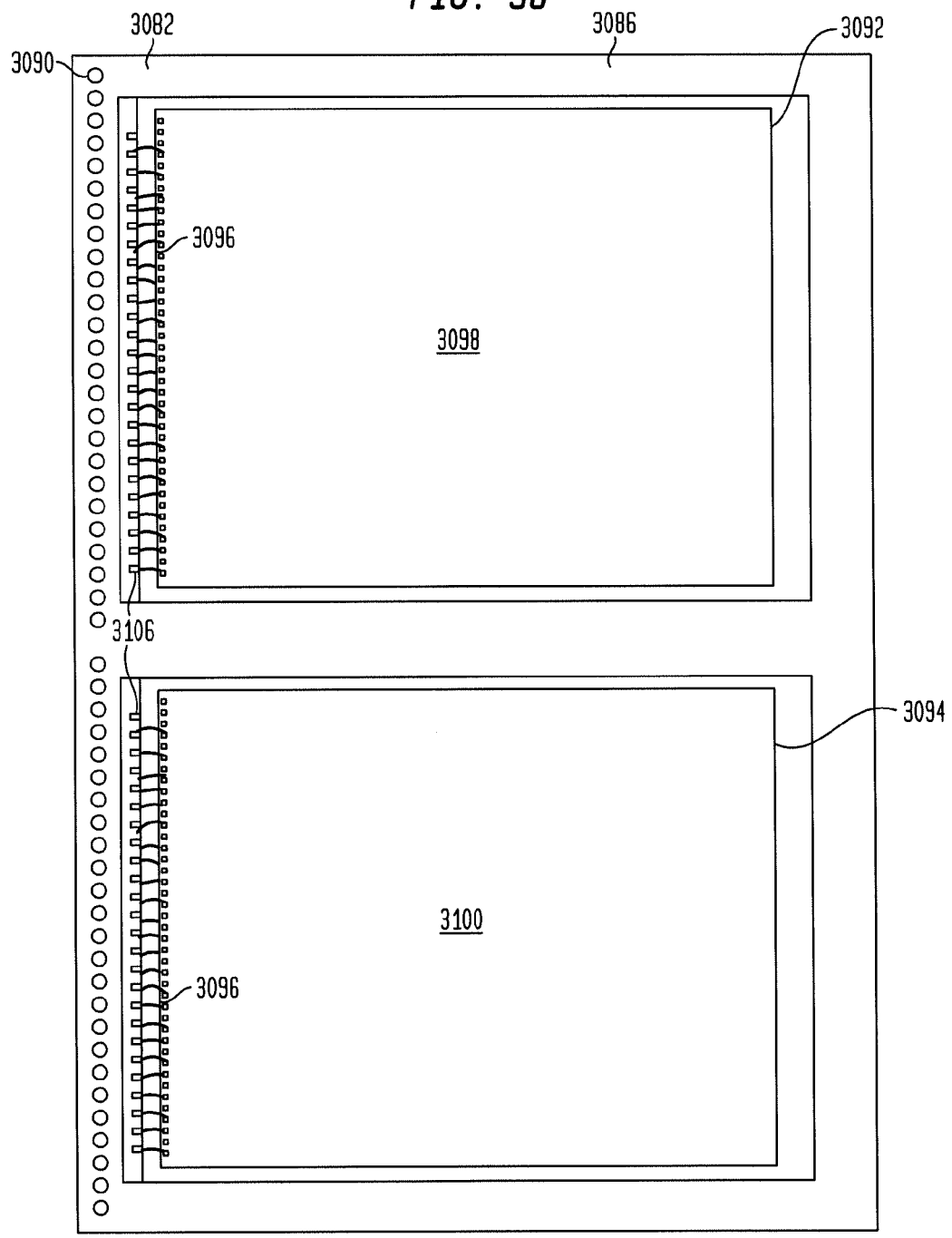
FIG. 56 is a top plan view of an alternate embodiment of the present invention.
Figure 56A:
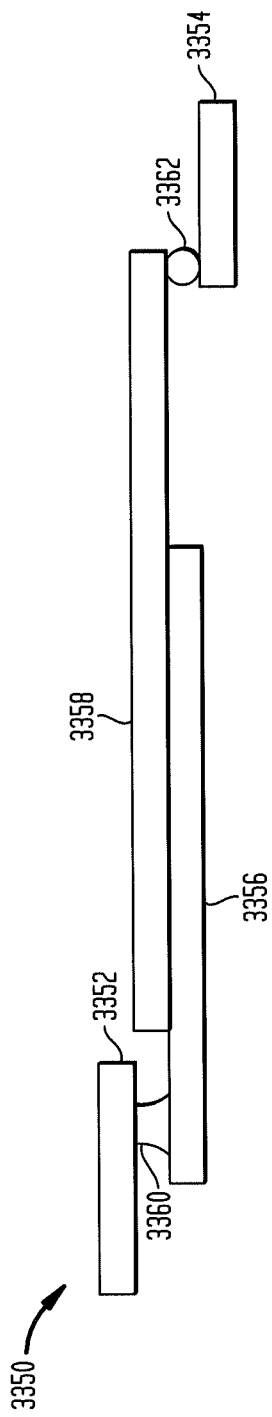
FIG. 56A is a sectional view of an alternative embodiment of the present invention.

Referring to FIGS. 56 and 56A, yet another embodiment according to the present invention is shown. A chip carrier 3082 is shown which includes a dielectric element 3084 with a front face 3086 and a rear surface (not shown). A row of solder ball pads 3090 extend along the length of the front face 3086 of the chip carrier 3082. A first and second cavity 3092, 3094 are also located within the chip carrier 3082 such that first and second chips 3098, 3100 are capable of being attached therein. As in the previous embodiments, bond wires 3096 conductively connect bond pads 3102 on each of the microelectronic elements to contacts 3106.

It should be understood that instead of a wire-bond connection between the microelectronic element and the chip carrier, the microelectronic element may be connected to the chip carrier by solder balls or the like, such that it is arranged in a flip-chip fashion. Referring to the alternate embodiment 3350 shown in FIG. 56A, there is shown first and second chip carriers 3352, 3354 each connected to a respective first and second microelectronic element 3356, 3358. The first subassembly 3352 is electrically connected to the first microelectronic element 3356 by a row of pins 3360. The second subassembly 3354 is electrically connected to the second microelectronic element 3358 by a row (not shown) of solder balls 3362. In this particular arrangement, the first and second microelectronic elements 3356, 3358 are not arranged laterally adjacent the first and second chip carriers 3352, 3354, but are either positioned above or below the chip carrier 3352, 3354. As in the previous examples, an adhesive layer (not shown) joins the first and second microelectronic elements 3356, 3358 together.

It is to be understood that numerous other variations of stacking and arranging wire-bonded microelectronic elements in a substrate with a cavity are possible, and that the aforementioned embodiments are only a few examples.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A packaged microelectronic element comprising:
a package element having a top face, a bottom face, an edge extending between said top and bottom faces, and a plurality of chip contacts and package contacts exposed at said top face, the package element being an elongated strip, such that a length of the package element is substantially greater than a width of the package element;
a microelectronic element having a front face, a rear face, an edge extending between said front and rear faces, and a plurality of bond pads exposed at said front face; and
bond wires electrically connecting said bond pads to said chip contacts, said bond wires extending across said edge of said microelectronic element and said package element.

2. The packaged microelectronic element as claimed in claim 1, wherein said bond wires extend across a gap disposed between said edges of said microelectronic element and said package element.

3. The packaged microelectronic element as claimed in claim 1, wherein said package contacts are disposed adjacent to said chip contacts.

4. The packaged microelectronic element as claimed in claim 1, wherein each of said package contacts is connected to an adjacent one of said chip contacts.

5. The packaged microelectronic element as claimed in claim 1, wherein said package element is elongated in a first direction, said chip contacts and said package contacts extending in said first direction.

6. The packaged microelectronic element as claimed in claim 1, as claimed in claim 5, wherein said chip contacts are disposed in at least one row adjacent to and extending parallel to said edge of said package element.

7. The packaged microelectronic element as claimed in claim 6, wherein said edge of said package element is a first edge, said package element including a second edge opposite said first edge, wherein said chip contacts are disposed in respective single rows adjacent to said first and second edges.

8. The packaged microelectronic element as claimed in claim 7, wherein said package contacts are disposed in one or more rows remote from said edges of said package element.

9. An assembly including the packaged microelectronic element as claimed in claim 7, wherein said microelectronic element is a first microelectronic element and said bond wires are first bond wires, said assembly further comprising a second microelectronic element having a front face, a rear face, an edge extending between said top and bottom faces, and a plurality of bond pads exposed at said top face; and second bond wires electrically connecting said bond pads to said chip contacts, said second bond wires extending across said edges of said second microelectronic element and said package element.

10. The packaged microelectronic element as claimed in claim 1, wherein said package element includes a window having interior walls, and said edge includes one of said interior walls.

11. The packaged microelectronic element as claimed in claim 10, wherein said microelectronic element is disposed within said window.

12. An assembly including the packaged microelectronic element as claimed in claim 1, wherein said package element is a first package element and said microelectronic element is a first microelectronic element, said assembly further comprising:
a second package element having a top face, a bottom face, and an edge extending between said top and bottom faces, a plurality of chip contacts and package contacts exposed at said top face;
a second microelectronic element overlying said first microelectronic element, said second microelectronic element having a front face, a rear face, an edge extending between said top and bottom faces, and a plurality of bond pads exposed at said top face; and
bond wires electrically connecting said bond pads of said second microelectronic element to said chip contacts of said second package element, said bond wires extending across said edge of said second microelectronic element and said second package element.

13. The assembly as claimed in claim 12, wherein said edge of said first package element and said edge of said second package element are remote from each other.

14. A method of preparing a stacked microelectronic assembly comprising:
forming a first subassembly by connecting contacts of a first package element to bond pads of a first microelectronic element using first bond wires such that said first bond wires extend across an edge of said first package element and a first edge of said first microelectronic element;
forming a second subassembly by connecting contacts of a second package element to bond pads of a second microelectronic element using second bond wires such that said second bond wires extend across edges of said second package element and said second microelectronic element;

placing said first subassembly above said second subassembly such that said first bond wires are exposed beyond a second edge of said first microelectronic element remote from said first edge; and positioning the first subassembly so that a first active face of the first microelectronic element faces a second active face of the second microelectronic element, the bond pads of the first and second microelectronic elements being positioned at the respective first and second active faces.

15. The method as claimed in claim 14, wherein each of said first and second package elements includes a window, wherein said first microelectronic element is disposed wholly within said window of said first microelectronic element and said second microelectronic element is disposed wholly within said window of said second microelectronic element.

16. A method of preparing a stacked microelectronic assembly comprising:

connecting contacts of a package element to bond pads of a microelectronic element using bond wires such that said bond wires extend across an edge of said package element and an edge of said microelectronic element, the package element being an elongated strip, such that the length of the package element is substantially greater than a width of the package element, the edge of the package element extending along the length.

17. The method as claimed in claim 16, wherein said bond wires extend across a gap between said edges.

18. The method as claimed in claim 16, further comprising forming an encapsulant covering said bond wires, said package element and said microelectronic element at said edges.

19. The packaged microelectronic element as claimed in claim 1, wherein a single row of contacts and a single row of package contacts extend along the length of the package element, the chip contacts being spaced apart from the package contacts.

* * * * *